(12) United States Patent
Igeta et al.

(10) Patent No.: US 6,927,112 B2
(45) Date of Patent: Aug. 9, 2005

(54) RADICAL PROCESSING OF A SUB-NANOMETER INSULATION FILM

(75) Inventors: Masanobu Igeta, Nirasaki (JP); Shintaro Aoyama, Nirasaki (JP); Hiroshi Shinriki, Nirasaki (JP); Tsuyoshi Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 103 days.

(21) Appl. No.: 10/310,949

(22) Filed: Dec. 6, 2002

(65) Prior Publication Data

US 2003/0170945 A1 Sep. 11, 2003

(30) Foreign Application Priority Data

| Dec. 7, 2001 | (JP) | 2001-374631 |
| Dec. 7, 2001 | (JP) | 2001-374632 |
| Dec. 7, 2001 | (JP) | 2001-374633 |
| Dec. 28, 2001 | (JP) | 2001-401210 |
| Apr. 19, 2002 | (JP) | 2002-118477 |

(51) Int. Cl.$^7$ .................................... H01L 21/8238
(52) U.S. Cl. ............... 438/200; 438/243; 438/246; 438/255; 438/353; 438/361; 438/386; 257/296; 257/301; 257/309
(58) Field of Search ............... 438/200, 243, 438/246, 255, 294, 353, 361, 386; 257/301, 309, 296, 350, 344

(56) References Cited

U.S. PATENT DOCUMENTS

| 4,732,871 A | * | 3/1988 | Buchmann et al. .......... 438/183 |
| 5,965,034 A | * | 10/1999 | Vinogradov et al. ........... 216/68 |
| 6,017,221 A | * | 1/2000 | Flamm ........................ 438/14 |
| 6,127,275 A | * | 10/2000 | Flamm ....................... 438/710 |
| 6,168,980 B1 | * | 1/2001 | Yamazaki et al. ........... 438/162 |
| 6,365,467 B1 | | 4/2002 | Joo |
| 6,459,126 B1 | * | 10/2002 | Mogami et al. ............. 257/350 |
| 6,723,611 B2 | * | 4/2004 | Akatsu et al. ............... 438/386 |

| 2001/0025999 A1 | 10/2001 | Suguro |
| 2002/0073925 A1 | 6/2002 | Noble et al. |
| 2002/0090776 A1 | 7/2002 | Nakata et al. |

FOREIGN PATENT DOCUMENTS

| EP | 0973189 | 7/1999 |
| JP | 07-196303 | 8/1995 |
| JP | 08-085861 | 4/1996 |
| JP | 11121452 | 4/1999 |
| JP | 2000195856 | 7/2000 |
| JP | 2001023976 | 1/2001 |
| JP | 2001085427 | 3/2001 |
| JP | 2001185548 | 7/2001 |
| JP | 2001217415 | 8/2001 |
| JP | 2002-100627 | 4/2002 |
| JP | 2002184773 | 6/2002 |
| WO | 00/65631 | 11/2000 |
| WO | 02/15243 | 2/2002 |

OTHER PUBLICATIONS

G. Lucovsky, "Bonding constraints and defect formation in interfaces between crystalline silicon and advanced single layer and composite gate dielectrics" Applied Physics Letters, vol. 74, No. 14, Apr. 5, 1999, pp. 2005–2007.

Koji Watanabe, et al., "Dependence of electrical properties on nitrogen profile in ultrathin oxynitride gate dielectrics formed by using oxygen and nitrogen radicals" Journal of Applied Physics, vol. 90, No. 9, Nov. 1, 2001, pp. 4701–4707.

Z. H. Lu, et al., "$SiO_2$ film thickness metrology by x–ray photoelectron spectroscopy" Applied Physics Letters, vol. 71, No. 19, Nov. 10, 1997.

* cited by examiner

Primary Examiner—Michael Tran
Assistant Examiner—Renee R. Berry
(74) Attorney, Agent, or Firm—Crowell & Moring LLP

(57) ABSTRACT

A method of nitriding an insulation film, includes the steps of forming nitrogen radicals by high-frequency plasma, and causing nitridation in a surface of an insulation film containing therein oxygen, by supplying the nitrogen radicals to the surface of the insulation film.

47 Claims, 74 Drawing Sheets

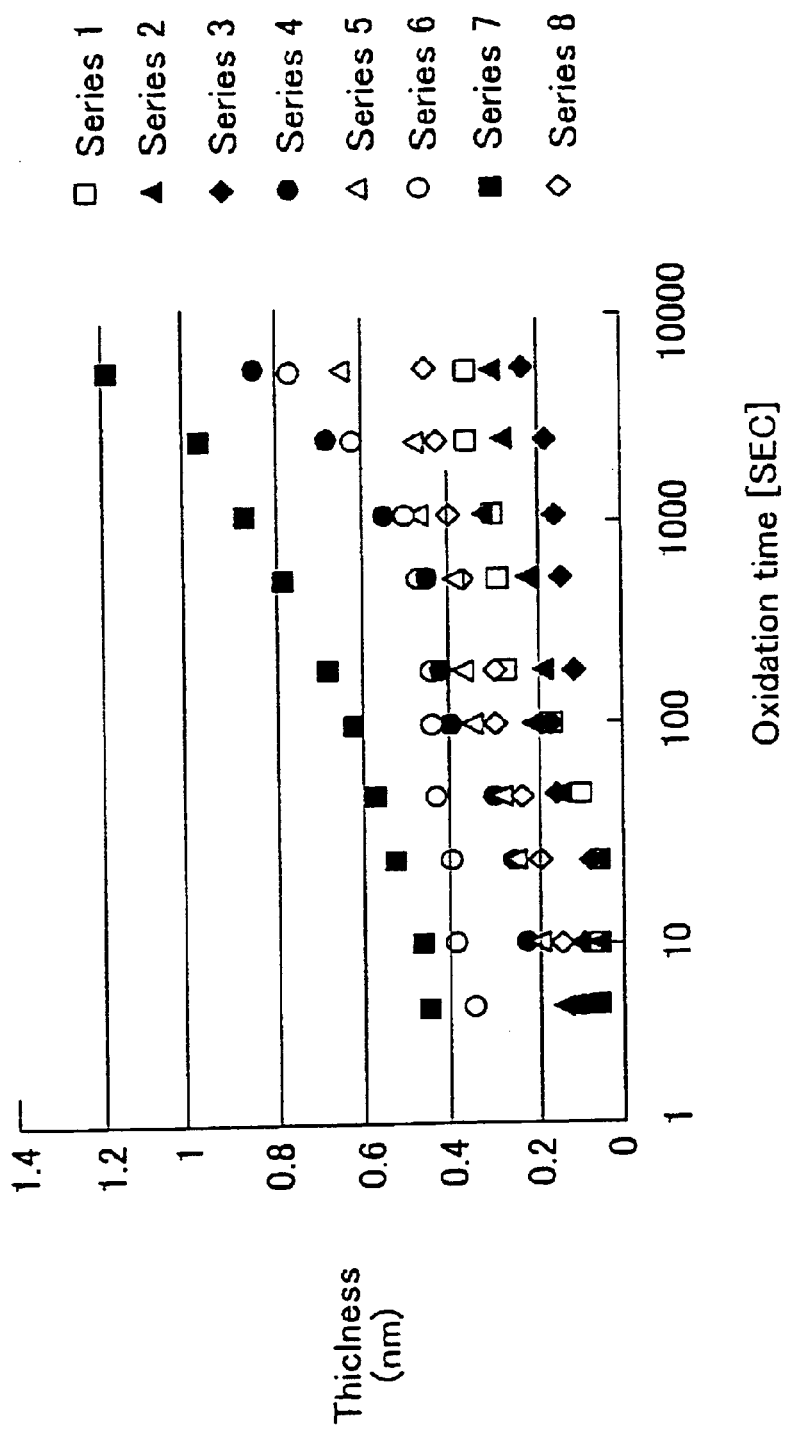

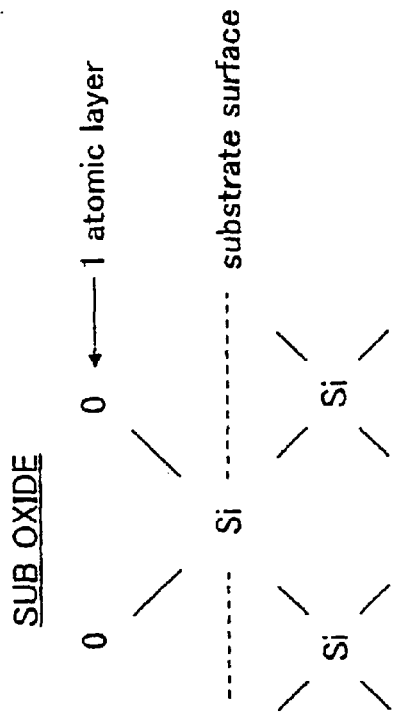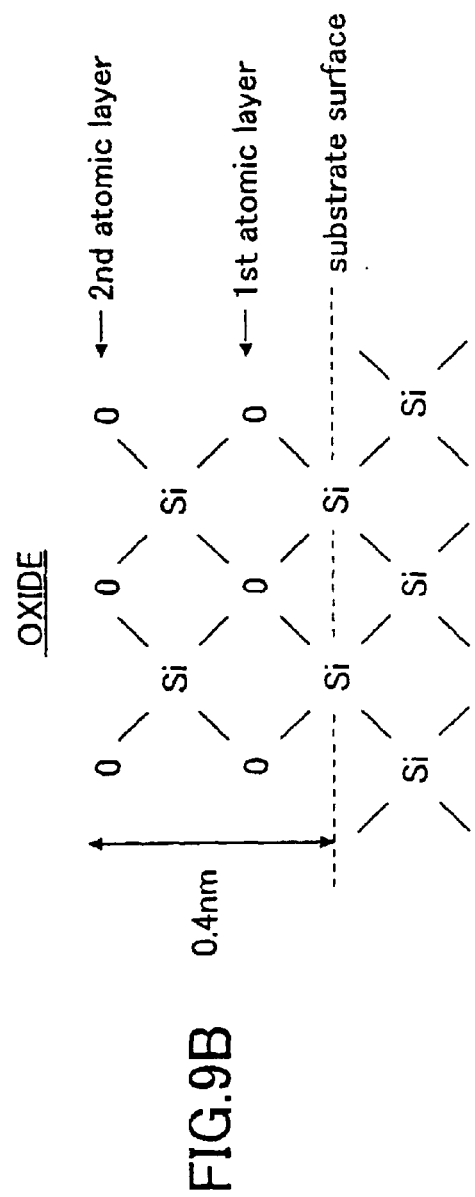
FIG.9A
FIG.9B

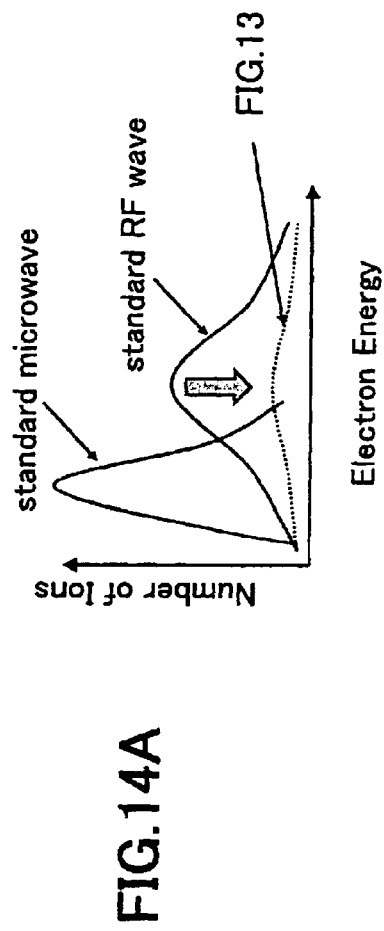
FIG.14A
FIG.13
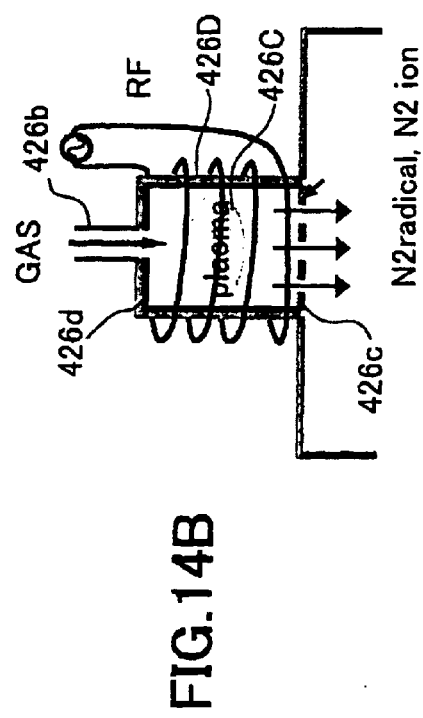
FIG.14B
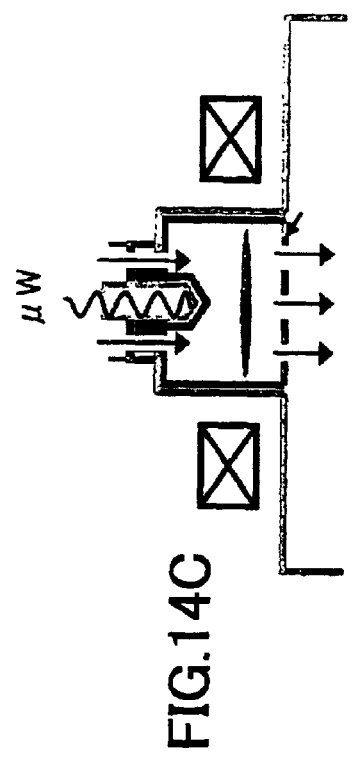
FIG.14C

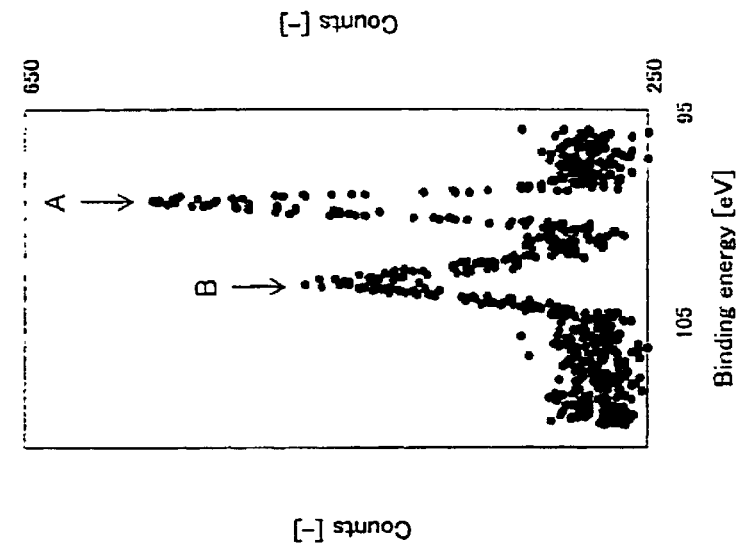
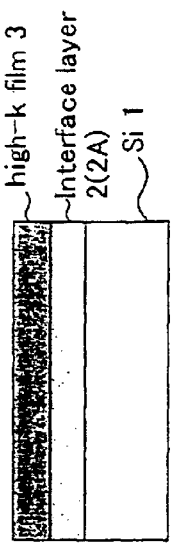
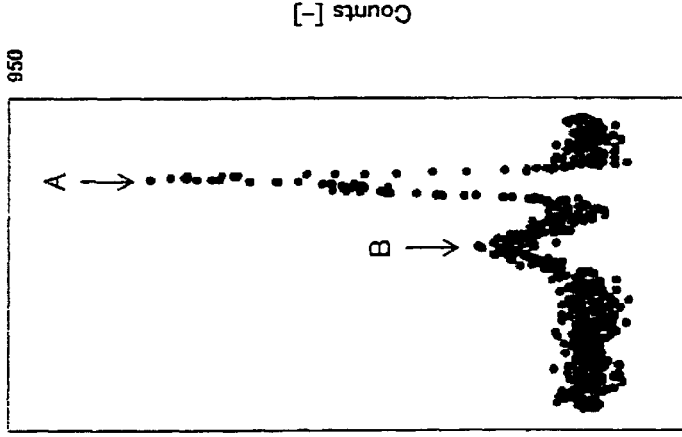
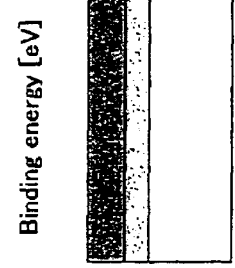
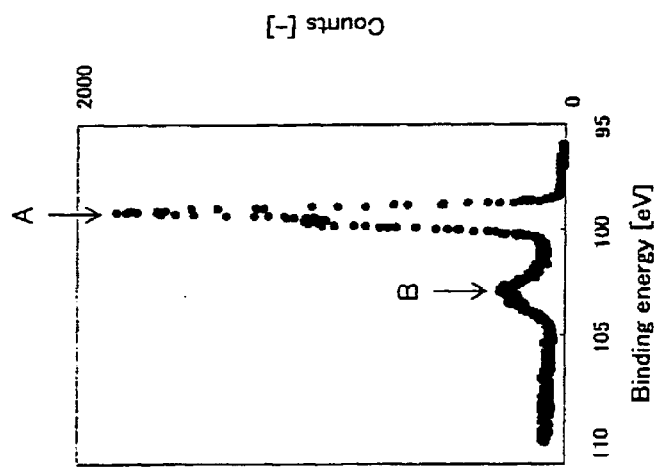
FIG.26A  FIG.26B  FIG.26C

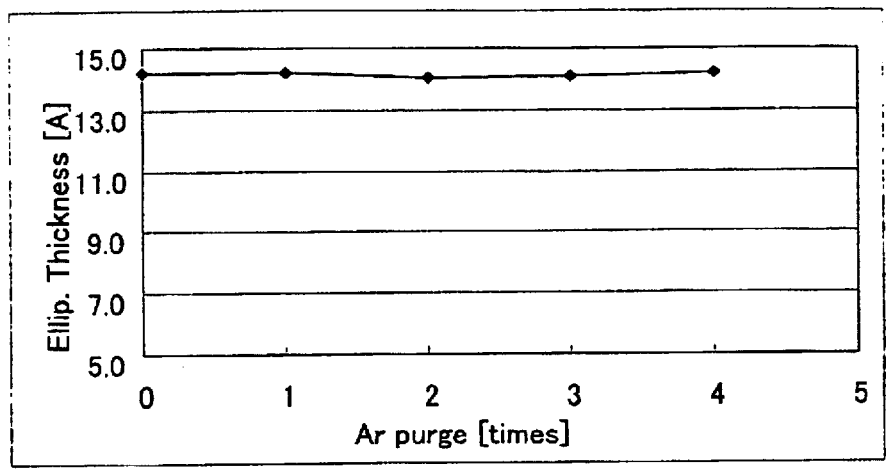
FIG.33A  UV-O2+RFN_CONTINUOUS
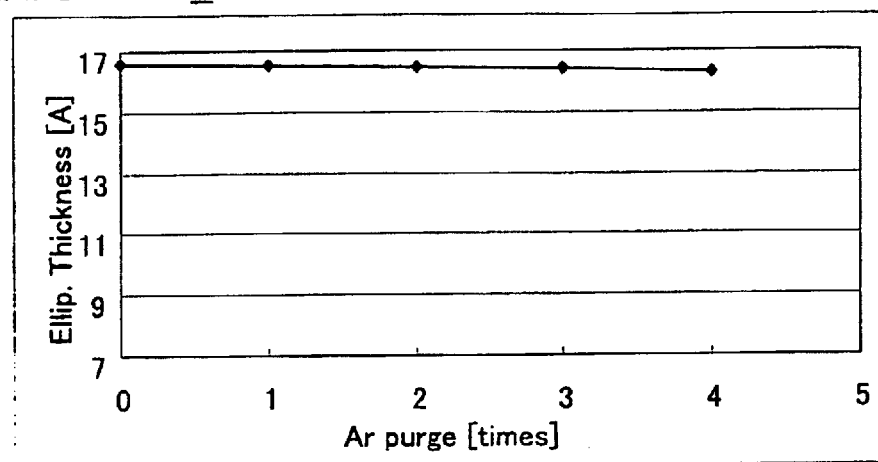
FIG.33B  RFO+RFN_CONTINUOUS

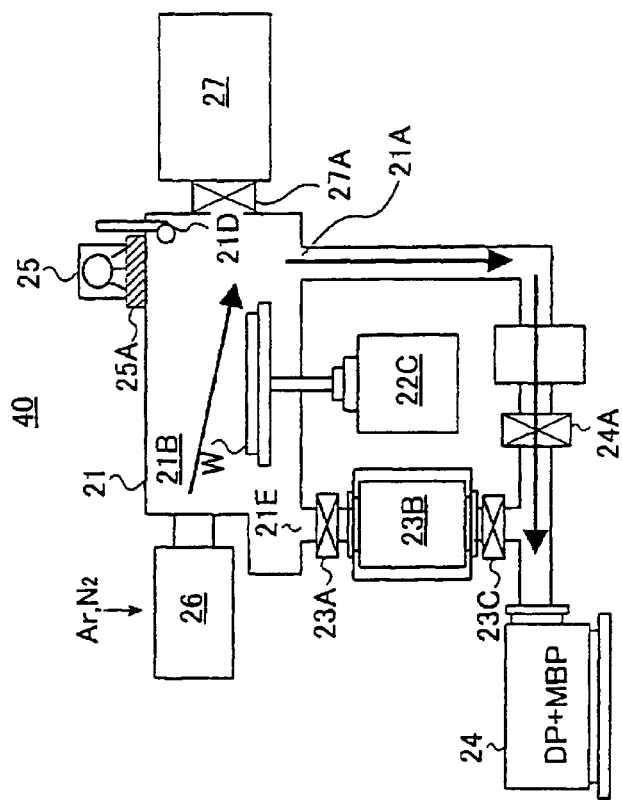
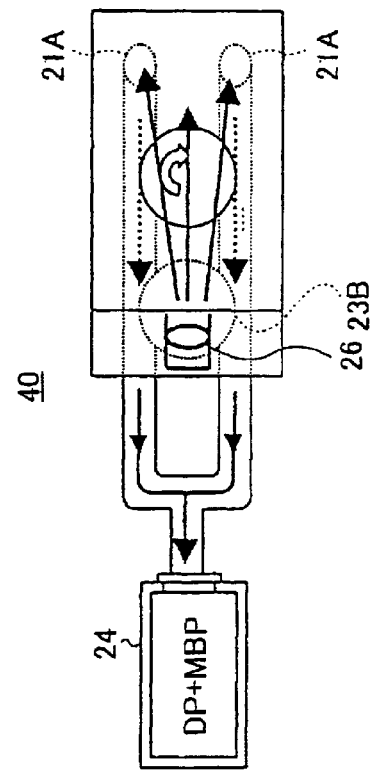
FIG.41A
FIG.41B

σ Unif.=0.72%

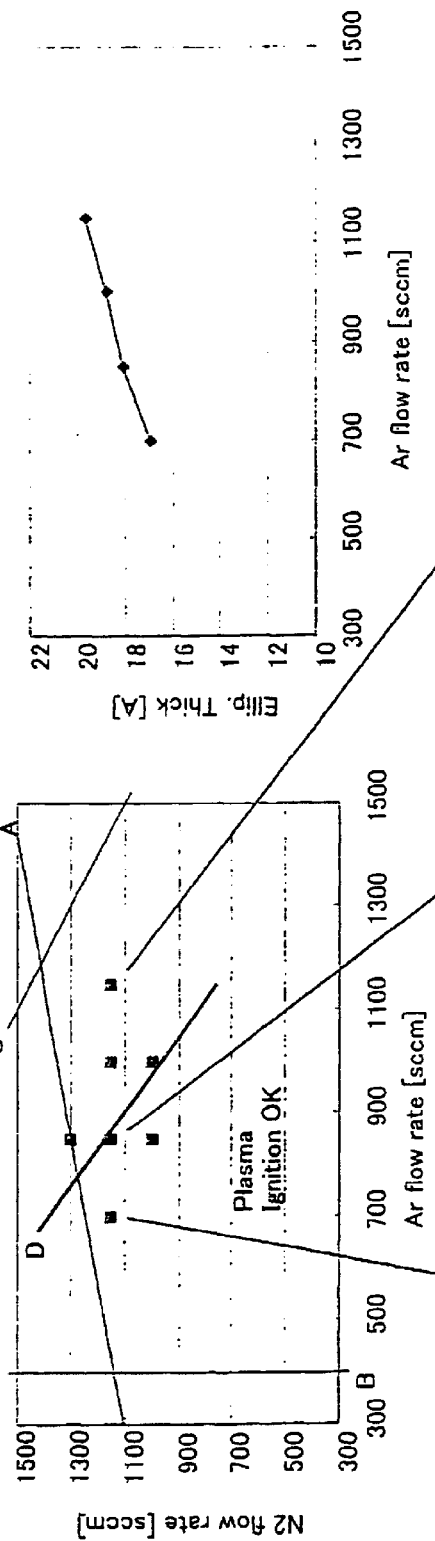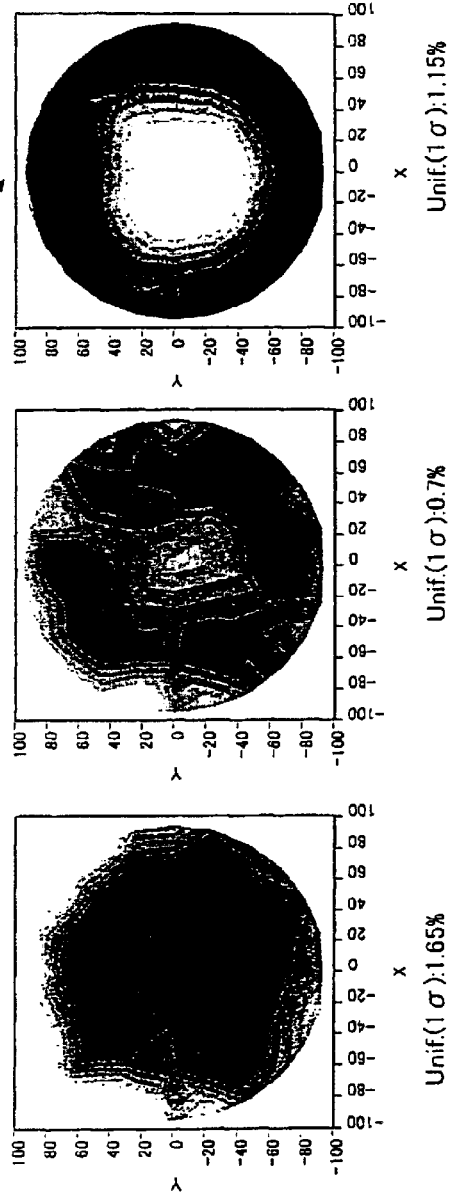
FIG.45A  FIG.45C  FIG.45B

FIG.54A

| | | 11.49 | | |
| --- | --- | --- | --- | --- |
| | | 11.64 | | |
| 10.92 | 11.61 | 11.78 | 11.77 | 11.11 |
| | | 11.59 | | |
| | | 11.45 | | |

| | | 9.54 | | |
| --- | --- | --- | --- | --- |
| | | 9.81 | | |
| 9.39 | 9.89 | 9.92 | 9.99 | 9.52 |
| | | 9.88 | | |
| | | 9.70 | | |

| | | 9.73 | | |
| --- | --- | --- | --- | --- |
| | | 9.81 | | |
| 9.36 | 9.85 | 9.90 | 9.95 | 9.47 |
| | | 9.82 | | |
| | | 9.64 | | |

| | | 9.77 | | |
| --- | --- | --- | --- | --- |
| | | 9.81 | | |
| 9.35 | 9.74 | 9.76 | 9.78 | 9.29 |
| | | 9.73 | | |
| | | 9.56 | | |

| | | 10.41 | | |
| --- | --- | --- | --- | --- |
| | | 10.47 | | |
| 9.57 | 10.27 | 10.26 | 10.24 | 9.45 |
| | | 9.97 | | |
| | | 9.54 | | |

|  |  | 5.10 |  |  | NO UV |
|---|---|---|---|---|---|
|  |  | 4.75 |  |  |  |
| 4.95 | 4.79 | 4.72 | 4.79 | 4.99 |  |
|  |  | 4.86 |  |  |  |
|  |  | 5.11 |  |  |  |
|  |  |  | 4.03% |  |  |

FIG.56B

|  |  | 8.81 |  |  | RTO |
|---|---|---|---|---|---|
|  |  | 8.63 |  |  |  |
| 8.06 | 8.50 | 8.46 | 8.43 | 8.04 |  |
|  |  | 8.43 |  |  |  |
|  |  | 8.15 |  |  |  |
|  |  |  | 4.57% |  |  |

FIG.62A

```
            7.54
            6.34
6.34  6.29  6.18  6.31  6.4
            6.29
            7.2
                  10.37%
```
Avg.6.549

FIG.62B

```
            9.46
            8.85
8.75  8.81  8.83  8.86  8.77
            8.89
            9.27
                  3.95%
```
Avg.8.947

FIG.63A

```
            7.19
            6.74
6.84  6.73  6.7   6.77  6.82
            6.76
            7.04
                  3.52%
```
Avg.6.848

FIG.63B

```
            7.24
            7.14
7.02  7.13  7.14  7.19  7.03
            7.15
            7.2
                  1.53%
```
Avg.7.141

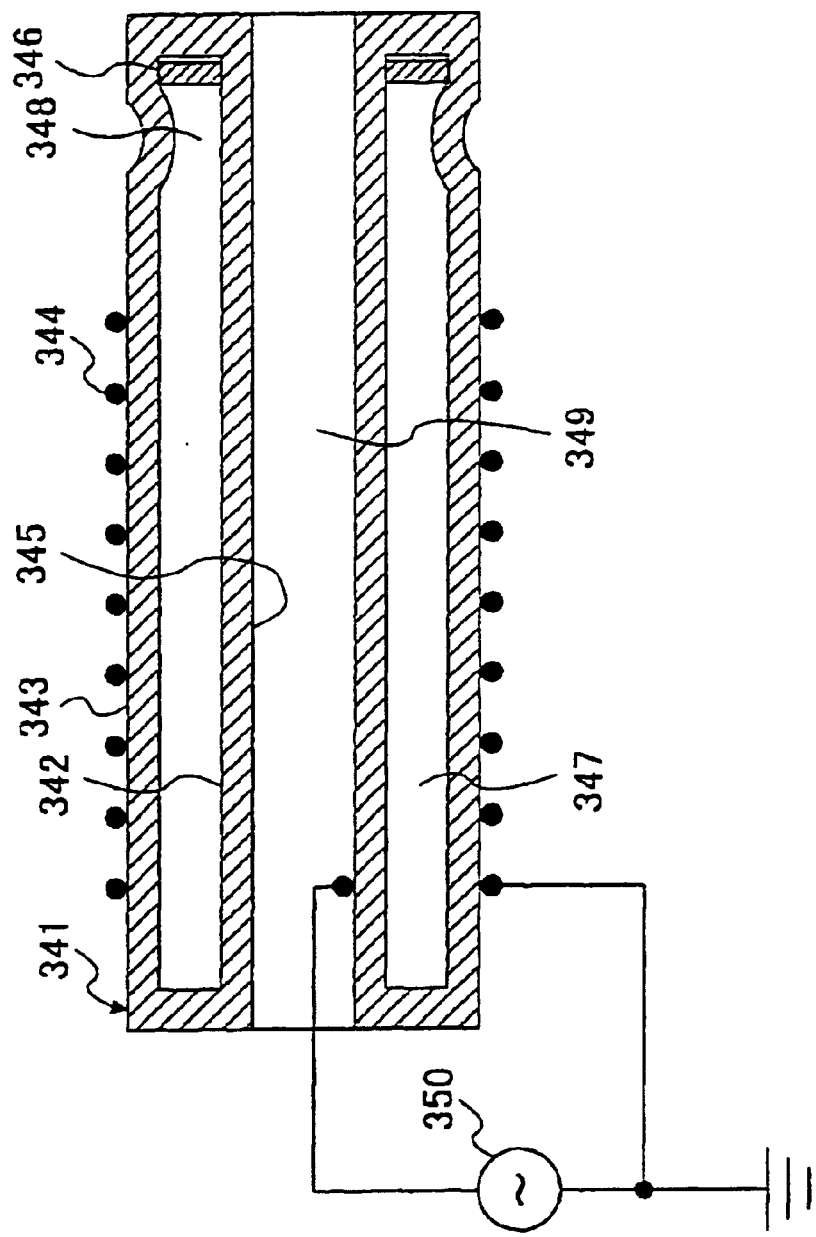

FIG.68A

| 7.09 |      | 7.88 |      | 7.05 |
|      | 7.28 | 7.27 | 7.31 |      |
| 7.05 | 7.35 | 7.09 | 7.35 | 7.03 |
|      | 7.38 | 7.32 | 7.32 |      |
| 8.15 |      | 7.72 |      | 8.2  |

7.90%

Avg.7.402

FIG.68B

| 7.26 |      | 7.56 |      | 7.22 |
|      | 7.24 | 7.35 | 7.24 |      |
| 7.31 | 7.39 | 7.13 | 7.37 | 7.23 |
|      | 7.29 | 7.35 | 7.24 |      |
| 7.53 |      | 7.54 |      | 7.56 |

2.93%

Avg.7.342

RADICAL PROCESSING OF A SUB-NANOMETER INSULATION FILM

BACKGROUND OF THE INVENTION

The present invention generally relates to semiconductor devices and more particularly to the fabrication process of ultrafine high-speed semiconductor devices having a high-K dielectric film.

In the technology of recent advanced high-speed semiconductor devices, use of the gate length of 0.1 μm or less is becoming possible with the progress in the art of ultrafine semiconductor fabrication processes. Generally, operational speed of a semiconductor device is improved with device miniaturization, while there is a need, in such extremely miniaturized semiconductor devices, to reduce the thickness of the gate insulation film thereof with the decrease of the gate length achieved as a result of the device miniaturization.

When the gate length has been reduced to 0.1 μm or less, on the other hand, the thickness of the gate insulation film has to be reduced to 1–2 nm or less when a conventional thermal oxide film is used for the gate insulation film. In such an extremely thin gate insulation film, however, there inevitably arises a problem of increased tunneling current, while such an increased tunneling current causes the problem of large gate leakage current.

In view of the situation noted above, there has been a proposal of using a high-dielectric material (so-called high-K dielectric material) having a much larger specific dielectric constant as compared with a thermal oxide film and thus capable of achieving a small $SiO_2$-equivalent thickness while maintaining a large physical thickness, for the gate insulation film. Such a high-K material includes $Ta_2O_5$, $Al_2O_3$, $ZrO_2$, $HfO_2$, $ZrSiO_4$, $HfSiO_4$, and the like. By using such a high-K dielectric material, it becomes possible to use the physical thickness of about 10 nm in ultra high-speed semiconductor devices having a gate length of 0.1 μm or less. Thereby, the gate leakage current caused by tunneling effect is successfully suppressed.

For example, a $Ta_2O_5$ film has been formed by a CVD process while using $Ta(OC_2H_5)_5$ and $O_2$ as gaseous sources. In a typical example, the CVD process is conducted under a reduced pressure at a temperature of about 480° C. or more. The $Ta_2O_5$ film thus formed is then subjected to a thermal annealing process in an oxidizing ambient and the oxygen defects in the film are compensated. Further, the film undergoes crystallization. The $Ta_2O_5$ film thus crystallized shows a large specific dielectric constant.

From the view point of increasing carrier mobility in the channel region, it is preferable to provide an extremely thin base oxide film having a thickness of 1 nm or less, preferably 0.8 nm or less, between the high-K dielectric gate oxide film and the silicon substrate. This base oxide film has to be extremely thin. Otherwise, the effect of using the high-K dielectric film for the gate insulation film is cancelled out. On the other hand, such an extremely thin base oxide film is required also to cover the silicon substrate surface uniformly, without forming defects such as surface states.

Conventionally, rapid thermal oxidation (RTO) process of a silicon substrate has been used when forming a thin gate oxide film. When such an RTO process is used for forming a thermal oxide film with the desired thickness of 1 nm or less, there is a need of decreasing the processing temperature at the time of the film formation. However, such a thermal oxide film formed at low temperature tends to contain a large amount of surface states and is not suitable for the base oxide film of a high-K dielectric gate oxide film.

FIG. 1 shows the schematic construction of a high-speed semiconductor device 100 having a high-K dielectric gate insulation film.

Referring to FIG. 1, the semiconductor device 100 is constructed on a silicon substrate 1 and includes a high-K dielectric gate insulation film such as $Ta_2O_5$, $Al_2O_3$, $ZrO_2$, $HfO_2$, $ZrSiO_4$, $HfSiO_4$, and the like, formed on the silicon substrate 1 via a thin base oxide film 2. Further, a gate electrode 4 is formed on the high-K dielectric gate insulation film 3.

In the semiconductor device 100 of FIG. 1, there is conducted nitrogen (N) doping on the surface part of the base oxide film 2 within the extent that a flat interface is maintained between the silicon substrate 1 and the base oxide film 2. As a result of the nitrogen doping, the base oxide film 2 includes an oxynitride film 2A. In view of the large specific dielectric constant of such a silicon oxynitride film larger than that of a silicon oxide, it becomes possible to reduce the oxide-equivalent thickness of the base oxide film 2 further, by forming the oxynitride film 2A in the base oxide film 2.

As explained before, it is preferable that the base oxide film 2 has as small thickness as possible in such a high-speed semiconductor device 100.

However, it has been extremely difficult to form the base oxide film 2 with the thickness of 1 nm or less, such as 0.8 nm or less, or even 0.3–0.4 nm, while simultaneously maintaining uniformity and reproducibility. In the case the film has the thickness of 0.3–0.4 nm, the oxide film has actually a thickness of only 2–3 atomic layers.

In order that the high-K dielectric gate insulation film 3 formed on the base oxide film 2 performs as a high-K dielectric film, it is necessary to crystallize the deposited high-K dielectric film 3 by a thermal annealing process and conduct compensation process of oxygen vacancy defects. However, such a thermal annealing process applied to the high-K dielectric gate insulation film 3 causes an increase of thickness in the base oxide film 2, and the desired decrease of the effective thickness of the gate insulation film, achieved by the use of the high-K dielectric gate insulation film 3, is more or less cancelled out.

Such an increase of thickness of the base oxide film 2 associated with the thermal annealing process suggests the possibility of mutual diffusion of oxygen atoms and silicon atoms and associated formation of a silicate transition layer, or the possibility of growth of the base oxide film 2 caused by the penetration of oxygen into the silicon substrate. Such a problem of increase of the base oxide film 2 with thermal annealing process becomes a particularly serious problem in the case the thickness of the base oxide film is reduced to several atomic layers or less.

In view of the situation noted above, the inventor of the present invention has previously proposed the use of ultraviolet-excitation oxygen radical ($UV-O_2$ radial) substrate processing apparatus for the formation of the base oxide film. By using such an ultraviolet-excitation oxygen radial processing apparatus, it becomes possible to grow a high-quality oxide film with low growth rate under low radical density.

FIG. 2 shows the construction of a conventional $UV-O_2$ radial substrate processing apparatus 10.

Referring to FIG. 2, the substrate processing apparatus 10 includes a processing vessel 11 that holds a substrate 12 therein under a reduced pressure environment, wherein the substrate 12 is held on a stage 11A having a heater 11a. Further, there is provided a showerhead 11B in the processing vessel 11 so as to face the substrate 12 on the stage 11A, and an oxidizing gas such as oxygen, $O_3$, $N_2O$, NO, or a mixture thereof is supplied to the shower head 21B.

The showerhead 11B is formed of a material transparent to ultraviolet radiation such as quartz, and the processing vessel 11 is formed with a window 11C of quartz and the like, which is transparent to the ultraviolet radiation, such that the window 11C exposes the substrate 12 on the stage 11A. Further, a ultraviolet source 13 is formed outside the window 11C such that the ultraviolet source 13 is movable along the surface of the window 11C.

Thus, a silicon substrate is introduced in the processing vessel 11 of FIG. 2 as the substrate 12, and an oxidizing gas such as oxygen is introduced into the processing vessel 11 after evacuating the interior thereof. By activating the ultraviolet source 13 under this state, active radicals such as O* are formed in the oxidizing gas. The radicals thus excited by the ultraviolet radiation cause oxidation on the exposed surface of the silicon substrate 12, and as a result, there is formed an extremely thin oxide film of 0.5–0.8 nm thickness on the surface of the silicon substrate 12.

In the substrate processing apparatus 10 of FIG. 2, the oxide film can be formed with a uniform thickness by causing to move the ultraviolet source 13 along the optical window 11C.

Because of the oxide film is formed by the ultraviolet-activated oxidation process, the oxide film has an advantageous feature of small defect density such as surface states as is reported by Zhang et al. (Zhang, J-Y., et al. Appl. Phys. Lett. 71 (20), 17 Nov. 1997, pp.2964–2966) and is suitable for the base oxide film to be formed under the high-K dielectric gate insulation film.

As explained before, the base oxide film underneath the high-K dielectric gate insulation film has to be extremely thin, and a thickness of about 0.8 nm has been achieved for such a base oxide film by using the UV-$O_2$ radical substrate processing apparatus. However, it has been difficult to reduce the thickness of the base oxide film further, and it was particularly difficult to form such an extremely thin oxide film with high-precision and with uniform thickness.

Meanwhile, there has been an argument that formation of a metal oxide film having a small interatomic bond valence, and hence a "low rigidity", on a surface of a single-crystal silicon substrate, which has a large interatomic bond valence and hence a "high rigidity", would lead to a mechanical instability at the interface between the silicon substrate and the metal oxide film, and that such mechanical instability may cause defects (see for example G. Lucovisky, et al., Appl. Phys. Lett. 74, pp.2005, 1999). Further, in order to avoid this problem, there is a proposal to form a transitional layer of oxynitride at the interface between the silicon substrate and the metal oxide film by introducing a single layer of nitrogen atoms. Further, formation of such an oxynitride film for the base oxide film of a high-K dielectric gate insulation film is thought effective for suppressing diffusion of metal element or oxygen in the high-K dielectric gate insulation film to the silicon substrate or diffusion of silicon from the silicon substrate to the high-K dielectric gate, or for suppressing the diffusion of dopant element from the gate electrode.

In order to form such an oxynitride film, there has been a proposal to oxidize the surface of an oxide film by using microwave-excited remote plasma. This technology, which achieves the desired nitridation by using a microwave, requires a very high-degree vacuum of the order of $1.33 \times 10^{-1}$–$1.33 \times 10^{-4}$ Pa ($10^{-3}$–$10^{-5}$ Torr). However, nitridation process conducted under such an extremely high-degree vacuum state raises the problem in that minute amount of impurity such as residual oxygen or water in the processing vessel, provides a profound effect on the process by way of oxidation. Such oxidation occurred at the time of the nitridation process causes the problem of unwanted increase of thickness of the oxide film. As noted before, such an increase of thickness of the oxide film at the process of forming the oxynitride film cancels out the effect of using the high-K dielectric gate insulation film.

Conventionally, it has been extremely difficult to form such an extremely thin oxynitride film with reliability and reproducibility in a vacuum state easily achieved by an ordinary semiconductor process, without causing increase of film thickness by oxidation.

SUMMARY OF THE INVENTION

Accordingly, it is a general object of the present invention to provide a novel and useful substrate processing method and apparatus wherein the foregoing problems are eliminated.

Another and more specific object of the present invention is to provide a substrate processing method capable of forming an extremely thin insulation film on a substrate, a semiconductor device using such an insulation film, and fabrication process of such a semiconductor device.

Another object of the present invention is to provide substrate processing method and apparatus capable of forming an extremely thin oxide film, typically having a thickness of 2–4 atomic layers or less, on a surface of a silicon substrate with reliability and further capable of forming an oxynitride film by causing nitridation in the oxide film thus formed.

Another object of the present invention is to provide substrate processing method and apparatus capable of forming an extremely thin oxynitride film typically having a thickness of 2–4 atomic layers or less and further capable of forming an oxynitride film having a higher nitrogen concentration and a desired thickness by causing nitridation of the initial oxynitride film.

Another object of the present invention is to provide a cluster-type substrate processing system including a substrate processing apparatus capable of forming an extremely thin oxide film or nitride film typically having a thickness of 2–4 nm or less, on the surface of a silicon substrate with reliability and further capable of nitriding the oxide film or nitride film thus formed with reproducibility and with reliability.

Another object of the present invention is to provide a substrate processing method capable of forming an extremely thin oxynitride film on a silicon substrate directly with excellent reliability and reproducibility.

Another object of the present invention is to provide a method of nitriding an insulation film containing therein oxygen, comprising the steps of:

forming nitrogen radicals by using high-frequency plasma; and nitriding a surface of said insulation film by supplying said nitrogen radicals to said surface of said insulation film.

Another object of the present invention is to provide a method of fabricating a semiconductor device, comprising the steps of:

forming an insulation film on a silicon substrate surface;

forming nitrogen radicals by high-frequency plasma;

forming an oxynitride film by causing nitridation in a surface of said insulation film by supplying said nitrogen radicals to said surface of said oxynitride film; and forming a high-K dielectric film on said oxynitride film.

Another object of the present invention is to provide a substrate processing apparatus, comprising:

a nitrogen radical formation unit forming nitrogen radicals by high-frequency plasma; and a processing vessel holding a substrate formed with said insulation film, said processing vessel being supplied with said nitrogen radicals form said nitrogen radical formation part and causing nitridation of a surface of said insulation film by supplying said nitrogen radical to said surface of said insulation film.

According to the present invention, it becomes possible to nitride the surface of an extremely thin oxide film with excellent reproducibility by using the nitrogen radicals excited by high-frequency plasma. Further, according to the present invention, it becomes possible to form an oxynitride film of high nitrogen concentration with a desired thickness by nitriding the surface of an extremely thin oxynitride film by using the nitrogen radicals excited by the high-frequency plasma. By using high-frequency plasma, it becomes possible to conduct the nitridation process at relatively high pressures, and it becomes possible to dilute any impurity gas components such as residual oxygen remaining in the processing vessel by the plasma gas by merely evacuating the processing vessel at the beginning of the nitriding process to a sufficiently low pressure. Thereby, the problem of unwanted oxidation caused by the residual oxygen and associated problem of increased thickness of the oxynitride film are successfully suppressed. Particularly, the present invention enables nitridation of an extremely thin base oxide film formed under a high-K dielectric gate insulation film, and as a result, the problem of mutual diffusion of metal element and silicon between the silicon substrate and the high-K dielectric gate insulation film, and the associated problem of formation of a transitional layer are effectively suppressed.

While it is generally unavoidable that an extremely thin insulation film such as oxide film or oxynitride film undergoes increase of film thickness as a result of incorporation of nitrogen atoms at the time of the nitridation process, it is possible in the present invention to maintain the thickness of the insulation film after the nitridation process, in other words the thickness of the oxynitride film, to be extremely small, by controlling the thickness of the insulation film before the nitridation process to 2–4 atoms layers or less.

Another object of the present invention is to provide a substrate processing apparatus comprising:

a processing vessel defining a process space and having a stage in said process space for holding a substrate to be processed;

a first radical source provided on said processing vessel;

a second radical source provided on said processing vessel;

a first evacuation path provided on said processing vessel for evacuating said process space to a first process pressure; and a second evacuation path provided on said processing vessel for evacuating said process space to a second process pressure.

Another object of the present invention is to provide a cluster-type substrate processing system, comprising:

a substrate transfer chamber; and a plurality of processing chambers connected to said substrate transfer chamber, one of said plurality of processing chambers comprising:

a processing vessel having a substrate load/unload part connected to said substrate transfer chamber at a first end and a first radical source at a second end opposite to said first end, said processing vessel defining therein a process space;

a stage provided in said process space rotatably between said first end and said second end, said stage holding thereon a substrate to be processed;

a first process gas inlet provided in said process space between said first end and said stage, said first process gas inlet introducing a first process gas into said process space;

a second process as inlet introducing a second process gas to said first radical source;

a second radical source provided on said processing vessel so as to activate said first process gas between said first process gas inlet and said stage;

a first evacuation port provided in said process space at a part closer to said first end with respect to said stage;

a second evacuation port provided in said process space at a part closer to said second end with respect to said stage;

a first pump connected to said first evacuation port so as to evacuate said process space to a first process pressure;

a second pump connected to said second evacuation port so as to evacuate said process space to a second process pressure lower than said first process pressure;

said second pump being disposed in the vicinity of said second end of said processing vessel.

According to the present invention, it becomes possible to conduct ultraviolet-excited radical oxidation process of a silicon substrate to form an oxide film and a radical nitridation process of such an oxide film, formed by the ultraviolet-excited radical oxidation process by using radicals excited by high-frequency remote plasma, such that the radical nitridation process is conducted continuously to the radical oxidation process. Although the pressure suitable for ultraviolet-excited radical oxidation process and the pressure suitable for radical nitridation process conducted by using a high-frequency remote plasma are very much different, the present invention allows to conduct these two processes in the common processing vessel by providing two evacuation paths on the processing vessel. Particularly, the present invention enables nitridation of an extremely thin base oxide to be formed underneath a high-K dielectric gate insulation film, and as a result, the problem of mutual diffusion of metal element and silicon between the silicon substrate and the high-K dielectric gate insulation film or formation of transitional layer associated with such mutual diffusion, is successfully suppressed by forming the high-K dielectric gate insulation film on the base oxide film. Further, the present invention enables easy construction of a cluster-type substrate processing system while using the substrate processing apparatus, by arranging the first and second evacuation paths in the processing vessel such that a turbo molecular pump, which is necessary for realizing high degree vacuum in the processing vessel, is located at the outer end part of the processing vessel. Thereby, the substrate processing apparatus can be connected to a substrate transfer unit at an inner end part thereof.

Another object of the present invention is to provide a semiconductor device, comprising:

a silicon substrate; and an insulation film provided on said silicon substrate, said insulation film having a thickness of 2–4 atomic layers.

Another object of the present invention is to provide a semiconductor device, comprising:

a silicon substrate; and an insulation film provided on said silicon substrate, said insulation film being formed by nitriding an oxide film formed on said silicon substrate with a thickness of 1–4 atomic layers.

Another object of the present invention is to provide a method of processing a substrate, comprising the step of forming an oxide film on a surface of a silicon substrate by an oxidation process, said oxidation process being conducted with oxygen radicals having a partial pressure in the range of $133–133\times10^{-4}$ mPa.

Another object of the present invention is to provide a method of fabricating a semiconductor device, comprising the steps of:

forming a base oxide film on a surface of a silicon substrate;

forming a high-K dielectric film on said base oxide film; and forming a gate electrode layer on said high-K dielectric film, said step of forming said base oxide film comprising an oxidizing step conducted by oxygen radicals having a partial pressure in the range of $133–133\times10^{-4}$ mPa.

According to the present invention, it becomes possible to form an extremely thin oxide film suitable for a base oxide film used between a silicon substrate and a high-K dielectric gate insulation film with a uniform thickness and with excellent reproducibility by utilizing the phenomenon film growth delay, which appears in the radical oxidation process of a silicon substrate surface in the case the oxide film has grown to a thickness of 2–4 atomic layers.

Another object of the present invention is to provide a method of processing a substrate, comprising the steps of:

supplying an NO gas to a surface of a silicon substrate; and forming an oxynitride film on said surface of said silicon substrate by exciting said NO gas with ultraviolet radiation.

According to the present invention, it becomes possible to form an oxynitride film directly on a silicon substrate surface by exciting an NO ambient with ultraviolet radiation. Thereby, it becomes possible to suppress the occurrence of oxidation by choosing the wavelength of the ultraviolet radiation to be longer than 145 nm but not exceeding 192 nm, for example to 172 nm. Thereby, an oxynitride film having a high nitrogen concentration level is formed. Such an oxynitride film shows a delay of film growth at the film thickness of about 0.5 nm corresponding to two atomic layers. Thus, the oxynitride film can be formed stably and with excellent reproducibility to this film thickness.

Other objects and further features of the present invention will become apparent from the following detailed description when read in conjunction with the attached drawings.

BRIEF DESCRIPTION OF THE DRAWINGS

FIG. 5 is a diagram showing an oxidation process of a substrate conducted by using the substrate processing apparatus of FIG. 3;

FIGS. 9A and 9B are diagrams showing the oxide film formation process on a surface of a silicon substrate;

FIG. 14A is a diagram comparing the characteristics of RF remote plasma and microwave plasma, while FIGS. 14B and 14C are diagrams respectively showing the construction of a standard remote-plasma source and a microwave plasma source;

FIGS. 26A–26C are diagrams showing the chemical shift appearing in an XPS spectrum of an $Si_{2p}$ orbital at the time a high-K dielectric film is formed on an oxynitride film obtained according to the first embodiment of the present invention;

FIGS. 33A and 33B are diagrams showing the thickness of the oxynitride film formed according to the substrate processing method of the third embodiment and the thickness of the oxynitride film formed according to a comparative example;

FIGS. 41A and 41B are diagrams showing nitriding processing of a substrate conducted by using the substrate processing system of FIG. 39;

FIGS. 45A–45C are diagrams showing the thickness distribution of an oxynitride film formed according to the sixth embodiment of the present invention;

FIGS. 54A–54E are further diagrams showing the thickness distribution of an oxide film formed by the substrate processing apparatus of FIG. 51;

FIGS. 55A–55E are further diagrams showing the thickness distribution of an oxide film formed by the substrate processing apparatus of FIG. 51;

FIGS. 56A and 56B are diagrams showing the thickness distribution of an oxide film according to a comparative example;

FIGS. 62A and 62B are diagrams showing the thickness distribution of an oxide film formed on a silicon substrate for the case the oxide film is subjected to a UV-NO processing according to a ninth embodiment of the present invention;

FIGS. 63A and 63B are diagrams showing the thickness distribution of an oxynitride film for the case the oxynitride film is formed on a surface of a silicon substrate directly by the UV-NO processing;

FIG. 67 is a diagram showing an example of an optical source;

FIGS. 68A and 68B are diagrams showing the thickness distribution of an oxynitride film obtained according to a substrate processing process according to a tenth embodiment of the present invention;

DETAILED DESCRIPTION OF THE PREFERRED EMBODIMENTS

[First Embodiment]

Figure 1:
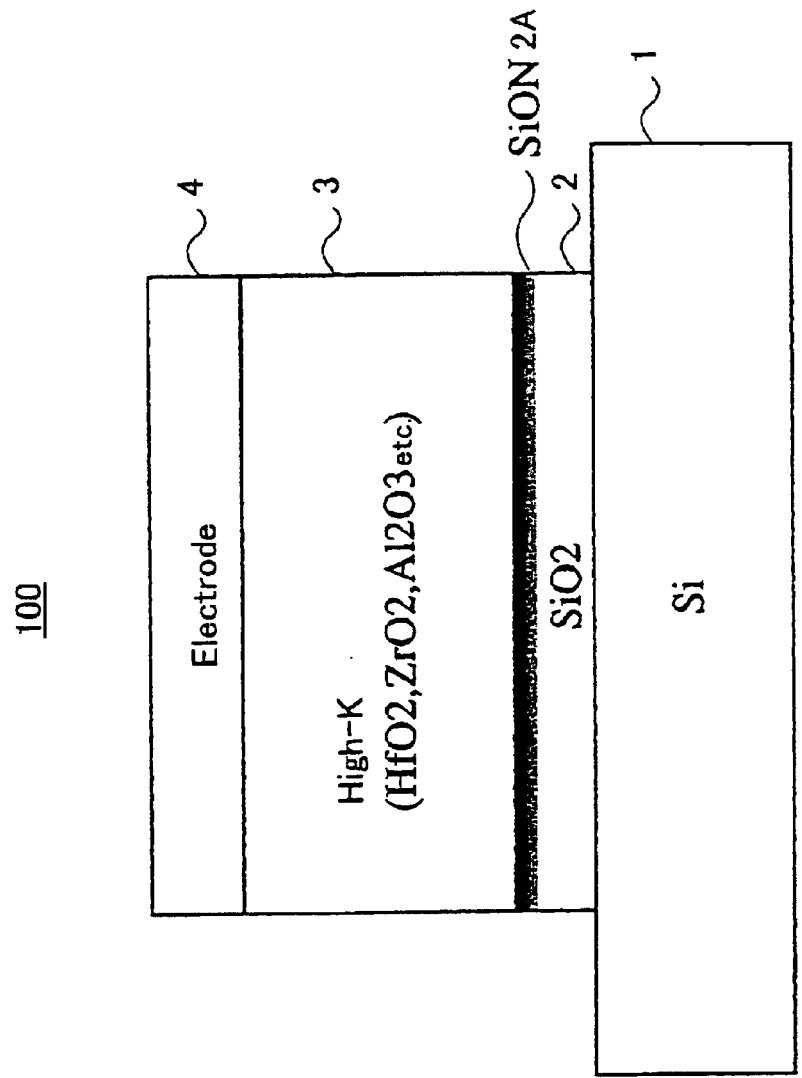
FIG. 1 is a diagram showing the construction of a semiconductor device having a high-K dielectric gate insulation film.
Figure 2:
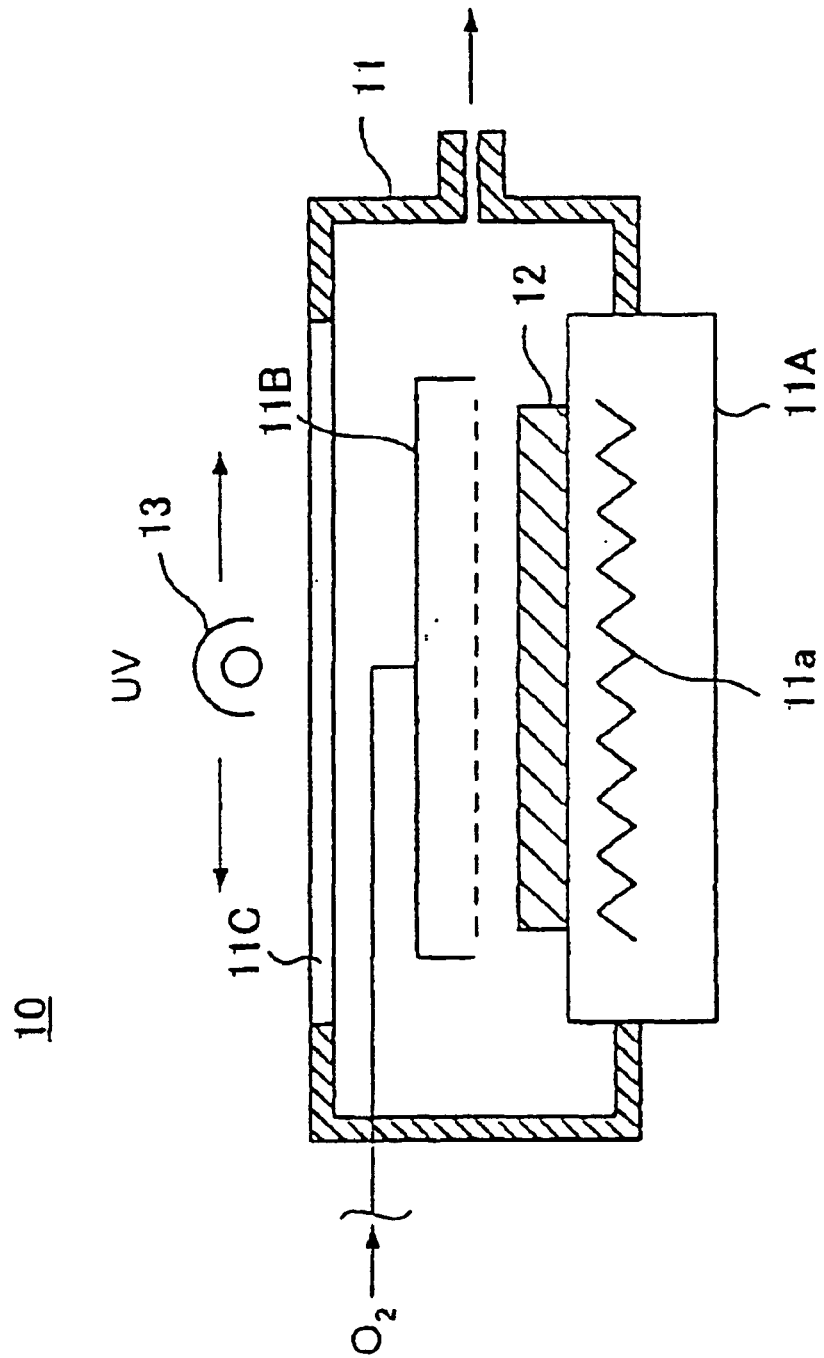
FIG. 2 is a diagram showing the construction of a conventional UV-$O_2$ radical substrate processing apparatus.
Figure 3:
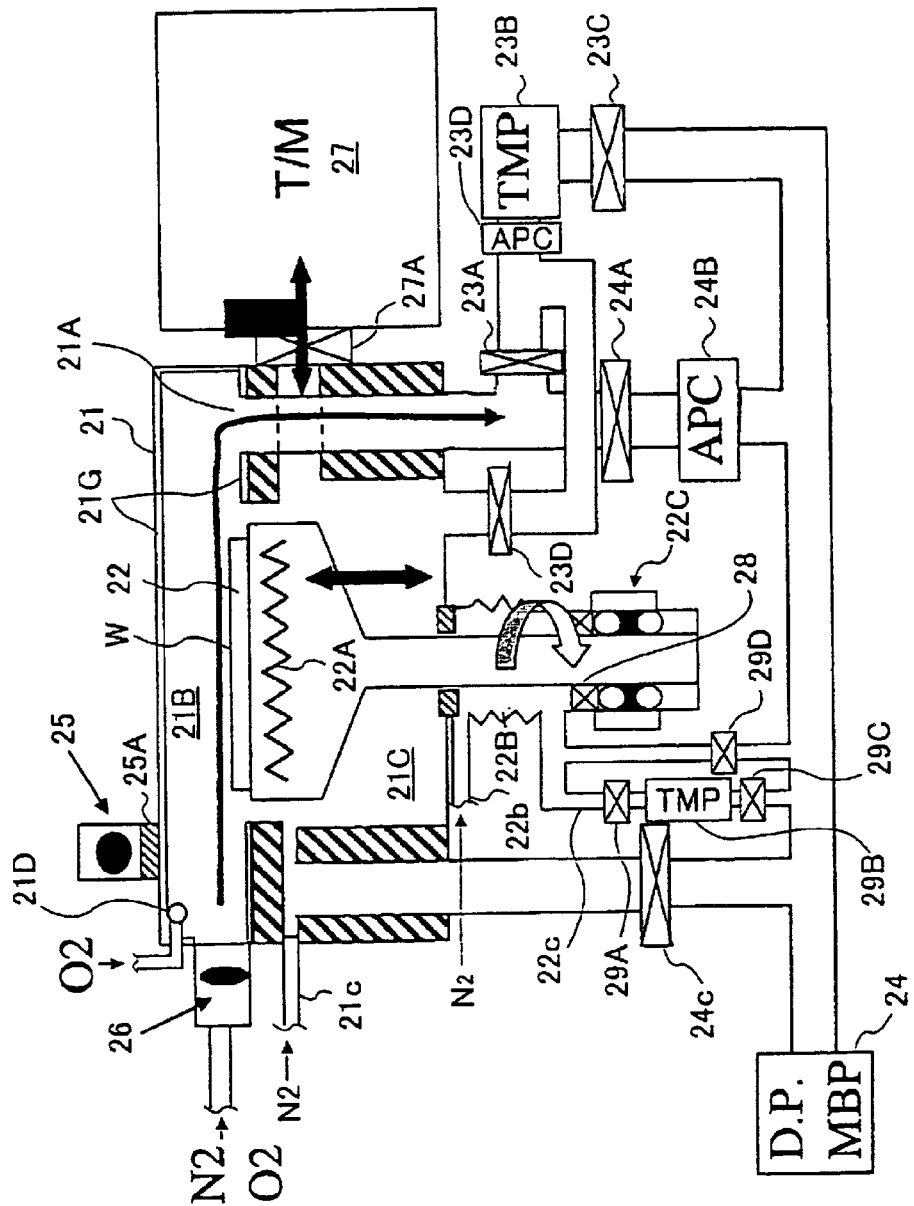
FIG. 3 is a diagram showing the construction of a substrate processing apparatus according to a first embodiment of the present invention.

FIG. 3 shows the general construction of a substrate processing apparatus 20 according to a first embodiment of the present invention for forming the thin base oxide film 2 on the silicon substrate 1 of FIG. 1 together with the oxynitride film 2A.

Referring to FIG. 3, the substrate processing apparatus 20 includes a processing vessel 21 accommodating therein a stage 22 equipped with a heater 22A such that the stage 22 is movable vertically between a process position and a substrate load/unload position. The stage 22 is rotated by a drive mechanism 22C, and the processing vessel 21 defines a process space 21B therein together with the stage 22. The inner surface of the processing vessel 21 is covered with an inner liner 21G of a quartz glass, and the inner liner 21G suppresses the metal contamination of the substrate to be processed to the level of $1 \times 10^{10}$ atoms/cm$^2$ or less.

Further, there is provided a magnetic seal 28 at the connecting part of the stage 22 and the drive mechanism 22C such that the magnetic seal 28 separates a magnetic seal chamber 22B held in a vacuum environment from the drive mechanism 22C formed in the atomic environment. Because the magnetic seal 28 is a liquid, the stage 22 is held so as to be able to rotate freely.

In the illustrated state, the stage 22 is held at the process position and there is formed a load/unload chamber 21C underneath the stage 22 for loading and unloading the substrate. The processing vessel 21 is connected to a substrate transfer unit 27 via a gate valve 27A, and thus, the substrate W is transported to the stage 22 from the substrate transfer unit 27 via the gate valve 27A in the state that stage 22 has been lowered to the load/unload chamber 21C. Further, the processed substrate W is transferred to the substrate transfer unit 27 from the stage 22.

In the substrate processing apparatus 20 of FIG. 3, there is formed an evacuation port 21A near the gate valve 27 of the processing vessel 21, and a turbo molecular pump 23B is connected to the evacuation port 21A via the valve 23A and an APC (automatic pressure controller) 24B. The turbo molecular pump 23B is further connected to a pump 24 formed of a dry pump and a mechanical booster pump via a valve 23C, and the pressure inside the process space 21B can be reduced to the level of $1.33 \times 10^{-1} - 1.33 \times 10^{-4}$ Pa ($10^{-3} - 10^{-6}$ Torr) by driving the turbo molecular pump 23B and the dry pump 24.

It should be noted that the evacuation port 21A is connected also to the pump 24 directly via a valve 24A and an APC 24B, and thus, the pressure of the process space is reduced to the level of 1.33 Pa–1.33 kPa (0.01–10 Torr) by the pump 24 when the valve 24A is opened.

The processing vessel 21 is provided with a process gas supplying nozzle 21D at the side opposite to the evacuation port 21A across the substrate W, and an oxygen gas is supplied to the process gas supplying nozzle 21D. The oxygen gas thus supplied to the process gas supplying nozzle 21D is caused to flow in the process space 21B along the surface of the substrate W and is evacuated from the evacuation port 21A.

In order to activate the process gas thus supplied from the process gas supplying nozzle 21D, the substrate processing apparatus 20 of FIG. 3 is provided with an ultraviolet optical source 25 having a quartz window 25A on the processing vessel 21 in correspondence to the region located between the process gas supplying nozzle 21D and the substrate W. Thus, by driving the ultraviolet source 25, the oxygen gas introduced in to the process space 21B from the process gas supplying nozzle 21D is activated, there are formed oxygen radicals and the oxygen radicals thus formed are caused to flow along the surface of the substrate W. As a result, it becomes possible to form a radical oxide film on the surface of the substrate W with a thickness of 1 nm or less, particularly with the thickness of about 0.4 nm, which corresponds to the thickness of 2–3 atomic layers.

Further, the processing vessel 21 is provided with a remote plasma source 26 at the side thereof opposite to the evacuation port 21A with respect to the substrate W. Thus, nitrogen radicals are formed by supplying a nitrogen gas to the remote plasma source 26 together with an inert gas such as Ar and by activating the nitrogen gas thus supplied with plasma. The nitrogen radicals thus formed are caused to flow along the surface of the substrate W and causes nitridation of the substrate surface. By introducing oxygen into the remote plasma source 26 in place of nitrogen, it is also possible to oxidize the substrate surface.

In the substrate processing apparatus 20 of FIG. 3, there is provided a purge gas line 21c for purging the load/unload chamber 21C with a nitrogen gas. Further, there is provided a purge line 22b for purging the magnetic seal chamber 22B with a nitrogen gas and an evaluation line 22c of the purge gas.

In more detail, the evacuation line 22c is connected to a turbo molecular pump 29B via a valve 29A, and the turbo molecular pump 29B is connected to the pump 24 via a valve 29C. Further, the evacuation line 22c is connected directly to the pump 24 via a valve 29D. With this, it becomes possible to maintain the magnetic seal chamber 22B at various pressures.

The load/unload chamber 21C is evacuated by the pump 24 via the valve 24C or by the turbo molecular pump 23B via the valve 23D. Further, in order to avoid contamination in the process space 21B, the load/unload chamber 21C is held at a lower pressure than the process space 21B, and the magnetic seal chamber 21B is held at a further lower pressure than the load/unload chamber 21C by a conducting differential evacuation process.

Hereinafter, the ultraviolet radical oxidation process and the remote plasma radical nitridation process conducted subsequently to the radical oxidation process on the surface of the substrate W by using the substrate processing apparatus 20 of FIG. 3 will be explained.

Ultraviolet Radical Oxidation (UV-$O_2$) Processing

Figures 4A, 4B:
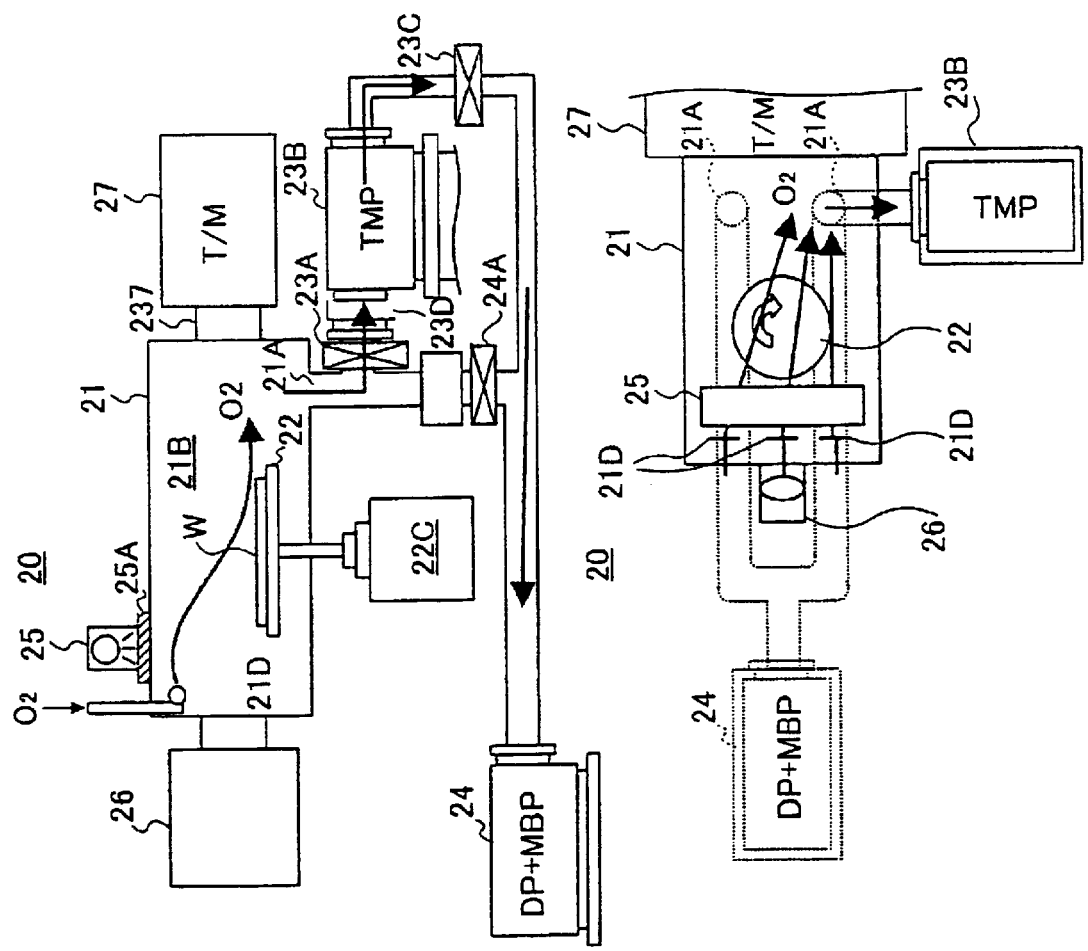
FIGS. 4A and 4B are diagrams showing on oxidation process of a substrate conducted by the substrate processing apparatus of FIG. 3 respectively in a side view and in a plan view.

FIGS. 4A and 4B are diagrams showing the radical oxidation process of the substrate W by using the substrate processing apparatus 20 of FIG. 3 respectively in a side view and a plan view.

Referring to FIG. 4A, an oxygen gas is supplied to the process space 12B from the process gas supplying nozzle 21D and the oxygen gas thus supplied is evacuated, after flowing along the surface of the substrate W, via the evacuation port 21A, APC 23D, turbo molecular pump 23B and the pump 24. By using the turbo molecular pump 23B and the APC 23D, the base pressure in the process space 21B is set to the level of $1 \times 10^{-3} - 10^{-6}$ Torr, which is needed for the oxidation of the substrate by oxygen radicals.

Simultaneously to this, the ultraviolet source 25, preferably the one that produces ultraviolet radiation of 172 nm wavelength, is activated, and oxygen radicals are formed in the oxygen gas flow thus formed. The oxygen radicals thus formed cause oxidation of the substrate surface as they are caused to flow along the rotating substrate W. Thus, as a result of the oxidation of the substrate W by the ultraviolet-activated oxygen radicals (referred to hereinafter as UV-$O_2$ processing), a very thin oxide film having a thickness of 1 nm or less, particularly the thickness of about 0.4 nm corresponding to the thickness of 2–3 atomic layers, is formed on a surface of a silicon substrate stably and with excellent reproducibility.

FIG. 4B shows the construction of FIG. 4A in a plan view.

Referring to FIG. 4B, it can be seen that the ultraviolet source 25 is a tubular light source extending in the direction crossing the direction of the oxygen gas flow. Further, it can be seen that the turbo molecular pump 23B evacuates the process space 21B via the evacuation port 21A. Further, it should be noted that the evacuation path, designated in FIG. 4B by a dotted line and extending directly from the evacuation port 21A to the pump 24, is closed by closing the valve 24A.

As can be seen from the plan view of FIG. 4B, the turbo molecular pump 23B is provided in an arrangement so as to extend laterally from the processing vessel. Thereby, the turbo molecular pump 23B successfully avoids the substrate transfer unit 27.

FIG. 5 shows the relationship between the film thickness and oxidation time for the case a silicon oxide film is formed on a surface of a silicon substrate in the process of FIGS. 4A and 4B by using the substrate processing apparatus 20 of FIG. 3 by setting the substrate temperature at 450° C. and changing the ultraviolet radiation power and the oxygen gas flow rate or oxygen partial pressure variously. In the experiment of FIG. 5, it should be noted that any native oxide film on the silicon substrate surface is removed prior to the radical oxidation process. In some cases, the substrate surface is planarized by removing residual carbon from the substrate surface by using nitrogen radicals excited by ultraviolet radiation, followed by a high temperature annealing process conducted at about 950° C. in an Ar ambient. An excimer lamp having a wavelength of 172 nm is used for the ultraviolet source 24B.

Referring to FIG. 5, the data of Series 1 represents the relationship between the oxidation time and oxide film thickness for the case the ultraviolet radiation power is set to 5% of a reference power (50 mW/cm$^2$) at the window surface of the ultraviolet radiation source 24B and the process pressure is set to 665 mPa (5 mTorr) and further the oxygen gas flow rate is set to 30 SCCM. On the other hand, the data of Series 2 represents the relationship between the oxidation time and oxide film thickness for the case the ultraviolet radiation power is set to zero, the process pressure is set to 133 Pa (1 Torr) and the oxygen gas flow rate is set to 3 SLM.

The data of Series 3 represents the relationship between the oxidation time and oxide film thickness for the case the ultraviolet radiation power is set to zero, the process pressure is set to 2.66 Pa (20 mTorr) and the oxygen gas flow rate is set to 150 SCCM, while the data of Series 4 represents the relationship between the oxidation time and oxide film thickness for the case the ultraviolet radiation power is set to 100% of the reference power, the process pressure is set to 2.66 Pa (20 mTorr) and further the oxygen gas flow rate is set to 150 SCCM.

The data of Series 5 represents the relationship between the oxidation time and oxide film thickness for the case the ultraviolet radiation power is set to 20% of the reference power, the process pressure is set to 2.66 Pa (20 mTorr) and the oxygen gas flow rate is set to 150 SCCM, while the data of Series 6 represents the relationship between the oxidation time and oxide film thickness for the case the ultraviolet radiation power is set to 20% of the reference power, the process pressure is set to about 67 Pa (0.5 Torr) and further the oxygen gas flow rate is set to 0.5 SLM.

Further, the data of Series 7 represents the relationship between the oxidation time and oxide film thickness for the case the ultraviolet radiation power is set to 20% of the reference power, the process pressure is set to 665 Pa (5 Torr) and the oxygen gas flow rate is set to 2 SLM, while the data of Series 8 represents the relationship between the oxidation time and oxide film thickness for the case the ultraviolet radiation power is set to 5% of the reference power, the process pressure is set to 2.66 Pa (20 mTorr) and the oxygen gas flow rate is set to 150 SCCM.

In the experiment of FIG. 5, the thickness of the oxide film is obtained by an XPS analysis, in view of the fact that there is no standard process of obtaining the thickness of such an extremely thin oxide film having a film thickness less than 1 nm.

Figure 6:
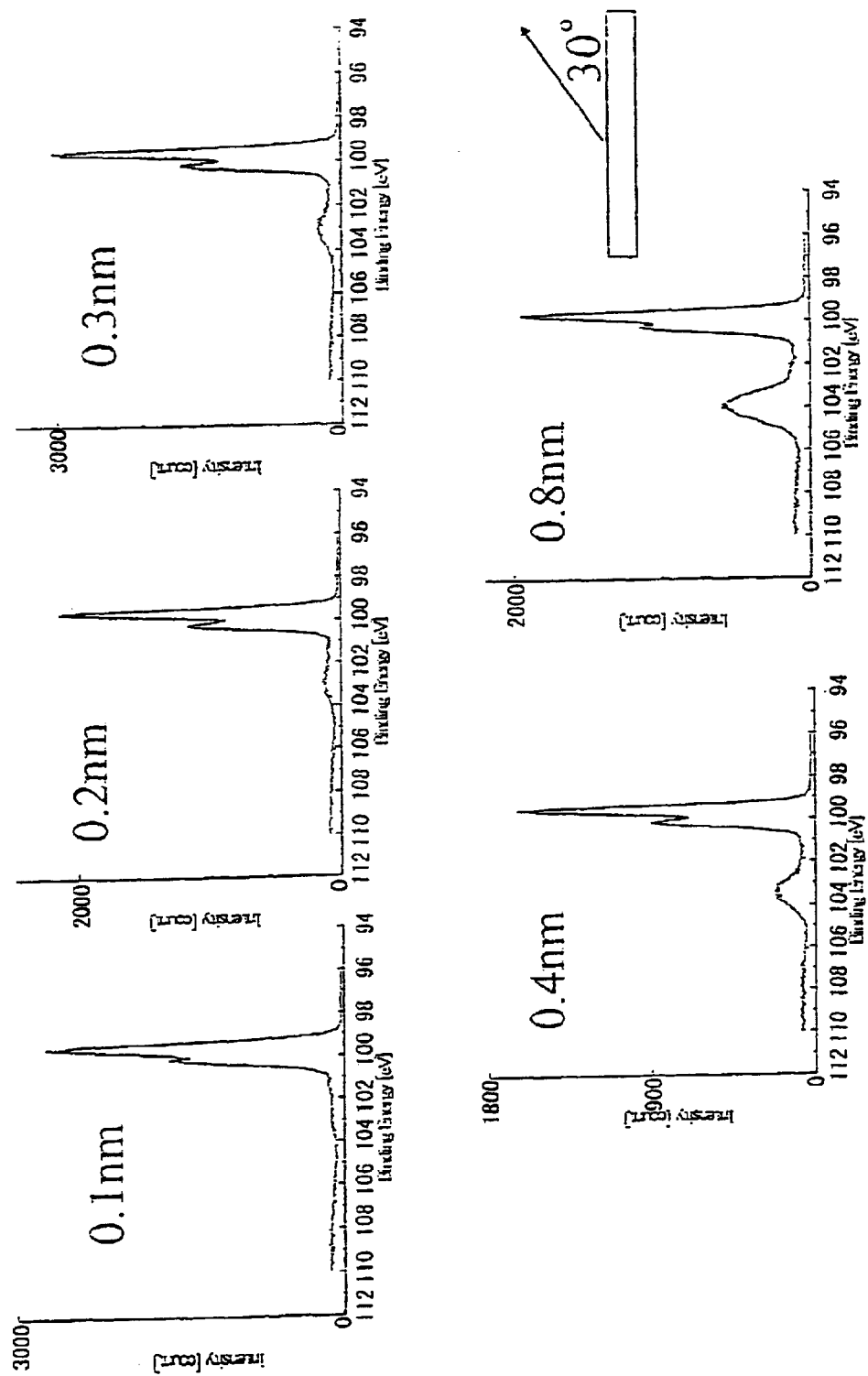
FIG. 6 is a diagram explaining the procedure of measuring the film thickness by an XPS analysis as used in the present invention.
Figure 7:
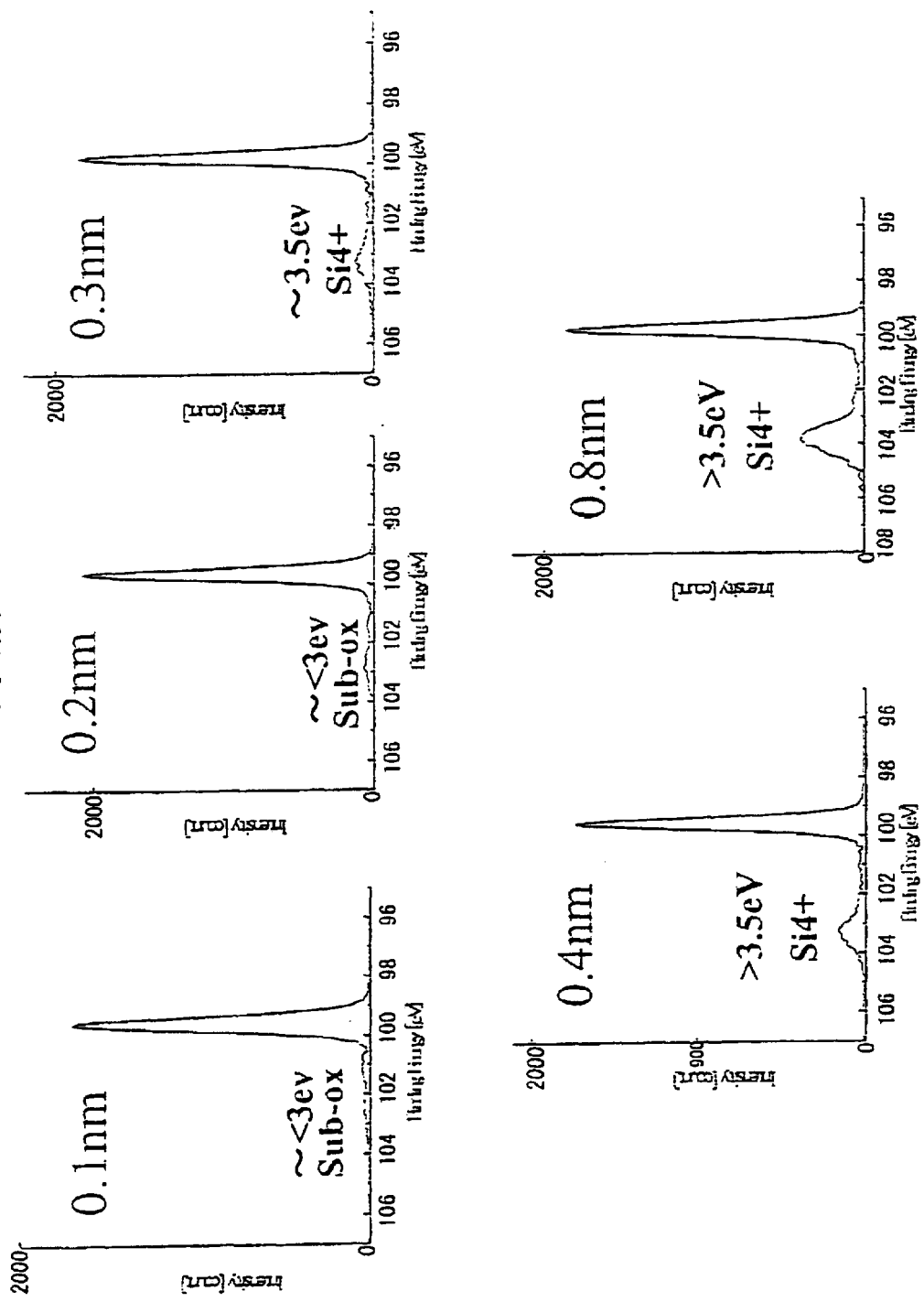
FIG. 7 is another diagram explaining the procedure of measuring the film thickness by an XPS analysis as used in the present invention.

In view of the situation noted above, the inventor of the present invention obtained a film thickness d of an oxide film by first obtaining a $Si_{2p}{}^{3/2}$ XPS spectrum shown in FIG. 7 by applying, to an observed XPS spectrum of $Si_{2p}$ orbital shown in FIG. 6, a background correction and separation correction for separating the 3/2 spin state and the 1/2 spin state, and then obtaining the film thickness d from the $Si_{2p}^{3/2}$ XPS spectrum thus obtained by using Equation (1) and associated coefficients below according to the teaching of Lu et al (Z. H. Lu, et al., Appl. Phys. Lett. 71(1997), pp.2764), $$d=\lambda \sin \alpha \cdot ln[I^{X+}/(\beta I^{0+})+1] \quad (1)$$

$\lambda$=2.96

$\beta$=0.75

In Eq. (1), it should be noted that $\alpha$ represents the detection angle of the XPS spectrum of FIG. 6 and is set to 30° in the illustrated example. Further, $I^{X+}$ in Eq. (1) represents an integral spectrum intensity ($I^{1+}+I^{2+}+I^{3+}+I^{4+}$) of the oxide film and corresponds to the peak observed in the energy region of 102–104 eV of FIG. 7. On the other hand, $I^{0+}$ corresponds to the integral spectral peak intensity corresponding to the energy region around 100 eV, wherein this spectral peak is caused by the silicon substrate.

Figure 8:
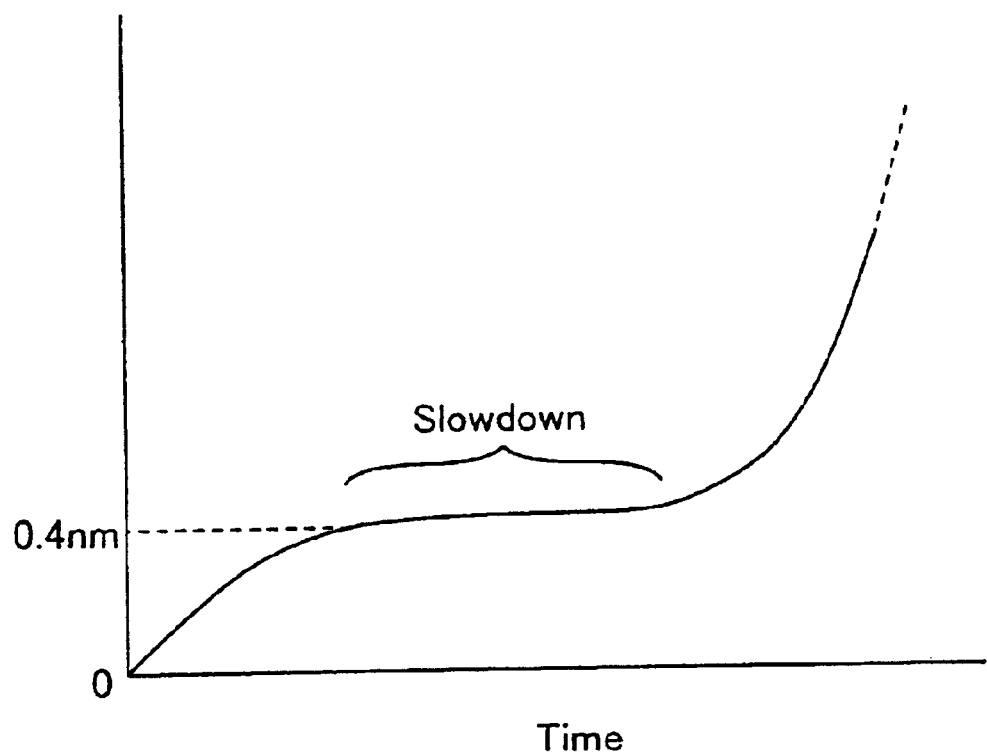
FIG. 8 is a diagram schematically showing the phenomenon of delay of oxide film growth observed when forming an oxide film by the substrate processing apparatus of FIG. 3.

Referring to FIG. 5 again, it will be noted that the oxide film thickness increases gradually from the initial thickness of 0 nm with the oxidation time for the case the ultraviolet radiation power, and hence the oxygen radical density formed by the ultraviolet radiation, is set small (Series 1, 2, 3, and 8). In the case of Series 4, 5, 6 and 7, in which the ultraviolet radiation power is set to 20% or more of the reference power, on the other hand, it can be seen that there appears a slowdown of oxide film growth after the start of the growth and when the oxide film has reached a thickness of about 0.4 nm as represented in FIG. 8. The growth of the oxide film is restarted only after a certain time has elapsed in the slowdown state.

The relationship of FIG. 5 or 8 means that there is a possibility of forming an extremely thin oxide film of the thickness of about 0.4 nm stably in the oxidation process of a silicon substrate surface. Further, the fact that the slowdown state continues for some time as represented in FIG. 5 indicates that the oxide film thus formed has a uniform thickness. Thus, according to the present invention, it is possible to form an oxide film having a thickness of about 0.4 nm on a silicon substrate with uniform thickness.

FIGS. 9A and 9B schematically depicts the manner of oxide film formation on such a silicon substrate. In these drawings, it should be noted that the structure formed on a (100) silicon substrate is very much simplified.

Referring to FIG. 9A, it can be seen that two oxygen atoms are bonded to a single silicon atom at the surface of the silicon substrate, and thus, there is formed a single oxygen atomic layer. In this representative state, each silicon atom on the substrate surface are coordinated by two silicon atoms inside the substrate and two oxygen atoms at the substrate surface, and there is formed a sub-oxide.

In the state of FIG. 9B, on the other hand, each silicon atom at the uppermost part of the silicon substrate is coordinated with four oxygen atoms and takes the stable state of $Si^{4+}$. It is believed that this is the reason the oxidation proceeds fast in the state of FIG. 9A and slows down when the state of FIG. 9B has appeared. The thickness of the oxide film for the state of FIG. 9B is about 0.4 nm, while this value is in good agreement with the oxide film thickness observed for the slowdown state in FIG. 5.

In the XPS spectrum of FIG. 7, it should be noted that the weak peak observed in the energy range of 101–104 eV for the case the oxide film thickness is 0.1 or 0.2 nm corresponds to the sub-oxide of FIG. 9 A. On the other hand, the peak appearing in this energy range for the case the oxide thickness has exceeded 0.3 nm is thought as being caused by Si4+ and indicating the formation of an oxide film exceeding the thickness of 1 atomic layer.

Figure 74B:
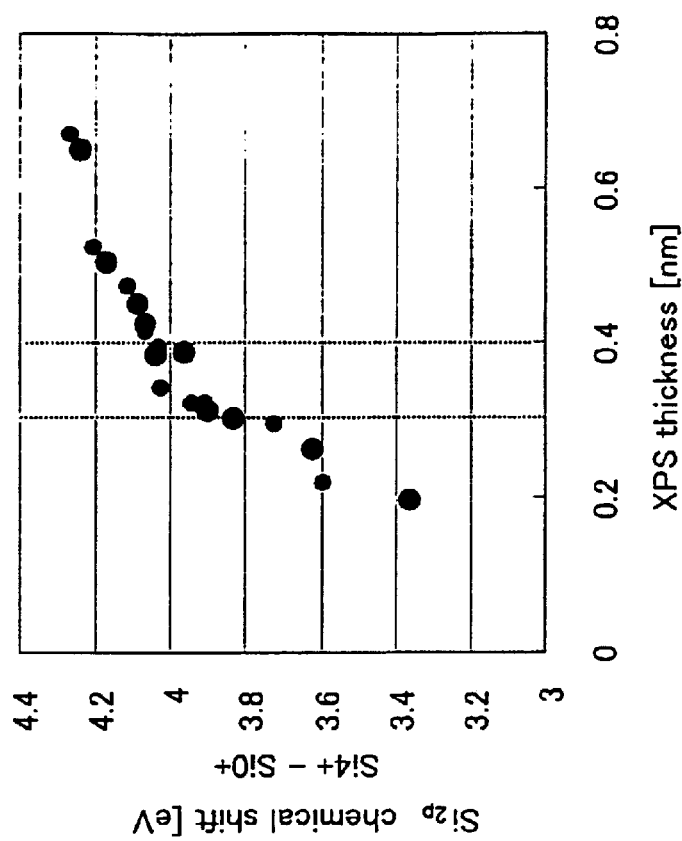
FIGS. 74A and 74B are diagrams respectively showing an XPS spectrum of a silicon oxide film and the relationship between the chemical shift of the XPS spectrum and the film thickness.
Figure 74A:
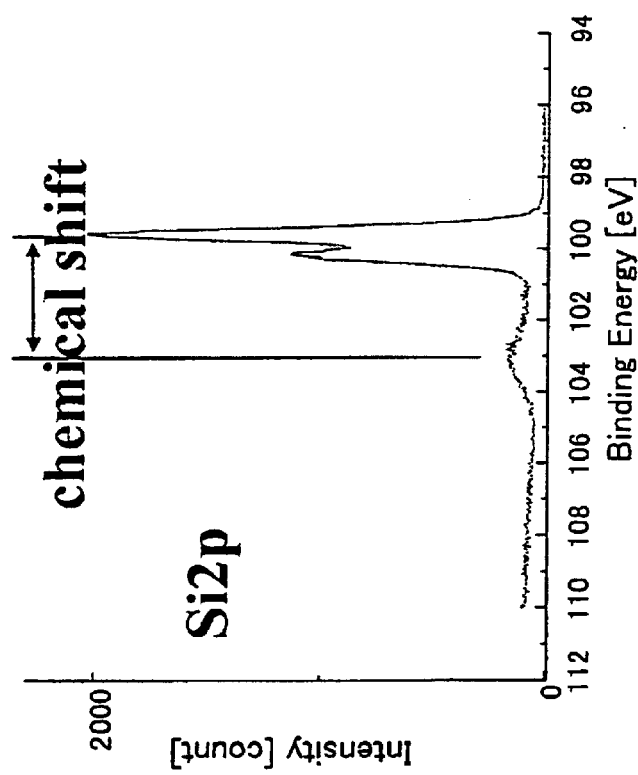

FIG. 74A shows a raw XPS spectrum of a silicon oxide film formed on a silicon substrate and a chemical shift caused in the XPS spectrum, while FIG. 74B shows the relationship between the XPS film thickness of the silicon oxide film, in other words the film thickness obtained by the XPS analysis and the chemical shift of FIG. 74A.

Referring to FIGS. 74A and 74B, it can be seen that the magnitude of the chemical shift increases with increasing XPS film thickness, while it can also be seen that the chemical shift reaches the value of 4 eV, which is inherent to a silicon oxide film, when the XPS film thickness has reached the value between 0.3 nm and 0.4 nm. Further, it is noted that there appears saturation in the chemical shift at the point when the XPS film thickness has reached the value between 0.3 nm and 0.4 nm. As explained before, the thickness of such an extremely thin oxide film may change when the measurement apparatus is changed or when the value of the constants $\lambda$ and $\beta$ used in the equation (1) noted before is changed. In view of this, it is also possible to define the 0.4 nm thickness explained heretofore in the present invention as being the minimum slowdown film thickness (the film thickness in which the slowdown of film growth is observed) that provides the chemical shift of about 4 eV for the oxide film.

Such a slowdown of oxide film growth at the thickness of 0.4 nm is thought as not being limited to the UV-$O_2$ radical oxidation process explained with reference to FIGS. 4A and 4B. Rather, this phenomenon would be observed also in any oxide film formation process as long as it is capable of forming extremely thin oxide films with high precision.

By continuing the oxidation process further from the state of FIG. 9B, the thickness of the oxide film starts to increase again.

Figure 10:
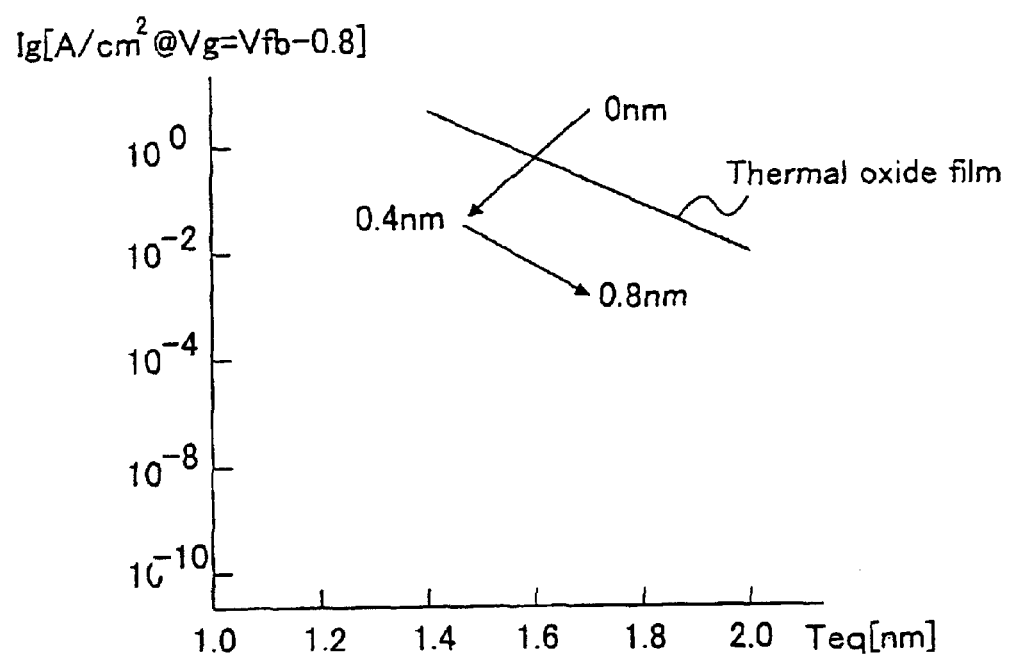
FIG. 10 is a diagram showing the leakage current characteristics of an oxide film obtained in the first embodiment of the present invention.

FIG. 10 shows the relationship between a thermal-oxide equivalent thickness Teq and leakage current Ig for a laminated structure in which a ZrSiOx film having a thickness of 0.4 nm and an electrode film are formed on an oxide film formed by the UV-$O_2$ oxidation process of FIGS. 4A and 4B (reference should be made to FIG. 11B to be explained later) by using the substrate processing apparatus of FIG. 3. It should be noted that the leakage current characteristics of FIG. 10 are measured in the state a voltage of Vfb–0.8V is applied across the electrode film and the silicon substrate, wherein Vfb is a flat-band voltage used for the reference. For the sake of comparison, FIG. 10 also shows the leakage current characteristics of a thermal oxide film. Further, the illustrated equivalent thickness is for the structure including both the oxide film and the ZrSiOx film.

Referring to FIG. 10, it can be seen that the leakage current density exceeds the leakage current density of the thermal oxide film in the case the oxide film is omitted and hence the film thickness of the oxide film is 0 nm. Further, it can be seen that the thermal-oxide film equivalent thickness Teq also takes a large value of about 1.7 nm.

Figure 11A:
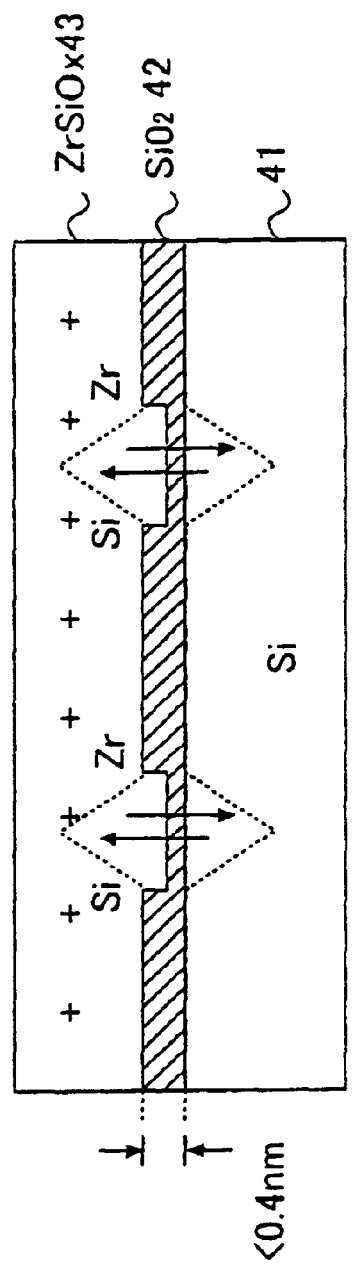
FIGS. 11A and 11B are diagrams explaining the cause of the leakage current characteristics of FIG. 10.
Figure 11B:
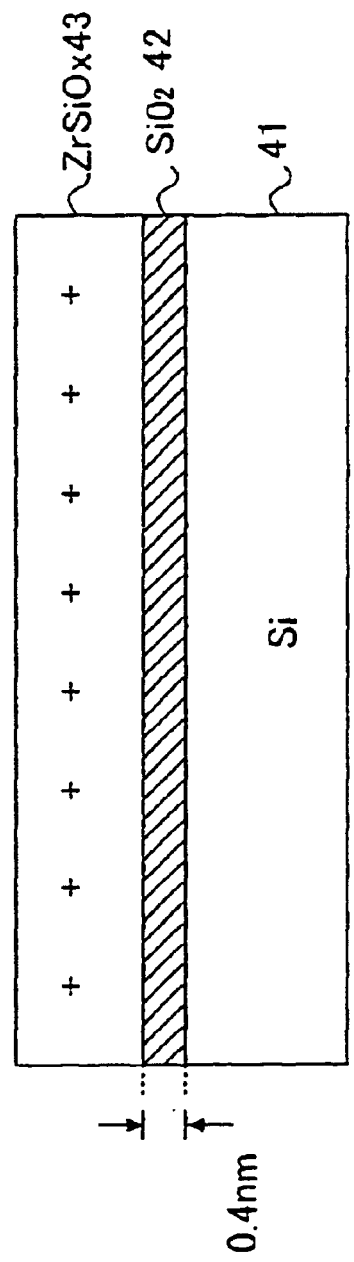

Contrary to this, it can be seen that the thermal-oxide equivalent thickness Teq starts to decrease when the thickness of the oxide film is increased from 0 nm to 0.4 nm. In such a state, the oxide film is interposed between the silicon substrate and the ZrSiOx film, and thus, there should be caused an increase of physical thickness. The observed decrease of the equivalent thickness Teq is therefore contrary to this increase of physical thickness. This observation suggests the situation that, in the case the ZrSiOx film is formed directly on the silicon substrate, there occurs extensive diffusion of Zr into the silicon substrate or Si into the ZrSiOx film as represented in FIG. 11A, leading to formation of a thick interface layer between the silicon substrate and the ZrSiOx film. By interposing the oxide film of 0.4 nm thickness as represented in FIG. 11B, it is believed that the formation of such an interface layer is effectively suppressed and the decrease of the equivalent film thickness is achieved as a result. With this, the leakage current is reduced with increasing thickness of the oxide film. It should be noted that FIGS. 11A and 11B shows a schematic cross-section of the specimen thus formed and shows the structure in which an oxide film 42 is formed on a silicon substrate 41 and a ZrSiOx film 43 is formed on the oxide film 42.

When the thickness of the oxide film has exceeded 0.4 nm, on the other hand, the value of the thermal-oxide equivalent thickness starts to increase again. In this region in which the thickness of the oxide film has exceeded 0.4 nm, it can be seen that the value of the leakage current is decreased with increase of the thickness, suggesting that the increase of the equivalent thickness is caused as a result of increase of the physical thickness of the oxide film.

Thus, it can be seen that the oxide film thickness of about 0.4 nm, in which there is caused slowdown of oxide film growth as observed in FIG. 5, corresponds to the minimum of the equivalent thickness of the system formed of the oxide film and high-K dielectric film, and that the diffusion of metal element such as Zr into the silicon substrate is effectively blocked by the stable oxide film shown in FIG. 9B. Further, it can be seen that the effect of blocking the metal element diffusion is not enhanced significantly even when the thickness of the oxide film is increased further.

It should be noted that the value of the leakage current for the case of using the oxide film of the foregoing 0.4 nm thickness is smaller than the leakage current of a thermal oxide film having a corresponding thickness by the order of two. Thus, by using an insulation film having such a structure for the gate insulation film of a MOS transistor, it becomes possible to minimize the gate leakage current.

Figure 12A:
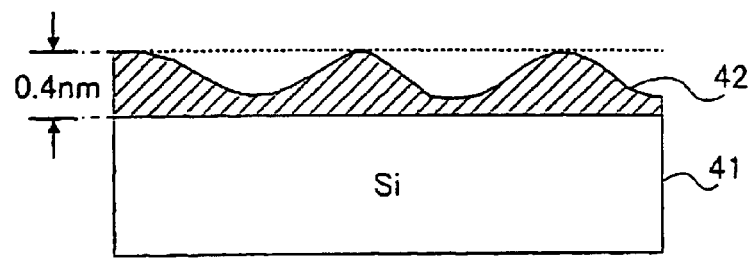
FIGS. 12A–12C are diagrams showing the process of oxide film formation taking place in the substrate processing apparatus of FIG. 3.
Figure 12B:
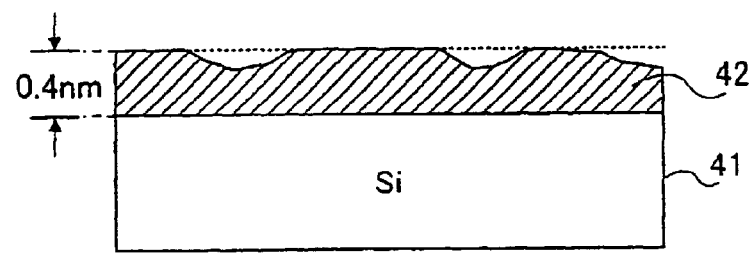
Figure 12C:
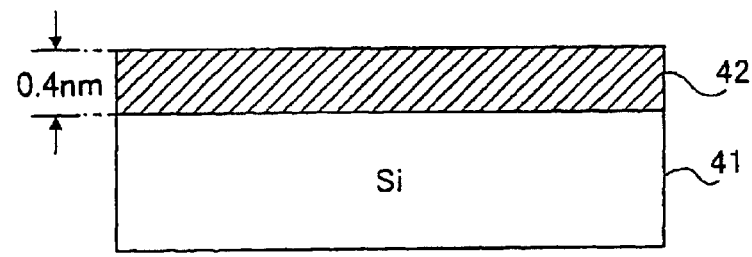

As a result of slowdown of the oxide film growth at the thickness of 0.4 nm explained with reference to FIG. 5 or FIG. 8, there occurs a slowdown of film thickness at the time of oxide film growth at the thickness of about 0.4 nm as represented in FIG. 12B even in the case there exists a change of film thickness or undulation in the initial oxide film 42 formed on the silicon substrate 41. Thus, by continuing the oxide film growth during the slowdown period, it becomes possible to obtain an extremely flat oxide film 42 of uniform film thickness as represented in FIG. 12C.

As explained before, there is no standard measuring method of film thickness for such an extremely thin oxide film at the moment. Thus, a different value may be obtained for the film thickness of the oxide film 42 of FIG. 12C when a different measuring method is used. However, because of the reason explained before, it is determined that the slowdown of oxide film growth occurs at the thickness of two atomic layers. Thus, it is thought that the preferable thickness of the oxide film 42 is about two atomic layers. It should be noted that this preferable thickness includes also the case in which the oxide film 42 includes a region of 3 atomic layers in a part thereof such that the thickness of two atomic layers is maintained for the entirety of the oxide film 42. Thus, it is concluded that the preferable thickness of the oxide film 42 is in the range of 2–3 atomic layers.

Remote Plasma Radical Nitridation (RF-$N_2$) Processing

Figure 13:
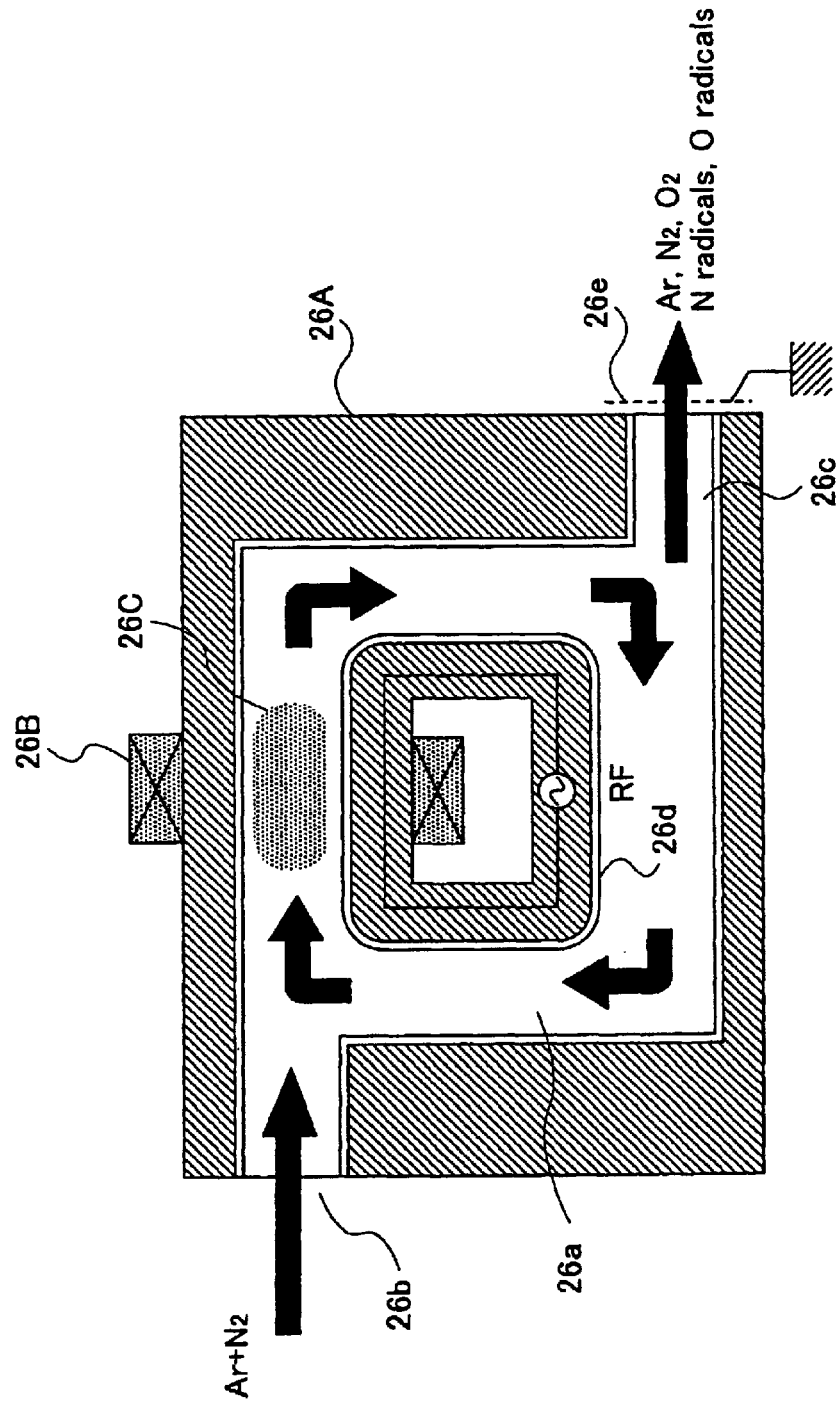
FIG. 13 is a diagram showing the construction of a remote plasma source used in the substrate processing apparatus of FIG. 3.
Figure 15:
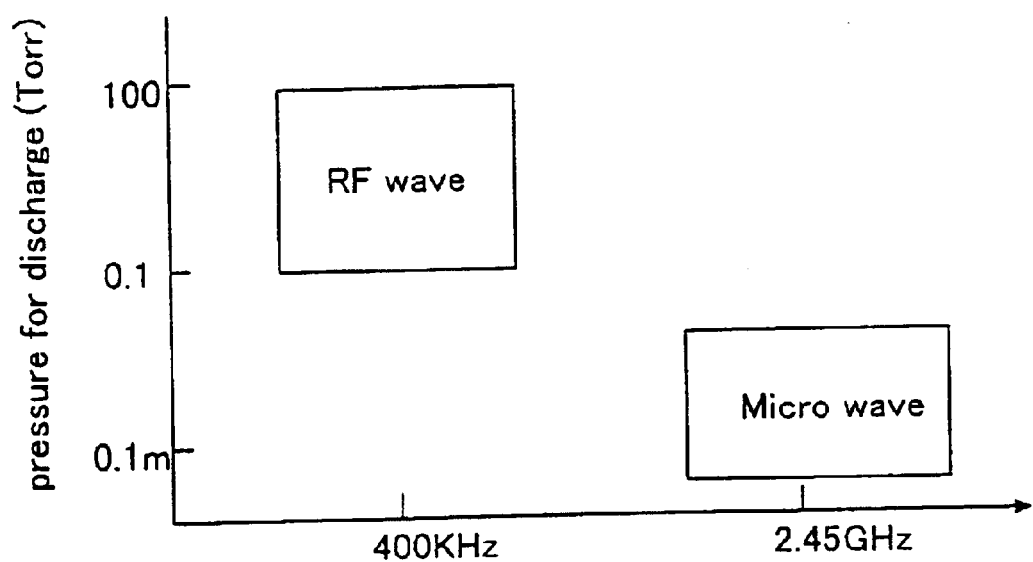
FIG. 15 is another diagram comparing the characteristics of RF remote plasma and microwave plasma.

FIG. 13 shows the construction of a remote plasma source 26 used in the substrate processing apparatus 20 of FIG. 3.

Referring to FIG. 13, the remote plasma source 26 includes a block 26A typically formed of aluminum in which a gas circulating passage 26a is formed together with a gas inlet 26b and a gas outlet 26c communicating therewith. Further, there is formed a ferrite core 26B on a part of the block 26A.

Further, there is provided a fluorocarbon resin coating 26d on the inner surfaces of the gas circulating passage 26a, gas inlet 26b and the gas outlet 26c, and plasma 26C is formed in the gas circulating passage 26a by supplying a high-frequency (RF) power 400kHz perpendicular to the coil wound around the ferrite core 26B.

With the excitation of the plasma 26C, nitrogen radicals and also nitrogen ions are formed in the gas circulating passage 26a, wherein the nitrogen ions thus formed have a strong tendency of proceeding straight and are annihilated as they are circulated along the circulating passage 26a and the gas outlet 26c ejects nitrogen radicals $N_2$* primarily. In the construction of FIG. 13, charged particles such as nitrogen ions are eliminated in the construction of FIG. 13 by providing an ion filter 26e at the gas outlet 26c in the state that the ion filter 26e is connected to the ground. Thereby, only the nitrogen radicals are supplied to the process space 21B. Even in the case the ion filter 26e is not grounded, the ion filter 26e functions as a diffusion plate and it becomes possible to eliminate charged particles such as nitrogen ions sufficiently. In the case of conducting a process that requires a large amount of $N_2$ radicals, it is possible to eliminate the ion filter 26e so as to prevent annihilation of the $N_2$ radicals caused by collision at the ion filter 26e.

FIG. 14A shows the relationship between the number of ions and the electron energy formed by the remote plasma source 26 of FIG. 13 in comparison with the case of using a standard plasma source shown in FIG. 14B and a standard microwave plasma source shown in FIG. 14C.

Referring to FIG. 14A, ionization of nitrogen molecules is facilitated in the case the plasma is excited by a microwave power, and as a result, there are formed a very large amount of nitrogen ions. In the case the plasma is excited by a high-frequency (RF) power of 500 kHz or less, on the other hand, the number of the nitrogen ions formed by the plasma is reduced significantly.

In the case of using the high-frequency plasma, there is a tendency that the plasma contains relatively large proportion of ions having large electron energy and that such ions may cause damaging in the substrate. In the construction of FIG. 13, on the other hand, the nitrogen ions having the strong tendency of proceeding straight are effectively annihilated in the gas circulating passage 26a, and it becomes possible to introduce the $N_2$ radicals selectively into the processing vessel.

As noted above, FIGS. 14B and 14C show the construction of a standard high frequency plasma source and a standard microwave plasma source, respectively.

Referring to FIG. 14B, a process gas is introduced into a plasma chamber 426 covered with a quartz liner 426d from a gas inlet 426b provided above, and plasma 426C is excited in the plasma chamber 426D by exciting the plasma gas by a high-frequency power.

The nitrogen ions and the nitrogen radicals formed with the plasma 426 are then introduced into a processing chamber provided below the plasma source, and plasma nitridation is conducted in the plasma chamber. In the plasma source of such a construction, however, it is difficult to remove the nitrogen ions, which tend to proceed straight, completely even in the case a trap 426c is provided.

The same situation holds also in the case of the microwave plasma source of FIG. 14C. Only difference is that a microwave is used for exciting the plasma. Thus, it is difficult to remove the nitrogen ions, which tend to proceed straight, from the radicals, even in the case a trap is provided.

Thus, by using the radical source shown in FIG. 13, an ion distribution shown in FIG. 14A by a dotted line is obtained, and it becomes possible to conduct an ideal remote plasma nitridation processing with minimum amount of ions.

In the case the plasma processing is conducted by using a microwave, a high vacuum environment of $1.33 \times 10^{-3}$–$1.33 \times 10^{-6}$ Pa ($10^{-1}$–$10^{-4}$ Torr) is needed, while in the case the plasma processing is conducted by using a high-frequency plasma, it is possible to conduct the process at a relatively high pressure of 13.3 Pa–1.33 kPa (0.1–10 Torr).

Next, consideration will be made on the plasma excitation frequency and process pressure suitable for the remote plasma processing.

Figure 72:
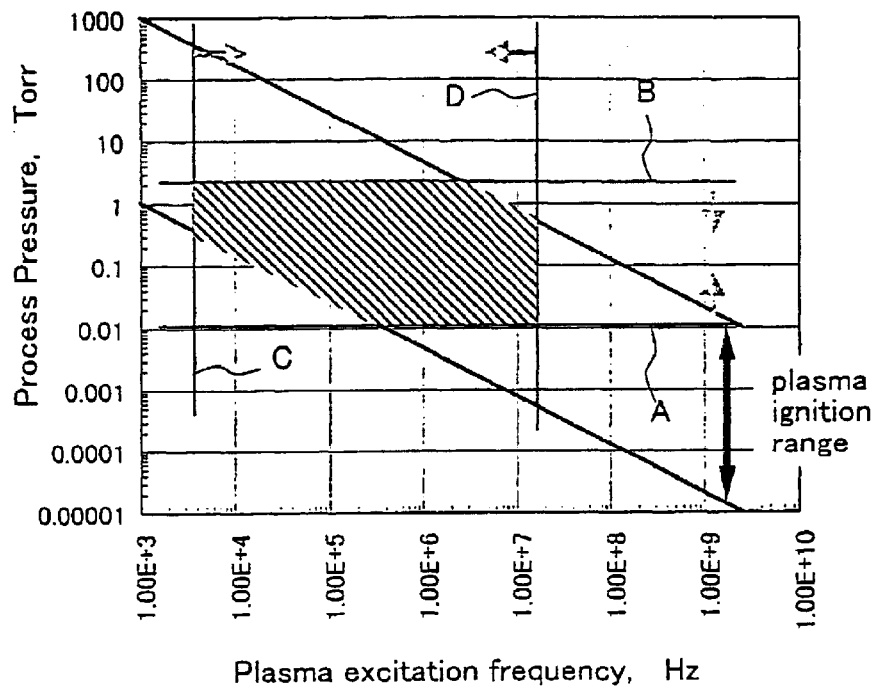
FIG. 72 is a diagram showing a preferred condition of RF-$N_2$ processing according to the first embodiment of the present invention.

FIG. 72 shows the relationship between the plasma excitation frequency and the pressure interval in which ignition of plasma is possible.

Referring to FIG. 72, it can be seen that the pressure range allowing plasma ignition changes with the plasma excitation frequency. In the case the plasma excitation frequency of 400 kHz, the plasma ignition takes place in the pressure range of 1.33 Pa–1.33 kPa (0.001–10 Torr). In the case the plasma excitation frequency is 2.45 GHz, the plasma ignition takes place in the pressure range of 13.3 mPa–1.33 kPa (0.1 mTorr–0.01 Torr).

Here, consideration will be made on the preferable pressure. When the process pressure is too low, the nitrogen radicals introduced in the processing vessel would cause diffusion and there would appear a non-uniform nitridation processing in which only the marginal part of the substrate, which is located close to the radical source, undergoes nitridation, even in the case the substrate W is rotated in the substrate processing apparatus 20 of FIG. 3. Thus, in order to achieve a uniform nitridation processing in the substrate processing apparatus 20 of FIG. 3 by using the remote radical source 26 of FIG. 13, there is a need that the flow of the radicals can be controlled to some extent. For this, it is necessary to control the process pressure in the processing vessel 21 to be a pressure of 0.01 Torr (1.33 Pa) as shown by a line A in FIG. 72. When the process pressure is to high in the processing vessel 21, on the other hand, the nitrogen radicals would be annihilated by causing collision. Thus, it is necessary to control the process pressure in the processing vessel 21 to the value of 3 Torr (399 Pa) or less as represented by a line B in FIG. 72.

Next, consideration will be made on the preferable plasma excitation frequency. In the case the plasma excitation frequency becomes less than 4 kHz shown by a line C, there is caused acceleration of ions and there arises a problem that high energy ions cause damaging in the substrate. In the case the plasma excitation frequency exceeds 13.56 MHz represented in FIG. 72 by a line D, on the other hand, it becomes difficult to conduct the plasma processing with large flow rate. Thus, it is preferable to set the plasma excitation frequency not exceeding 13.56 MHz.

In summary, it is preferable to set the process pressure and the frequency in the hatched area of FIG. 72 defined by the lines A–D in the case a radical nitridation processing is to be conducted by the substrate processing apparatus 20 of FIG. 3 while using the radical source 26 of FIG. 13. In the present invention, a frequency of about 400 kHz is used as a representative frequency, while this representation means that the foregoing range is included. In the range of 40 kHz–4 MHz, substantially the same plasma processing is realized.

Table 1 below compares the ionization energy conversion efficiency, pressure range capable of causing electric discharge, plasma power consumption and process gas flow rate between the case of exciting plasma by a microwave and the case of exciting plasma by a high-frequency (RF) power.

TABLE 1

|  | ionization energy conversion efficiency | pressure range causing electric discharge | plasma power consumption | process gas flow rate |
| --- | --- | --- | --- | --- |
| microwave | $1.00 \times 10^{-2}$ | 0.1 m–0.1 Torr | 1–500 W | 0–100 SCCM |
| RF-wave | $1.00 \times 10^{-7}$ | 0.1–100 Torr | 1–10 kW | 0.1–10 SLM |

Referring to Table 1, it can be seen that the ionization energy conversion efficiency is reduced to about $1 \times 10^{-7}$ in the case of the RF-excited plasma as compared with respect to the value of about $1 \times 10^{-2}$ for the case of the microwave-excited plasma. Further, it can be seen that the pressure range causing the electric discharge is about 0.1–100 Torr (13.3 Pa–13.3 kPa) for the case of the RF-excited plasma, while in the case of the microwave-excited plasma, the pressure range is about 0.1 mTorr–0.1 Torr (13.3 Pa–13.3 kPa). Associated with this, the plasma power consumption is increased in the case of the RF-excited plasma as compared with the case of the microwave-excited plasma and that the process gas flow rate for the case of the RF-plasma processing becomes much larger than the process gas flow rate for the case of the microwave plasma.

In the substrate processing apparatus of FIG. 3, it should be noted that the nitridation processing of the oxide film is conducted not by nitrogen ions but by the nitrogen radicals $N_2^*$. Thus, it is preferable that the number of the excited nitrogen ions is suppresses as small as possible. This is also preferable in the viewpoint of minimizing damages caused in the substrate. In the substrate processing apparatus of FIG. 3, the number of the excited nitrogen radicals is small and is highly suitable for nitriding the extremely thin base oxide film formed underneath the high-K dielectric gate insulation film with the thickness of only 2–3 atomic layers. Hereinafter, such a nitridation processing of oxide film conducted by the nitrogen radicals exited by the high-frequency plasma is called RF-$N_2$ processing.

As explained before, it is possible to introduce the process gas with large flow rate in the substrate processing apparatus 20 of FIG. 3 by using the remote plasma radical source 26 of FIG. 13. Thus, in such an RF-$N_2$ processing, it becomes possible to conduct a uniform nitridation processing such that a uniform nitrogen concentration distribution is realized on the substrate surface.

In the case the process gas flow rate is increased, on the other hand, the region where the nitridation takes place is limited to the area near the central axis of the substrate that connects the plasma source 26 and the evacuation port 21A of FIG. 3, contrary to the case of using a small process gas flow rate. Thus, by controlling the process gas flow rate, which represents the total of the Ar gas flow rate and the nitrogen gas flow rate, it is possible to adjust the extension of the region where the nitridation reaction takes place in the direction toward the evacuation port 21A. Thus, by optimizing the foregoing extension and rotating the substrate W, it becomes possible to improve the uniformity of the nitrogen concentration on the substrate surface. In the construction of FIG. 3, it is also possible that the admixing of the Ar gas to the nitrogen gas provides the effect of prolonging the lifetime of the nitrogen radicals. Thus, there is also a possibility that the admixing of the Ar gas is contributing to the improvement of the in-plane uniformity in the RF-$N_2$ processing of the present invention.

In the nitridation processing that uses the microwave plasma, on the other hand, there is also a possibility that an in-plane uniformity comparable to the in-plane uniformity achieved by the remote-plasma nitridation processing is attained in the event the nitridation processing can be achieved under the condition of large gas flow rate.

Figure 16A:
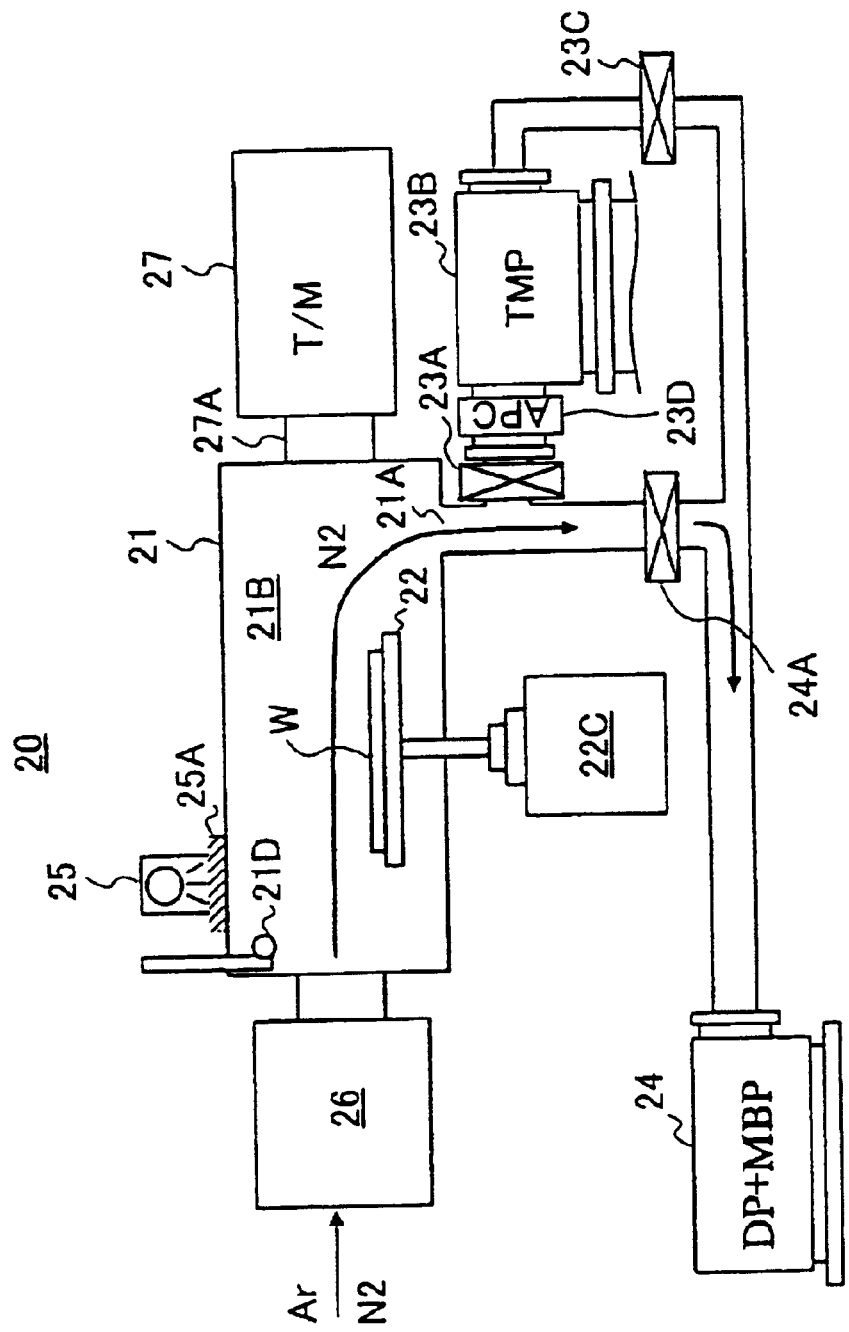
FIGS. 16A and 16B are diagrams showing the nitridation process of an oxide film conducted by the substrate processing apparatus of FIG. 3 respectively in a side view and a plan view.

FIGS. 16A and 156B show the radical nitridation (RF-$N_2$) processing conducted by the substrate processing apparatus 20 of FIG. 3 respectively in a side view and a plan view.

Figure 16B:
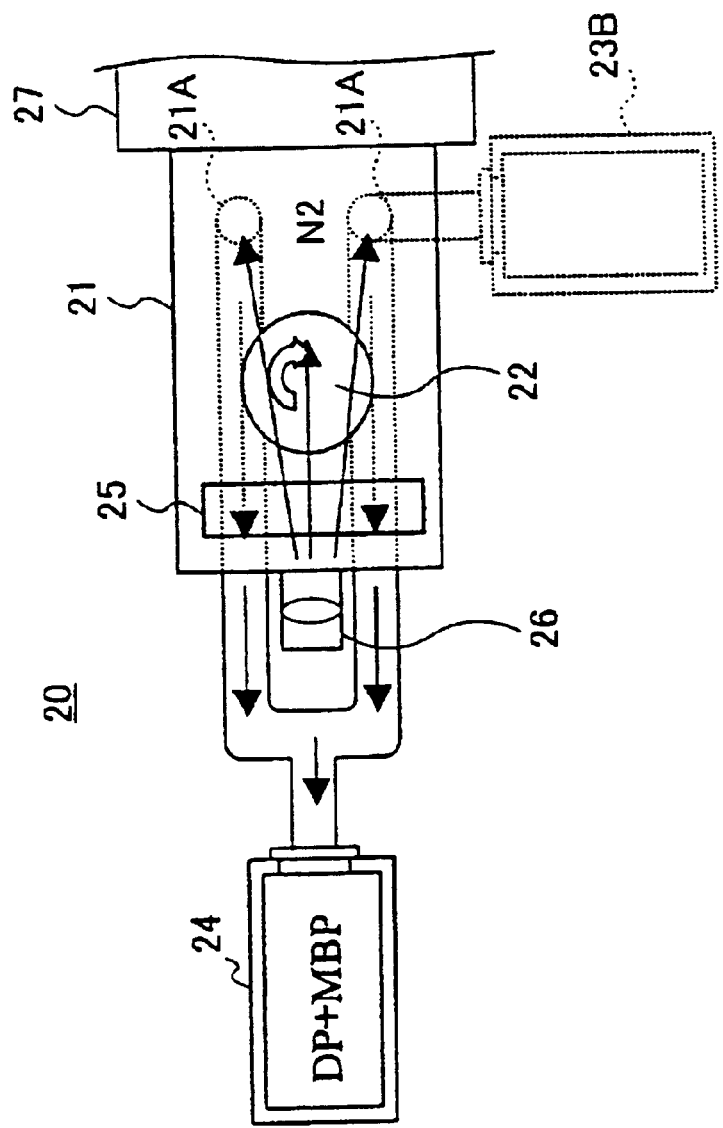

Referring to FIGS. 16A and 16B, the remote plasma radical source 26 is supplied with an Ar gas and a nitrogen gas and nitrogen radicals are formed as a result of excitation of plasma with the high frequency power of several hundred kilohertz frequency. The nitrogen radicals thus formed are caused to flow along the surface of the substrate W and are evacuated via the evacuation port 21A and the pump 24. As a result, the process space 21B is held at a process pressure in the range of 1.33 Pa–1.33 kPa (0.01–10 Torr) suitable for the radical nitridation of the substrate W. Particularly, use of the pressure range of 6.65–133 Pa (0.05–1.0 Torr) is preferable. The nitrogen radicals thus formed cause nitridation in the surface of the substrate W as they are caused to flow along the surface of the substrate W.

In the nitridation process of FIGS. 16A and 16B, it should be noted that there is conducted a purging process in advance to the nitridation process by opening the valves 23A and 23C and closing the valve 24A. Thereby, the pressure in the process space 21B is reduced to the level of $1.33 \times 10^{-1}$–$1.33 \times 10^{-4}$ Pa, and any residual oxygen or water in the process space is purged. In the nitridation processing that follows, on the other hand, the valves 23A and 23C are closed, and thus, the turbo molecular pump 23B is not included in the evacuation path of the process space 21B.

Thus, by using the substrate processing apparatus 20 of FIG. 3, it becomes possible to form an extremely thin oxide film on the surface of the substrate W and further nitriding the surface of the oxide film thus formed.

Figure 17A:
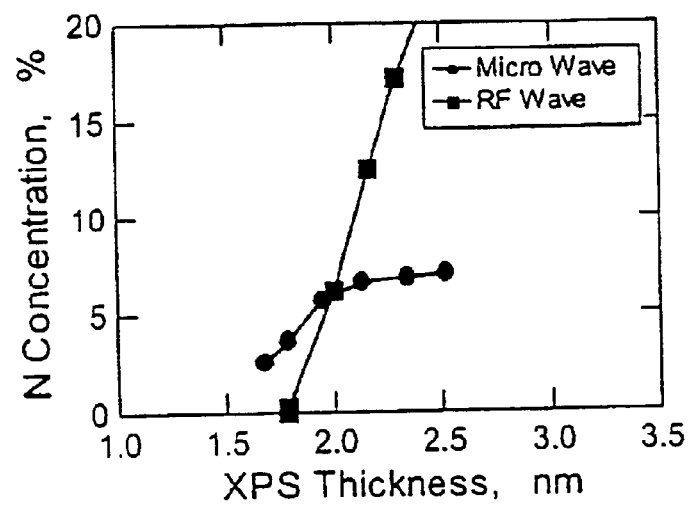
FIGS. 17A and 17B are diagrams comparing the relationship between nitrogen concentration and film thickness for an oxide film nitrided by using the RF remote plasma and an oxide film nitrided by using the microwave plasma.
Figure 17B:
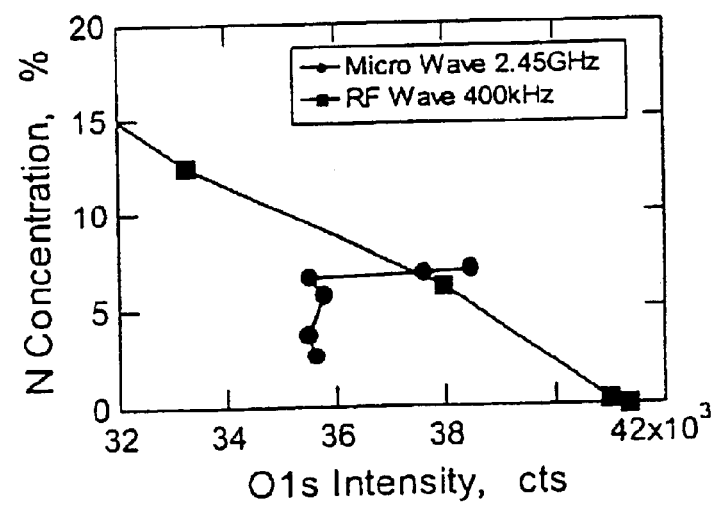

FIG. 17A shows the nitrogen concentration profile in an oxide film for the case the oxide film formed on a silicon substrate by a thermal oxidation process with a thickness of 2.0 nm is subjected to an RF-$N_2$ processing in the substrate processing apparatus 20 of FIG. 3 by using the RF remote plasma source 26 of FIG. 13 under the condition represented in Table 2. Further, FIG. 17B shows the relationship between the nitrogen concentration profile and the oxygen concentration profile in the same oxide film.

TABLE 2

|  | nitrogen flow rate | Ar flow rate | plasma power | pressure | temperature |
| --- | --- | --- | --- | --- | --- |
| microwave | 15 SCCM | — | 120 W | 8.6 mTorr | 500° C. |
| RF wave | 50 SCCM | 2 SLM | 2 kW | 1 Torr | 700° C. |

Referring to Table 2, the RF-$N_2$ processing is conducted in the substrate processing apparatus 20 under the pressure of 1 Torr (133 Pa) while supplying nitrogen with a flow rate of 50 SCCM and Ar with a flow rate of 2 SLM, wherein it should be noted that the internal pressure of the process space 21B is reduced once to the level of about $10^{-6}$ Torr ($1.33 \times 10^{-4}$ Pa) before the commencement of the nitridation process such that oxygen or water remaining in the process space 21B is purged sufficiently. Because of this, any residual oxygen in the process space 21B is diluted with Ar or nitrogen in the nitridation process (RF-$N_2$ process), which is conducted at the pressure of about 1 Torr. Thereby, the concentration of residual oxygen, and hence the thermodynamic activity of the residual oxygen, is very small at the time of the foregoing nitridation processing.

In the case of the nitridation processing conducted by the microwave plasma, on the other hand, the process pressure at the time of the nitridation process is generally the same as the purging pressure, and thus, residual oxygen maintains a large thermodynamic activity in the plasma ambient.

Referring to FIG. 17A, it can be seen that the concentration of nitrogen incorporated into the oxide film is limited in the case the nitridation processing is conducted by the microwave plasma and that no substantial nitridation takes place in the oxide film. In the case of the nitridation processing that uses the RF-excited plasma as in the case of the present embodiment, it can be seen that the nitrogen concentration level changes linearly with depth in the oxide film and that a concentration level of near 20% is achieved at the surface part of the oxide film.

Figure 18:
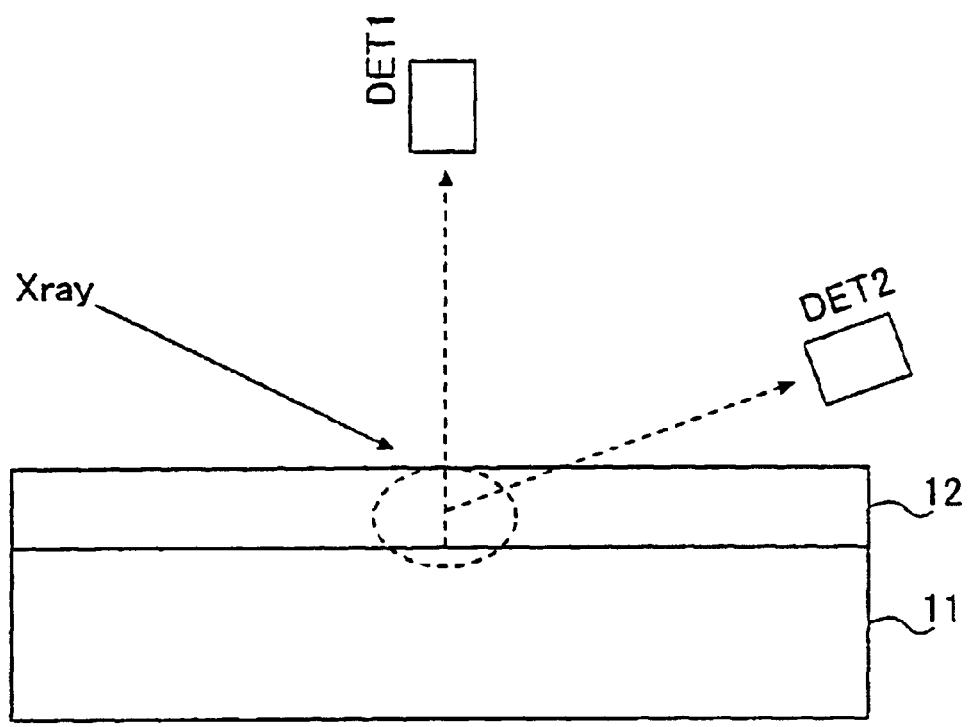
FIG. 18 is a diagram schematically showing the XPS analysis used in the present invention.

FIG. 18 shows the principle of the measurement of FIG. 17A conducted by the XPS (X-ray photo spectrometry) analysis.

Referring to FIG. 18, an X-ray is radiated to the specimen in which the oxide film 12 is formed on the silicon substrate 11 with a predetermined angle, and detectors DET1 and DET2 are used to detect the spectrum of the excited X-rays with various angles. Thereby, it should be noted that the detector DET1 set to a deep detection angle of 90 degrees detects the excited X-ray that has traveled through the oxide film 12 with minimum path length. Thus, the X-ray spectrum detected by the detector DET1 contains information about the deep part of the oxide film 12 with relatively large proportion. On the other hand, detector DET2 set to a shallow detection angle detects the X-ray traveled over a long distance in the oxide film 12. Thus, the detector DET2 mainly detects the information about surface part of the oxide film 12.

FIG. 17B shows the relationship between the nitrogen concentration and oxygen concentration in the oxide film. In FIG. 17B, it should be noted that the oxygen concentration is represented by the X-ray intensity corresponding to the O1s orbital.

Referring to FIG. 17B, it can be seen that there occurs decrease of oxygen concentration with increase of nitrogen concentration in the case the nitridation processing is conducted by the RF-$N_2$ processing that uses the RF-remote plasma, indicating that there occurs substitution of oxygen atoms with the nitrogen atoms in the oxide film. In the case the nitridation is conducted by the microwave plasma processing, on the other hand, no such substituting relationship is observed and no relationship of oxygen concentration decreasing with increasing nitrogen concentration is observed. In FIG. 17B, it is also noted that there is an increase of oxygen concentration for the case in which nitrogen is incorporated with 5–6% by the microwave nitridation processing. This indicates that there occurs increase of thickness of the oxide film with nitridation. Such an increase of the oxygen concentration associated with the microwave nitridation processing is believed to be caused as a result of the high activity of oxygen or water remaining in the process space, which in turn is caused as a result of use of high vacuum environment for the nitridation processing and absence of dilution of residual oxygen or water with Ar gas or nitrogen gas, unlike the case of the high-frequency remote radical nitridation processing.

Figure 19:
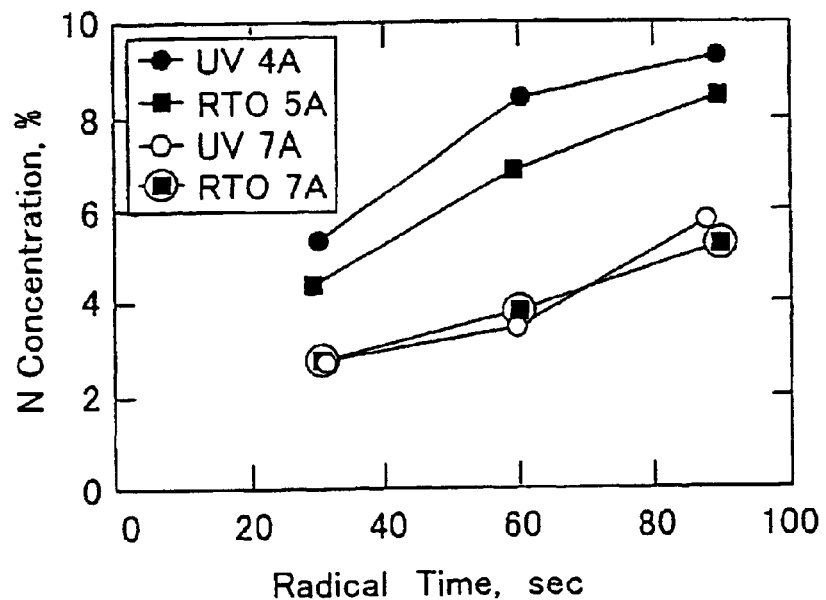
FIG. 19 is a diagram showing the relationship between the nitridation time and the nitrogen concentration in an oxide film for the case the oxide film is nitrided by the remote plasma.
Figure 20:
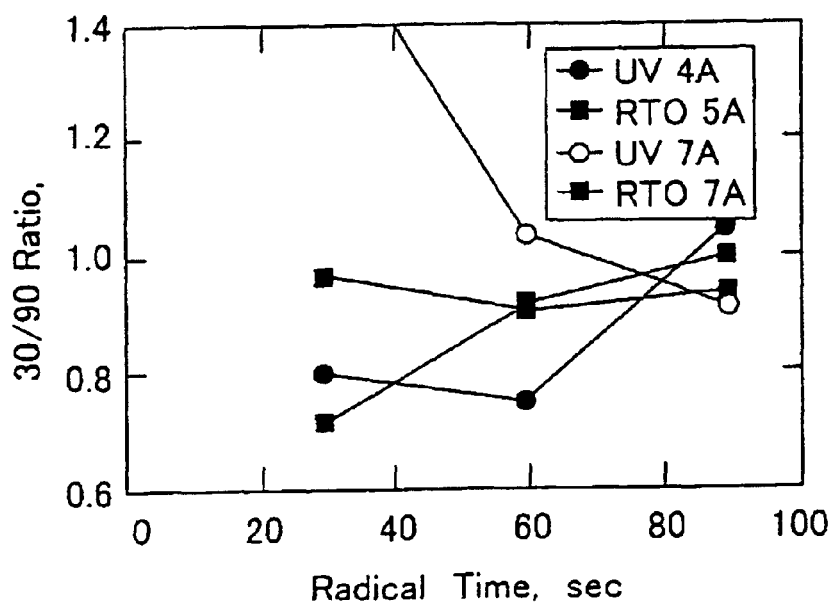
FIG. 20 is a diagram showing the relationship between the duration of nitridation and the distribution of nitrogen for the case an oxide film is subjected to a nitridation process.

FIG. 19 shows the relationship between the nitridation time and the nitrogen concentration in the film for the case an oxide film is formed by the substrate processing apparatus 20 of FIG. 3 to the thickness of 4 Å (0.4 nm) and 7 Å (0.7 nm) and nitridation is conducted further to the oxide film by the RF-$N_2$ processing of FIGS. 16A and 16B while using the remote plasma source 26. Further, FIG. 20 shows the segregation of nitrogen to the surface of the oxide film caused as a result of the nitridation processing of FIG. 19. It should be noted that FIGS. 19 and 20 also show the case in which the oxide film is formed by a rapid thermal oxidation processing to the thickness of 5 Å (0.5 nm) and 7 Å (0.7 nm) Referring to FIG. 19, it can be seen that the nitrogen concentration in the film increases with the nitridation time in any of the oxide films, while it is also noted that, because of the small oxide thickness such as 0.4 nm corresponding to the two atomic layer thickness for the case of the oxide film formed by the UV-$O_2$ oxidation processing, or for the case of the thermal oxide film having a thickness of 0.5 nm near the foregoing thickness of 0.4 nm, a higher nitrogen concentration is achieved as compared with oxide films formed at the same condition.

FIG. 20 shows the result of detection of nitrogen concentration for the case the detectors DET1 and DET2 of FIG. 19 are set to 30 degrees and 90 degrees respectively.

As can be seen from FIG. 20, the vertical axis represents the X-ray spectral intensity from the nitrogen atoms segregated to the film surface obtained with the detection angle of 30 degrees divided by the X-ray spectral intensity of the nitrogen atoms distributed throughout the entire film. The vertical axis of FIG. 20 is defined as nitrogen segregation ratio. In the case the value of the nitrogen segregation ratio is 1 or more, there is caused segregation of nitrogen to the film surface.

Referring to FIG. 20, it can be seen that the nitrogen segregation ratio becomes one or more in the case the oxide film is formed by the UV-$O_2$ processing to the thickness of 7 Å, and the nitrogen atoms are segregated at first to the film surface and a situation similar to the oxynitride film 12A of FIG. 1 is realized. After the RF-$N_2$ processing for 90 seconds, on the other hand, the nitrogen atoms are distributed generally uniformly in the film. In other films, too, it can be seen that the distribution of the nitrogen atoms in the film becomes generally uniform as a result of the RF-$N_2$ processing for 90 seconds.

Figure 21:
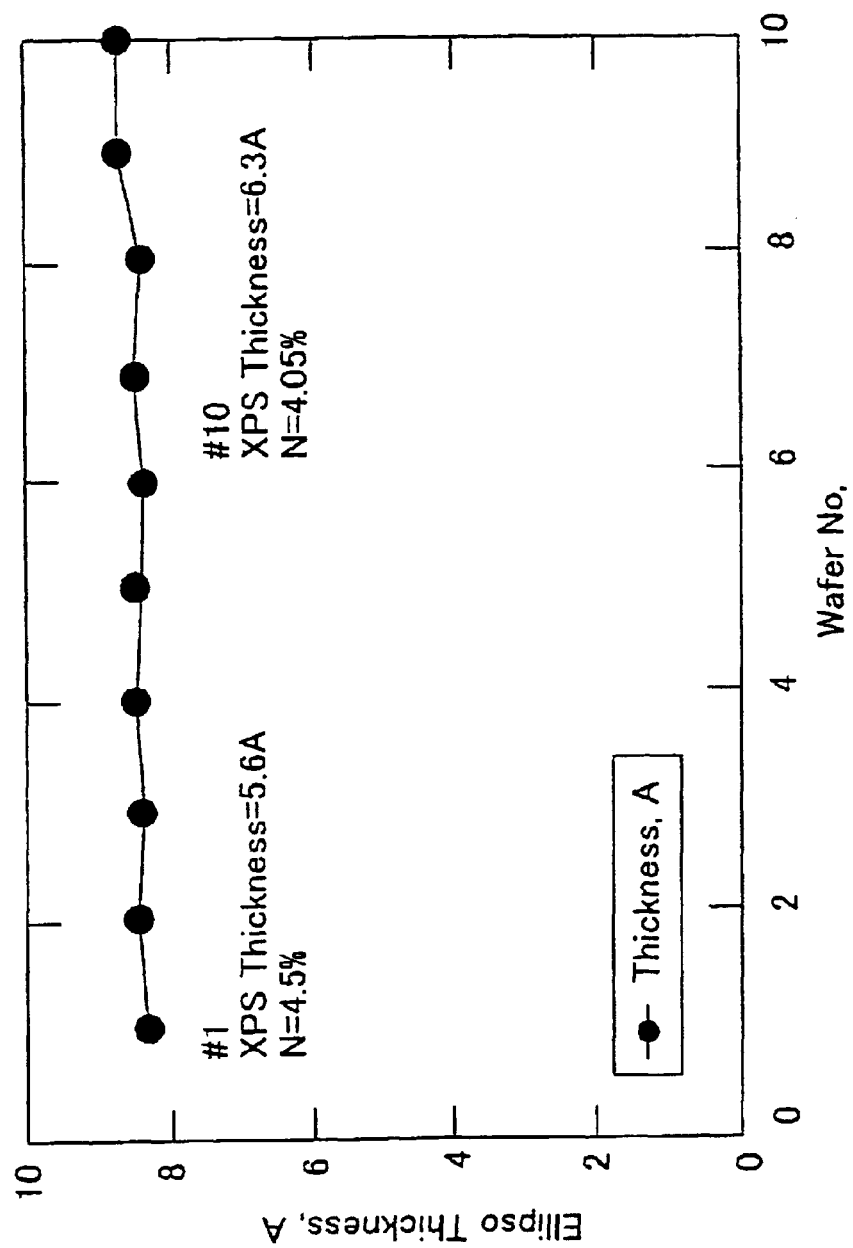
FIG. 21 is a diagram showing the wafer-by-wafer film thickness variation of an oxynitride film formed by a nitridation process of an oxide film.

In the experiment of FIG. 21, the UV-$O_2$ processing and the RF-$N_2$ processing are applied in the substrate processing apparatus 20 of FIG. 3 repeatedly with respect to ten wafers (wafer #1–wafer #10).

FIG. 21 shows the wafer-to-wafer variation of the film thickness of the oxynitride film thus obtained, wherein the result of FIG. 21 is obtained for the case in which the UV-$O_2$ processing is conducted in the construction of FIG. 3 by driving the ultraviolet source 25 such that an oxide film is formed to have the thickness of 0.4 nm as measured by the XPS analysis and in which the RF-$N_2$ processing is conducted to the oxide film thus formed by driving the remote plasma source 26 such that the oxide film is converted to an oxynitride film containing nitrogen atoms with about 4%.

Referring to FIG. 21, the vertical axis represents the film thickness obtained for the oxynitride film thus obtained by ellipsometry, wherein it can be seen that the film thickness is uniform and has a value of about 8 Å (0.8 nm).

Figure 22:
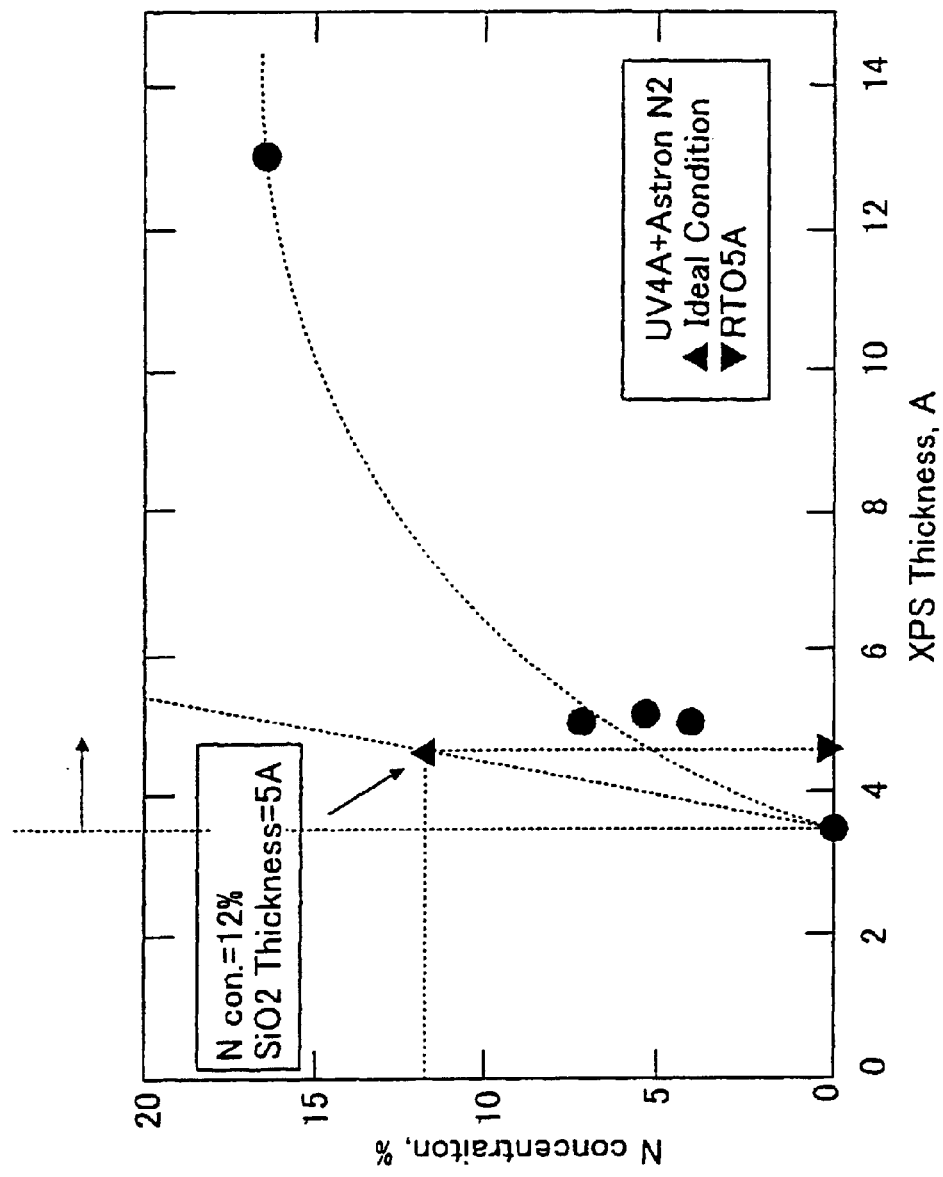
FIG. 22 is a diagram showing the increase of film thickness of an oxide film associated with the nitridation process according to the first embodiment of the present invention.

FIG. 22 shows the result of examination with regard to the increase of film thickness for the case an oxide film is formed on a silicon substrate in the substrate processing apparatus 20 of FIG. 3 with the thickness of 0.4 nm by the UV-$O_2$ processing while using the ultraviolet source 25 and further an RF-$N_2$ processing is applied to the oxide film thus formed while using the remote plasma source 26.

Referring to FIG. 22, it can be seen that the oxide film has increased the thickness thereof from the initial thickness (the thickness in the state before the RF-$N_2$ processing) of 0.38 nm to about 0.5 nm in the state nitrogen atoms are introduced by the RF-$N_2$ processing with the concentration of 4–7%. In the case the nitrogen atoms are introduced to the level of about 15% by the RF-N2 processing, on the other hand, it can be seen that the film thickness increases to about 1.3 nm. In this case, it is believed that the nitrogen atoms thus introduced into the oxide film form a nitride film by causing penetration into the silicon substrate after passing through the oxide film.

In FIG. 22, the relationship between the nitrogen concentration and film thickness is represented also for an ideal model structure in which only one layer of nitrogen atoms are introduced into the oxide film of 0.4 nm thickness by ▲.

Referring to FIG. 22, it can be seen that the film thickness after introduction of the nitrogen atoms becomes about 0.5 nm in this ideal model structure. Thereby, the increase of the film thickness for this model case becomes about 0.1 nm, and the nitrogen concentration becomes about 12%.

Using this model as a reference, it is concluded that the increase of film thickness is preferably suppressed to the value of 0.1–0.2 nm close to the foregoing value in the case the substrate processing apparatus 20 of FIG. 3 is used for the nitridation of the oxide film. In this state, it is evaluated that the maximum amount of the nitrogen atoms incorporated in to the film would be about 12% in the maximum.

Figure 23A:
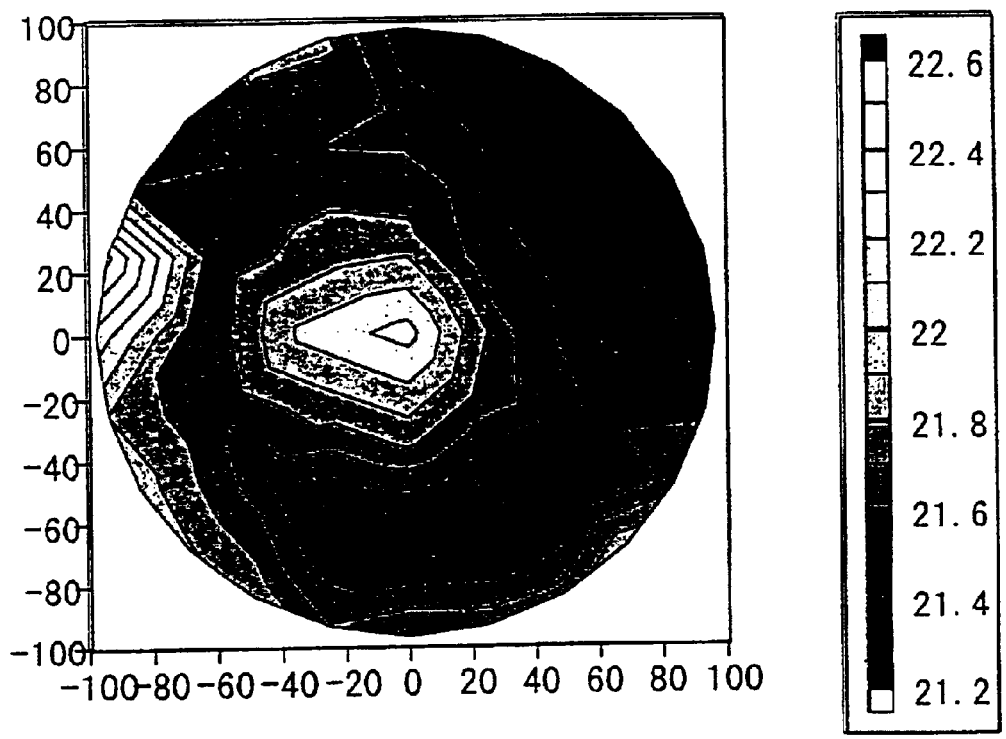
FIGS. 23A and 23B are diagrams showing in-plane uniformity of the nitridation process realized in the substrate processing apparatus of FIG. 3.
Figure 23B:
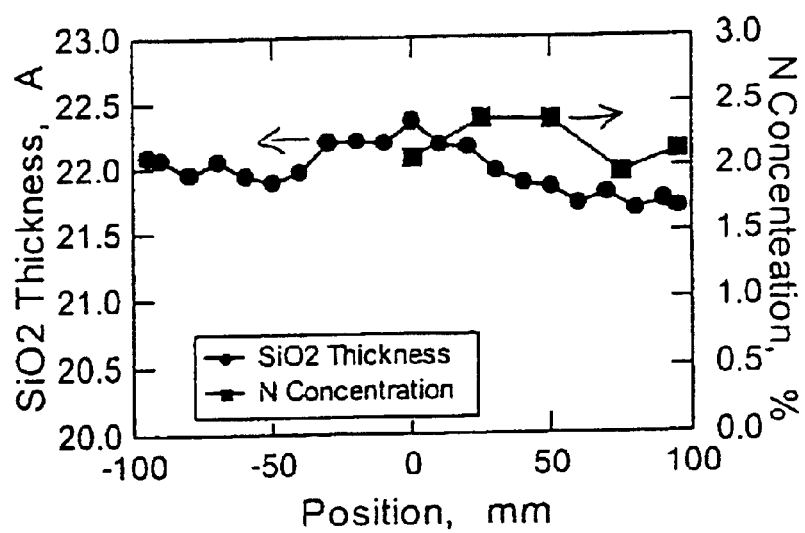

FIGS. 23A and 23B show the result of measurement of nitrogen concentration distribution and film thickness distribution of an oxynitride film for the case the oxynitride film is formed from an oxide film formed on the silicon substrate W in the substrate processing apparatus 20 of FIG. 3 to the thickness of 2 nm while rotating the silicon substrate W by the drive mechanism 22C. It should be noted that the experiment of FIGS. 23A and 23B is conducted at the substrate temperature of 450° C. under the pressure of 133 Pa while rotating the silicon substrate formed with the oxide film with the thickness of 2 nm, while supplying an Ar gas and a nitrogen gas with the respective flow rates of 2 SLM and 50 SCCM. In FIG. 23A, the bright part represents the part where there is caused nitrogen concentration. Further, FIG. 23B shows the thickness of the oxynitride film obtained by the ellipsometry and the nitrogen concentration obtained by the XPS analysis.

The result of FIGS. 23A and 23B shows that it is possible to realize a generally uniform nitrogen distribution over the entire surface of the substrate W even in the case of using the substrate processing apparatus 20, in which an asymmetric radical flow is caused, by rotating the substrate W and optimizing the flow rate of the Ar gas and the flow rate of the nitrogen gas.

Figure 24:
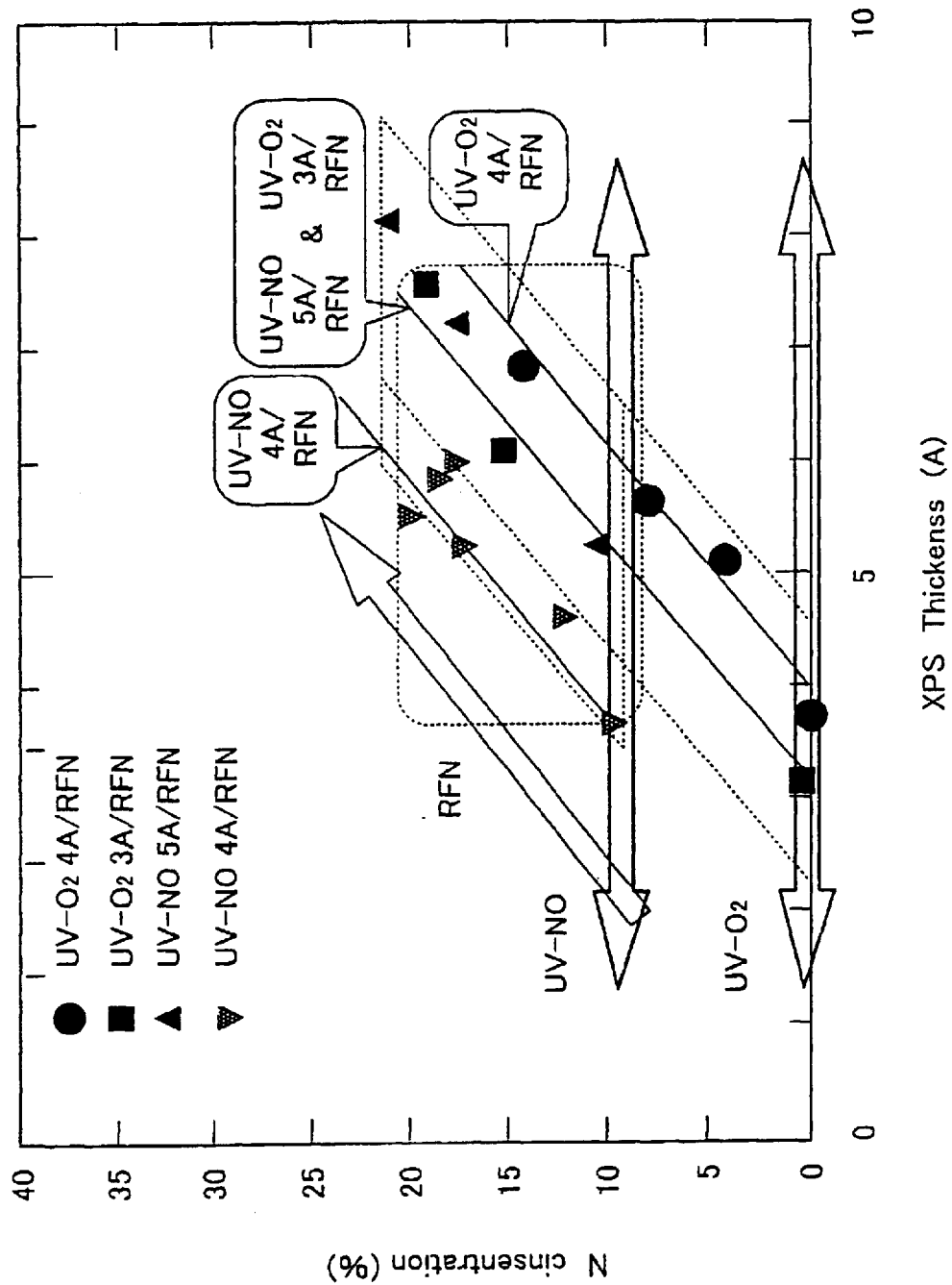
FIG. 24 is a diagram showing the relationship between the increase of film thickness and the nitrogen concentration of the film for the case an UV-$O_2$ oxide film or an UV-NO oxynitride film is subjected to an RF nitridation process.
Figure 25:
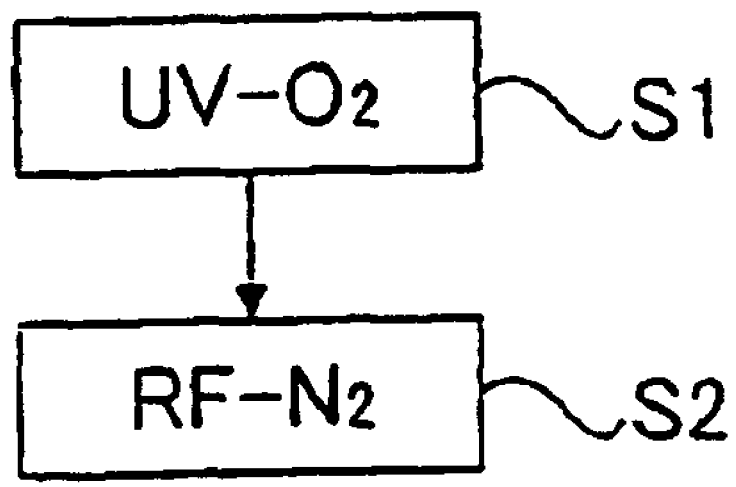
FIG. 25 is a flowchart showing an RF nitridation process of an UV-$O_2$ oxide film.

FIG. 24 is a diagram corresponding to FIG. 22 explained before and shows the relationship between the nitrogen concentration and film thickness as measured by the XPS analysis for the oxynitride film obtained by according to the flowchart of FIG. 25 in which an oxide film is formed by the UV-$O_2$ processing (step S1) and an RF-$N_2$ processing is applied to the oxide film thus formed (step S2). In FIG. 24, it should be noted that the initial thickness of the oxide film prior to the RF-$N_2$ processing is changed variously.

Referring to FIG. 24, ● represents the relationship between the XPS film thickness and the nitrogen concentration in the film for the case the oxide film has an initial thickness of 0.4 nm and thus corresponds to the case represented in FIG. 22 by ●. In the experiment of FIG. 24, it can be seen that the nitrogen concentration in the oxynitride film thus obtained increases generally linearly with the XPS film thickness as long as the film thickness is in the range up to about 0.8 nm.

On the other hand, ■ in the drawing shows the case in which the initial oxide film thickness is set to 0.3 nm. Again, it can be seen that the nitrogen concentration in the obtained oxynitride film increases linearly with the XPS thickness, with a gradient generally identical with the gradient for the case the oxide film has the initial thickness of 0.4 nm.

Thus, in the case such an oxynitride film is used for the base oxide film 2 underneath the high-K dielectric gate insulation film as shown in FIG. 1, there is a possibility, in view of the relationship of FIG. 24, that there may be caused an increase of physical thickness in the oxynitride film when the nitrogen concentration in the film is too high. In such a case, the effect of using the high-K dielectric gate insulation film 3 is cancelled out, in spite of the fact that oxidation of the silicon substrate 1 may be successfully suppressed by introducing nitrogen into the base oxide film 2.

Thus, in order to introduce nitrogen into the oxynitride film formed by applying an RF-$N_2$ processing to an oxide film formed by an UV-$O_2$ processing (referred to hereinafter as UV-$O_2$ oxide film), it is necessary to set the initial thickness of the UV-$O_2$ oxide film to be less than 0.4 nm. In other words, it is necessary to set the initial thickness of the UV-$O_2$ oxide film to be less than 0.4 nm in the case an oxynitride film introduced with such high-concentration nitrogen is to be used for the base oxide film of the high-dielectric gate insulation film.

FIGS. 26A–26C show the spectrum of the Si2p orbital obtained by the XPS analysis for the structure in which the oxide film 2 is formed on the silicon substrate 1 with the UV-$O_2$ processing and a Hf$O_2$ film is formed on the oxide film 2 as the high-K dielectric film 3, wherein FIG. 26A shows the state in which the oxide film 2 alone is formed while FIG. 26B shows the state in which the Hf$O_2$ film is formed on the oxide film 2. Further, FIG. 26C shows the spectrum of the structure in which the Hf$O_2$ film is annealed. Further, each of FIGS. 26A–26C shows a corresponding schematic device structure. In FIGS. 26A–26C, those parts corresponding to the parts described previously are designated by the same reference numerals and the description thereof will be omitted.

Referring to FIGS. 26A–26C, it can be seen that there is a low spectral peak B of the $Si_{2p}$ orbital having a chemical shift in the state of FIG. 26A in addition to the spectral peak A of the $Si_{2p}$ orbital, while the intensity of the spectral peak B increases in the state of FIG. 26B, and the strength of the spectral peak B is increased to the level comparable to the intensity of the peak A after the state of FIG. 26C in which the thermal annealing process is conducted.

It should be noted that the chemical shift corresponding to the peak B is caused as a result of a Si atom in the substrate 1 or a Si atom in the oxide film 2 causing a bond with an oxygen atom from the Hf$O_2$ film. Assuming that the chemical shift of the spectral peak for the $Si_{2p}$ orbital is caused entirely by the surface reaction on the silicon substrate 1, it is possible to evaluate the increase of the film thickness of the oxide film 2 caused by the thermal annealing process of FIG. 26C from the area of the peak B.

Figure 27:
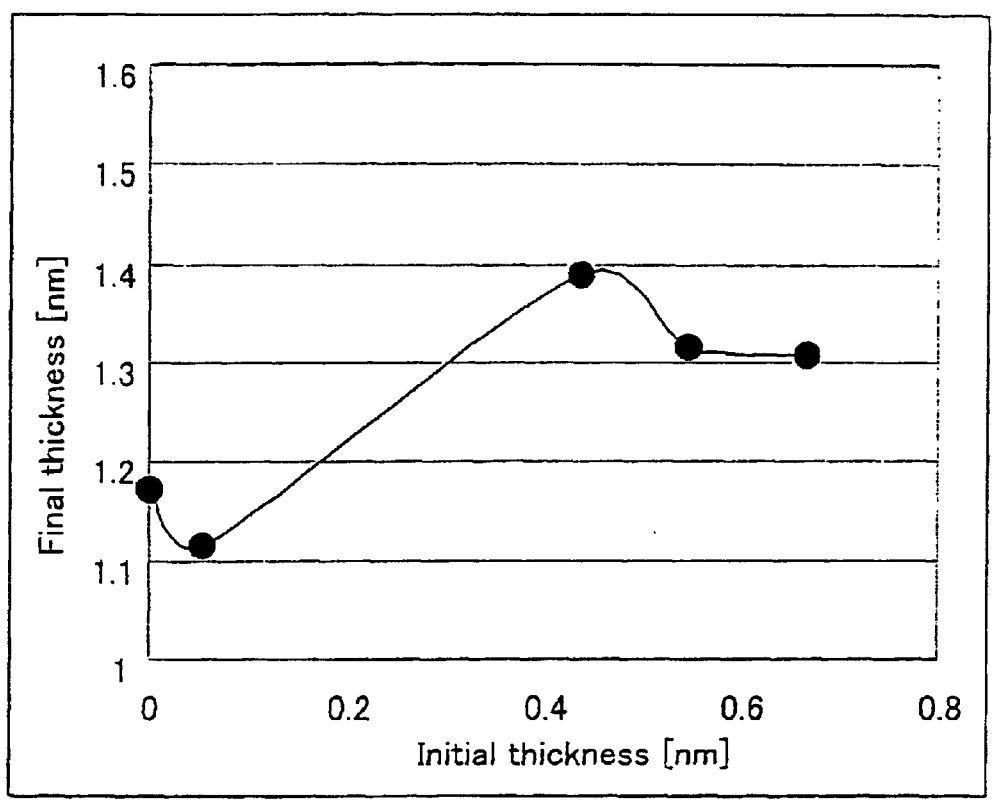
FIG. 27 is a diagram showing the increase of film thickness occurring in the oxynitride film obtained by the first embodiment of the present invention before and after the formation of the high-K dielectric film.

FIG. 27 shows the evaluation of change of the film thickness of the oxide film 2 before formation of an Hf$O_2$ film and after a thermal annealing process for the case the Hf$O_2$ film is formed on an oxide film of various initial thicknesses and further the thermal annealing process is conducted. In FIG. 27, the horizontal axis represents the initial thickness of the oxide film corresponding to FIG. 26A before the formation of the Hf$O_2$ film while the vertical axis represents the oxide film thickness after the thermal annealing process corresponding to FIG. 26C.

Referring to FIG. 27, it can be seen that there is caused a decrease of the final film thickness or slowing down of the final film thickness in the case the initial thickness of the UV-$O_2$ oxide film has exceeded 0.4 nm. Assuming that this slowing down of increase of the film thickness corresponds to the suppression of the interface reaction at the surface of the silicon substrate, there is a possibility that the optimum thickness of the oxide film 2 is located slightly larger than the foregoing thickness of 0.4 nm, which thickness is thought as being optimum in the previous embodiment of forming a ZrSi$O_4$ film from the ground of the observed slowing down of the film formation occurring at this thickness of 0.4 nm, for minimizing the interface reaction.

The degree of the interface reaction changes depending on the type of the high-K dielectric film, its reactivity, the degree of subsequent thermal annealing process, and the like. Thus, there can be a case a film having a thickness exceeding 0.4 nm may be required for suppressing the interface reaction. Of course, the overall process of the high-K dielectric gate insulation film should be designed so as to minimize the interface reaction, while the thickness of the base oxide film 2 should be ideally set to 0.4 nm. In conclusion, it is preferable that the base oxide film has a thickness in the range of 2–4 atomic layers and more preferably in the range of 2–3 atomic layers. Most preferably, the base oxide film has a thickness of two atomic layers.

[Second Embodiment]

Figure 28B:
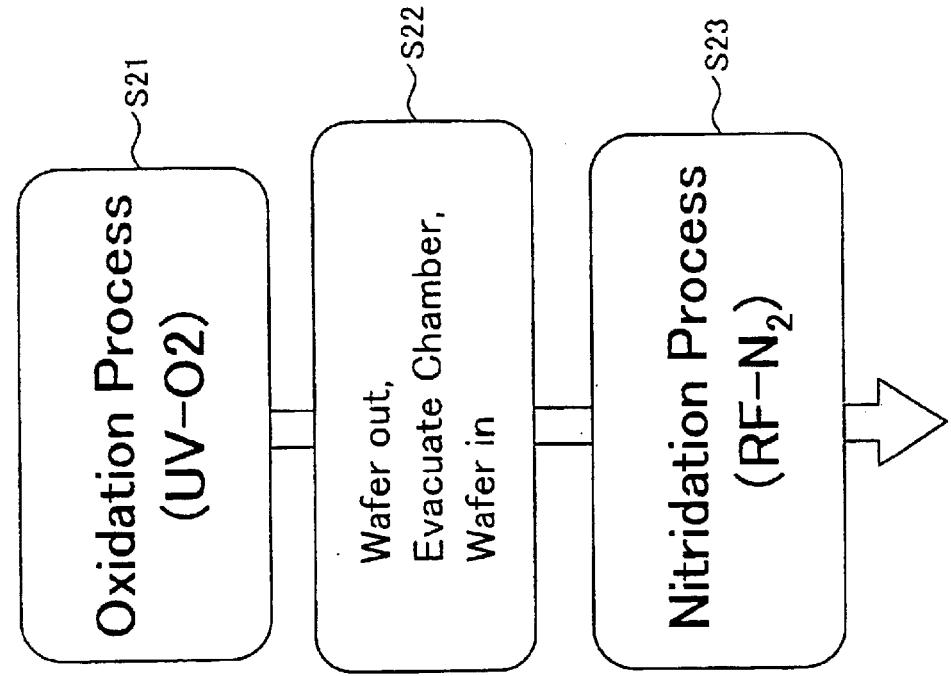
FIGS. 28A and 28B are flowcharts showing a substrate processing method according to a second embodiment of the present invention.
Figure 28A:
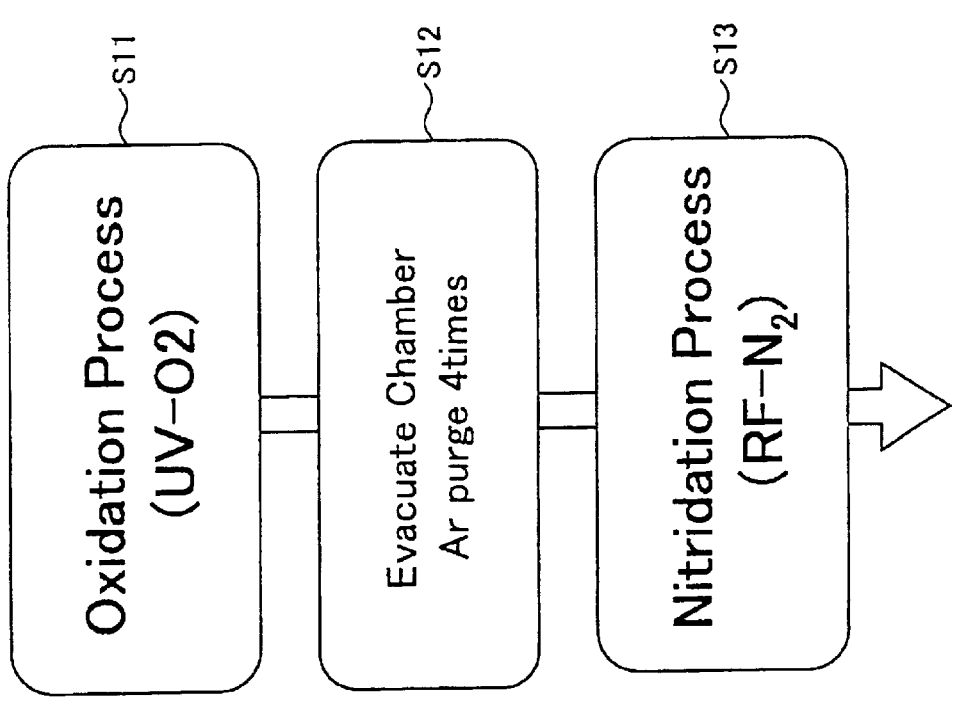

FIG. 28A is a flowchart for forming an oxynitride film on a surface of a silicon substrate according to a second embodiment of the present invention conducted by the substrate processing apparatus 20 of FIG. 3, while FIG. 28B is a flowchart showing the process of forming an oxynitride film according to a comparative example of FIG. 28A. In the comparative example of FIG. 28B, an oxide film is formed on a silicon substrate in the substrate processing apparatus 20 of FIG. 3 and the substrate is once taken out into the atmospheric environment. Further, the substrate is returned to the processing vessel 21 of the substrate processing apparatus 20 and the oxynitride film is formed as a result of the RF-$N_2$ processing of the oxide film.

Referring to the comparative example of FIG. 28B at first, a silicon oxide film is formed on the surface of the substrate W in the step 21 in the substrate processing apparatus 20 of FIG. 3 while using the ultraviolet-excited oxygen radicals formed according to the UV-$O_2$ processing step explained before. Next, the substrate W is moved out from the processing vessel 21 in the step of FIG. 22 and the interior of the processing vessel 21 is evacuated to a high-degree vacuum state. Thereafter, the substrate W is returned to the substrate 21. Further, an RF-$N_2$ processing using the RF-excited nitrogen radicals explained before is conducted in the step 23 and the silicon oxide film is converted to a silicon oxynitride film.

In the process of FIG. 28B, the interior of the processing vessel 21 is evacuated to a high-degree vacuum state in the step 22, and thus, the problem of oxygen contamination during the RF-N$_2$ processing in the step 22 is minimized. Thereby, unwanted increase of the thickness of the oxynitride film by oxidation is minimized.

In the step of FIG. 28A, on the other hand, the substrate W finished with the UV-O$_2$ processing in a step 11, which corresponds to the step 21, is held in the processing vessel 21 for increasing the throughput of substrate processing. Thus, after conducting a purging process in a step 12, a step 13 corresponding to the step 23 is conducted and the silicon oxide film is converted to a silicon oxynitride film as a result of the RF-N$_2$ processing 13, which corresponds to the step 23 and uses the RF-excited nitrogen radicals.

Figure 29A:
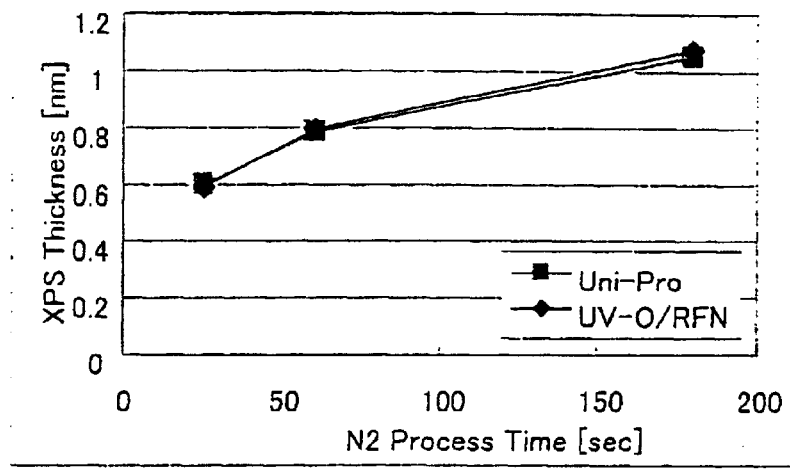
FIGS. 29A and 29B are diagrams respectively showing the film thickness and the nitrogen concentration in the film for an oxynitride film formed by the process of FIGS. 28A and 28B.

FIG. 29A shows the thickness of the oxynitride film formed by the process of FIG. 28A as measured by the XPS analysis with the thickness of the oxynitride film formed by the process of FIG. 28B, also obtained by the XPS measurement. In FIG. 29A, the horizontal axis shows the nitridation time in the step 13 of FIG. 28A or in the step 23 of FIG. 28B. In FIG. 28A, ■ represents the process of FIG. 28A while ◆ represents the process of FIG. 28B.

Referring to FIG. 29A, it can be seen that there is caused an increase of thickness of the oxynitride film with the progress of the nitridation process while no substantial difference can be recognized between the process of FIG. 28A and the process of FIG. 28B. This means that sufficient oxygen purge is achieved also in the process of FIG. 28A.

Figure 29B:
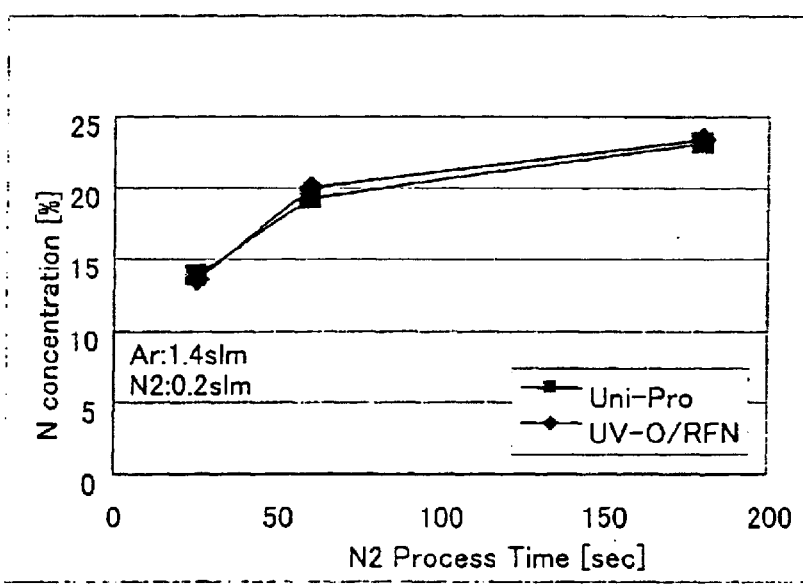

FIG. 29B shows the concentration of the nitrogen atoms thus incorporated into the oxynitride film, wherein FIG. 29B compares the process of FIG. 28A and the process of FIG. 28B. In FIG. 29B, the horizontal axis represents the nitriding time of the step 13 of FIG. 28A or the step 23 of FIG. 28B. In FIG. 29B, ■ represents the process of FIG. 28A while ◆ represents the process of FIG. 28B.

Referring to FIG. 28B, it can be seen that there is no substantial difference in the concentration of the nitrogen atoms incorporated into the oxynitride film between the process of FIG. 28A and the process of FIG. 28B, and thus, it is interpreted that the increase of the film thickness observed in FIG. 29A is caused as a result of the introduction of nitrogen into the oxynitride film.

Next, the inventor of the present invention has conducted an experiment of forming an oxide film by using the substrate processing apparatus 20 of FIG. 3, wherein oxygen radicals are formed by using the remote plasma source 26 rather than the ultraviolet optical source 25 (this process will be referred to hereinafter as RF-O$_2$ process). From the oxide film thus formed by the RF-O$_2$ processing, an oxynitride film is formed by conducting an RF-N$_2$ nitridation processing that uses the nitrogen radicals formed by the remote plasma source 26.

Figure 30B:
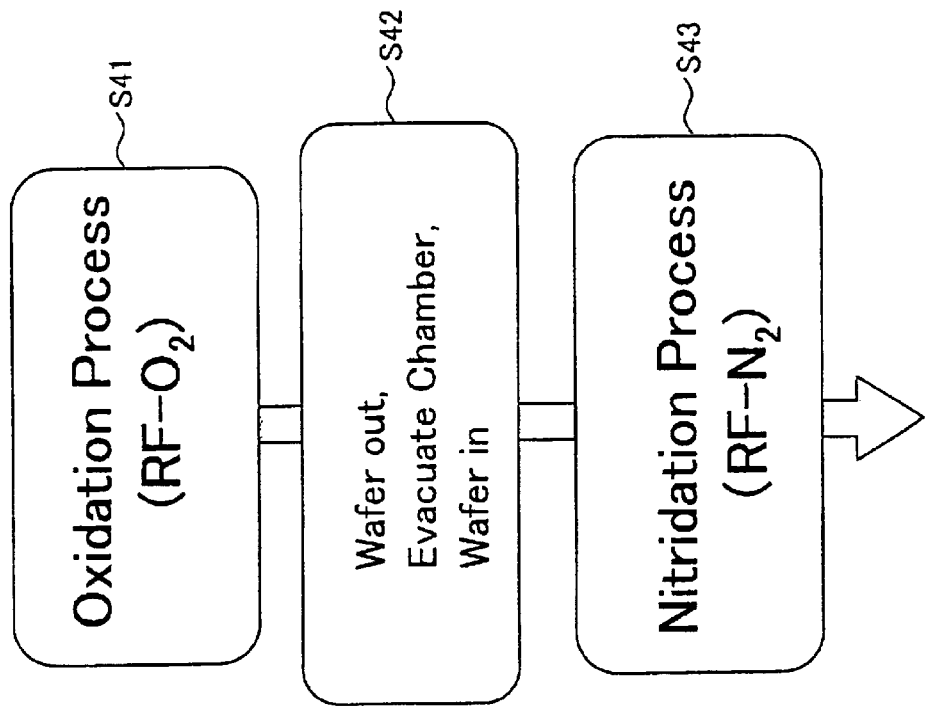
FIGS. 30A and 30B are flowcharts showing the substrate processing method according to a comparative example of the second embodiment of the present invention.
Figure 30A:
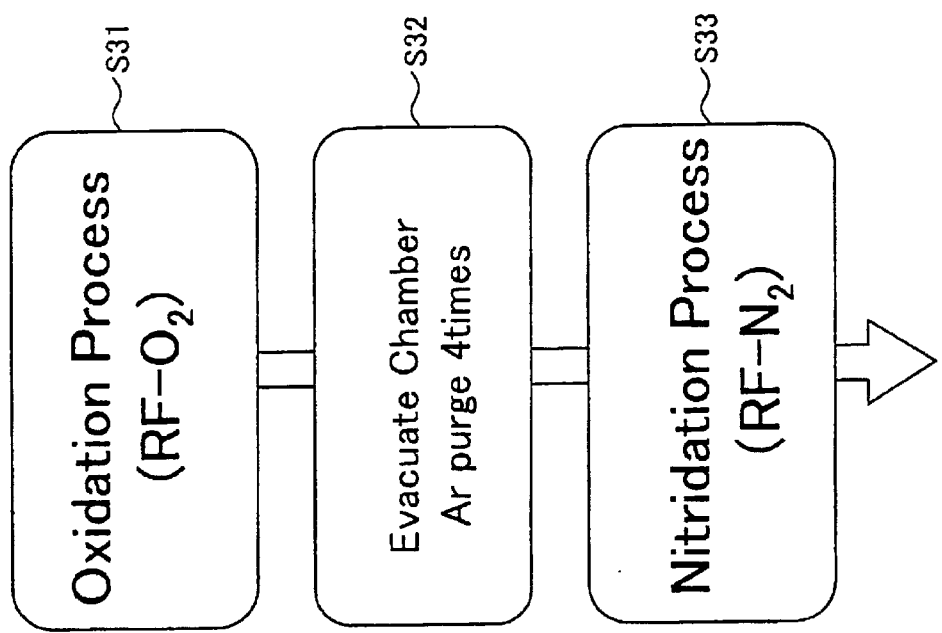

In the experiment of FIG. 30A, an RF-O$_2$ processing is conducted in a step 31 by supplying an Ar gas and an O$_2$ gas to the remote plasma source 26, followed by a purging process in a step 32 in which the processing vessel 21 is purged to a high-degree vacuum state. Thereafter, the processing vessel 21 is purged four times by Ar, and an RF-N$_2$ processing is conducted in a step 33 by using the remote plasma source 26.

In the experiment of FIG. 30B, on the other hand, Ar and O$_2$ are introduced to the remote plasma source 26 in a step 41 similarly to the step 31 and an RF-O$_2$ processing is conducted. Thereafter, the substrate W is moved to the outside of the processing vessel 21 in a step 42. In this state, the processing vessel is evacuated to a high-degree vacuum state, and the substrate W is returned to the processing vessel 21 again. Further, an RF-N$_2$ processing similar to the one in the step 33 is conducted.

Figure 31A:
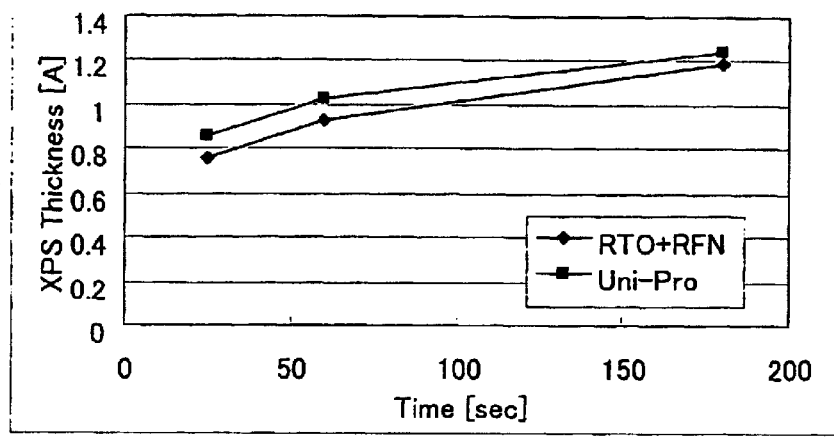
FIGS. 31A and 31B are diagrams respectively showing the film thickness and the nitrogen concentration in the film for an oxynitride film formed by the process of FIGS. 30A and 30B.

FIG. 31A compares the thickness of the oxynitride film obtained by the XPS analysis for the oxynitride film formed by the process of FIG. 30A with the thickness of the oxynitride film obtained by the XPS analysis for the oxynitride film formed by the process of FIG. 30B. In FIG. 31A, it should be noted that ■ corresponds to the process of FIG. 30A while ◆ corresponds to the process of FIG. 30B.

Referring to FIG. 31A, it can be seen that there is caused a substantial increase of film thickness in the case the oxide film is formed on the substrate W by the RF-O$_2$ processing that uses the remote plasma source 26 according to the process of FIG. 30A.

Figure 31B:
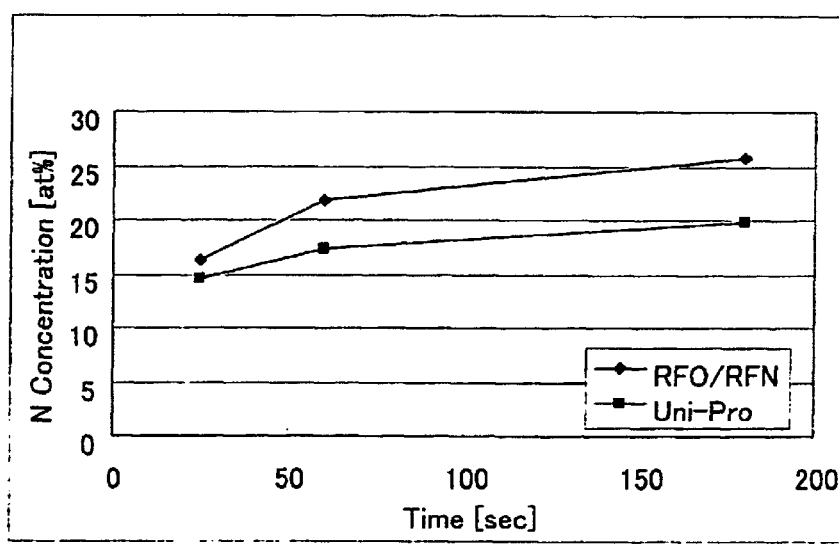

FIG. 31B shows the concentration level of the nitrogen atoms in the oxynitride film formed by the process of FIG. 30A in comparison with the concentration of the nitrogen atoms in the oxynitride film formed by the process of FIG. 30B, wherein ■ of FIG. 31B corresponds to the process of FIG. 30A while ◆ corresponds to the process of FIG. 30B.

Referring to FIG. 31B, it is noted that the nitrogen concentration level in the oxynitride film formed by the process of FIG. 30A is lower than the nitrogen concentration level of the oxynitride film formed by the process of FIG. 30B. This indicates that the increase of the film thickness as observed in FIG. 31A for the case the process of FIG. 30B is used is primarily caused by residual oxygen. It is believed that such residual oxygen exists in the remote radical source 26 and the oxygen radicals promoting the oxidation of the oxynitride film are formed form such residual oxygen at the same time the nitrogen radicals are formed in the nitridation step 33 of FIG. 30A.

From the situation noted above, it is concluded that it is preferable to form the initial oxide film by using the UV-O$_2$ processing that uses the ultraviolet-excited oxygen radicals in the case the substrate processing apparatus 20 of FIG. 3 is used for forming an extremely thin oxide film on the substrate surface and forming an oxynitride film therefrom by causing nitridation of the oxide film by an RF-N$_2$ processing as set forth in the flowchart of FIG. 25.

[Third Embodiment]

Figure 32:
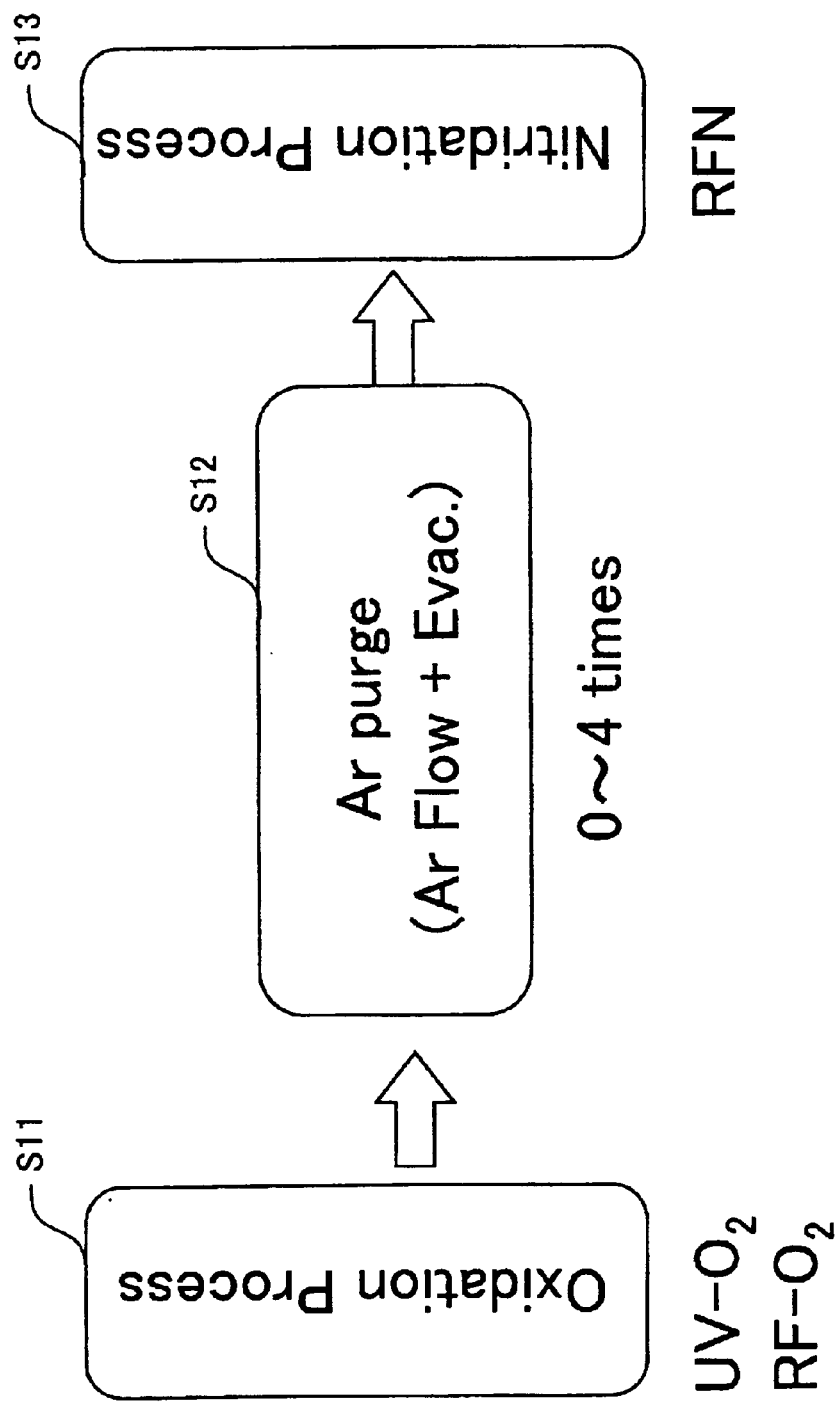
FIG. 32 is a flowchart showing a substrate processing method according to a third embodiment of the present invention.

FIG. 32 shows a flowchart of the process of forming an oxynitride film according to a third embodiment of the present invention, wherein those parts of FIG. 32 explained before are designated by the same reference numerals and the description thereof will be omitted.

Referring to FIG. 32, the process of formation of the oxynitride film of the present embodiment is somewhat similar to the process explained previously with reference to FIG. 28A except that the number of the purges conducted in the purging step of the processing vessel 21 in the step 12 by using an Ar gas is changed variously from 0 times to 4 times. Each purge is formed by the step of flowing an Ar gas in the processing vessel 21 and the step of evacuating the processing vessel to a high-degree vacuum state.

FIG. 33A shows the relationship between the number of the Ar purges conducted in the step 12 of FIG. 32 and the thickness of the oxynitride film obtained in the step 13, wherein the thickness of the oxynitride film shown in FIG. 33A is obtained by ellipsometry.

Referring to FIG. 33A, it can be seen that the thickness of the oxynitride film is constant and takes a value of about 1.4 nm irrespective of the number of the Ar purges.

FIG. 33B, on the other hand, shows the thickness of the oxynitride film obtained for the case the number of the Ar purges of the step 32 is changed variously in the process of FIG. 30A.

Referring to FIG. 33B, it can be seen that the thickness of the oxynitride film is decreased slightly with the number of purges, indicating that the purging in the step 32 is necessary for suppressing the increase of film thickness caused by oxidation of the oxynitride film.

The results of FIGS. 33A and 33B indicate that it is not always necessary to conduct the purging in the step 12 in the case the formation of the oxynitride film is conducted by the process of FIG. 30A and that there occurs no substantial increase of thickness in the oxynitride film even when this step is omitted.

[Fourth Embodiment]

The result of FIG. 24 explained before indicates that a thickness of about 0.8 nm is inevitable for an oxynitride film in the case the oxynitride film is formed by an RF-$N_2$ nitridation processing of a UV-$O_2$ film so as to have a nitrogen concentration level of 20%. When the thickness of the oxynitride film is to be reduced further, it is necessary to reduce the initial oxide thickness to 0.2 nm or 0.1 nm or even smaller, as long as the nitridation is started from an UV-$O_2$ oxide film.

In the present embodiment, instead of forming the UV-$O_2$ oxide film explained before, an NO gas is introduced in the substrate processing apparatus 20 of FIG. 3 from the gas nozzle 21D and excitation of atomic state oxygen and atomic state nitrogen is caused by conducting ultraviolet excitation of the NO gas thus introduced (such a processing will be referred to hereinafter as UV-NO processing). The oxynitride film thus obtained, or the UV-NO film, contains nitrogen already in the initial state. Thus by nitriding such an UV-NO film by way of the RF-$N_2$ processing, it becomes possible to introduce nitrogen into the film with high concentration while simultaneously minimizing the film thickness.

Figure 34:
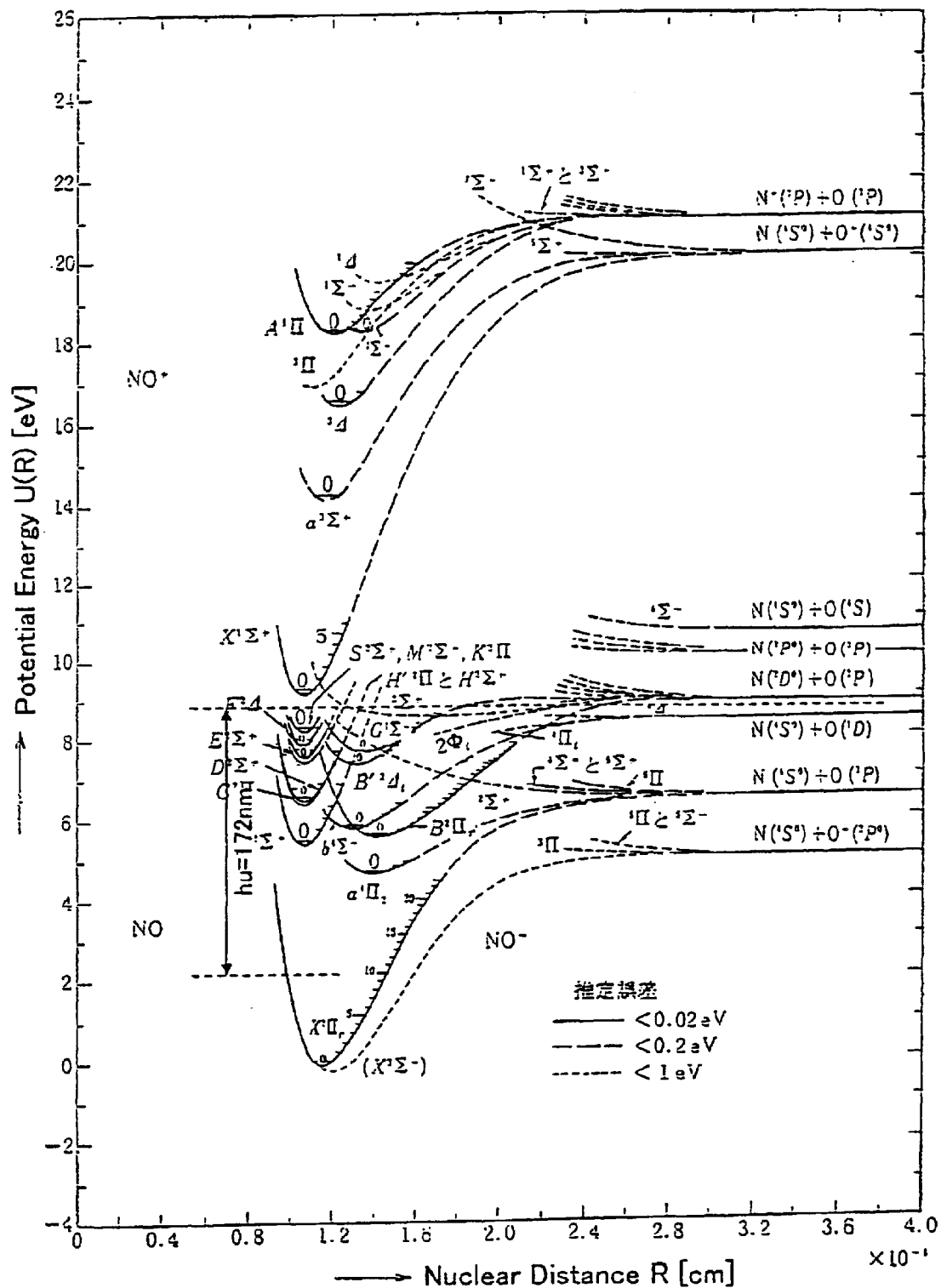
FIG. 34 is a diagram showing a potential curve of an NO molecule for various excitation states thereof.

FIG. 34 shows the potential curve of an NO molecule for various excitation states (see for example J. S. Chang, et al., "atomic and molecular processes of ionized gas" Tokyo Denki University Press, 1982).

In the ultraviolet-induced optical transition of NO molecules, existence of absorption bands corresponding to the transition from the ground state to the excited states such as $A^2\Sigma^+$, $B^2\Pi r$, $C^2\Pi$, $D^2\Sigma^+$, $E^2\Sigma^+$ is known, wherein the transition takes place at the optical wavelengths shorter than the wavelengths of 227 nm, 218 nm, 192 nm, 188 nm and 165 nm, respectively.

On the other hand, FIG. 34 also shows the wavelength in which atomic state oxygen ($O^3P$) and atomic state nitrogen ($N^4S^0$) can be excited that such a wavelength falls in the range between 192 nm and 145 nm. Thus, it is possible to form the atomic state oxygen and atomic state nitrogen by exciting an NO molecule with an optical wavelength longer than 145 nm. When the optical wavelength becomes shorter than 145 nm, on the other hand, there starts excitation of radical oxygen ($O^1D$), and oxidation reaction is expected to be predominant at the time of the substrate processing.

In view of the situation noted above, it becomes possible to form the desired UV-NO film by using an ultraviolet radiation source having a wavelength in the range of 192–145 nm for the ultraviolet source 25 in the substrate processing apparatus 20 of FIG. 3.

Figure 35:
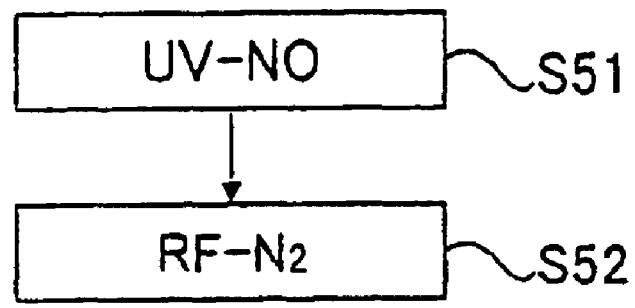
FIG. 35 is a flowchart showing the RF nitridation process of a UV-NO oxide film.

FIG. 35 shows the outline of the substrate processing according to the present embodiment in which an RF-$N_2$ processing is conducted subsequently to the UV-NO processing.

Referring to FIG. 35, the surface of a silicon substrate is nitrided in a step 51 by the foregoing UV-NO processing, and an oxynitride film is formed as a result.

Next, in the step 52, the oxynitride film thus formed is subjected to an RF-$N_2$ processing, and an oxynitride film having a high nitrogen concentration is obtained.

Table 3 below shows an example of the process condition for the steps 51 and 52, wherein Table 3 below also shows the process condition of the UV-$O_2$ processing (step 1 of FIG. 25) in relation to the step 51.

TABLE 3

| | Gas | Flow Rate [SCCM] | Press [Torr] | Temp [° C.] | Time [sec] |
|---|---|---|---|---|---|
| step 1 | UV-$O_2$ | $O_2$ | 300 | 0.02 | 500 | 15–300 |
| step 51 | UV-NO | NO | 200 | 0.05 | 450 | 20–120 |
| step 52 | RF-$N_2$ | Ar + $N_2$ | 1600 | 0.09 | 500 | 15–60 |

Further, Table 4 below shows the allowable process condition of the foregoing steps 51 and 52. Similarly to Table 3, Table 4 shows the allowable process condition for both the UV-$O_2$ processing and the UV-NO processing.

TABLE 4

| | Gas | Flow Rate [SCCM] | Press [Torr] | Temp [° C.] | Time [sec] |
|---|---|---|---|---|---|
| step 1 | UV-$O_2$ | $O_2$ | 300–4000 | 0.02–5 | 300–750 | 15–600 |
| step 51 | UV-NO | NO | 10–1000 | 0.01–5 | 300–750 | 15–600 |
| step 52 | RF-$N_2$ | Ar + $N_2$ | 500–2500 | $1 \times 10^{-3}$–10 | 300–750 | 10–180 |

Tables 3 and 4 indicate that the UV-$O_2$ processing can be conducted in the pressure range of 0.02–5 Torr (0.0266–665 Pa) and the temperature range of 300–750° C. and that the UV-NO processing can be conducted in the pressure range of 0.01–5 Torr (0.0133 Pa–1.33 kPa) and the temperature range of 300–750° C. Particularly, the range of 0.67 Pa–13.3 kPa is preferable.

On the other hand, it is possible to conduct the RF-$N_2$ processing in the pressure range of $10^{-3}$–10 Torr (0.133 Pa–1.33 kPa) and in the temperature range of 300–700° C. Particularly, the range of 0.67 Pa–13.3 kPa is preferable.

Referring back to FIG. 24 explained before, ▲ and ▼ show the relationship between the nitrogen concentration and film thickness of the oxynitride film formed according to the process of FIG. 35.

Referring to FIG. 24, it can be seen that the oxynitride film already contains nitrogen with a concentration of about 10% in the state immediately after formation thereof by the UV-NO process. Thus, by applying the RF-$N_2$ processing of the step 52 of FIG. 35 to such an oxynitride film, it becomes possible to form an oxynitride film of higher nitrogen concentration. Thereby, the date represented in the drawing by ▲ represents the case in which the oxynitride film has a thickness of 0.5 nm in the state immediately after the UV-NO processing, while ▼ represents the case in which the oxynitride film has a thickness of 0.4 nm in the state immediately after the UV-NO processing. In the case of the film represented by ▼, in particular, it can be seen that a nitrogen concentration of 20% can be achieved while maintaining the film thickness to 0.6 nm or less in terms of the thickness measured by the XPS analysis, by conducting the RF-$N_2$ processing.

Figure 36:
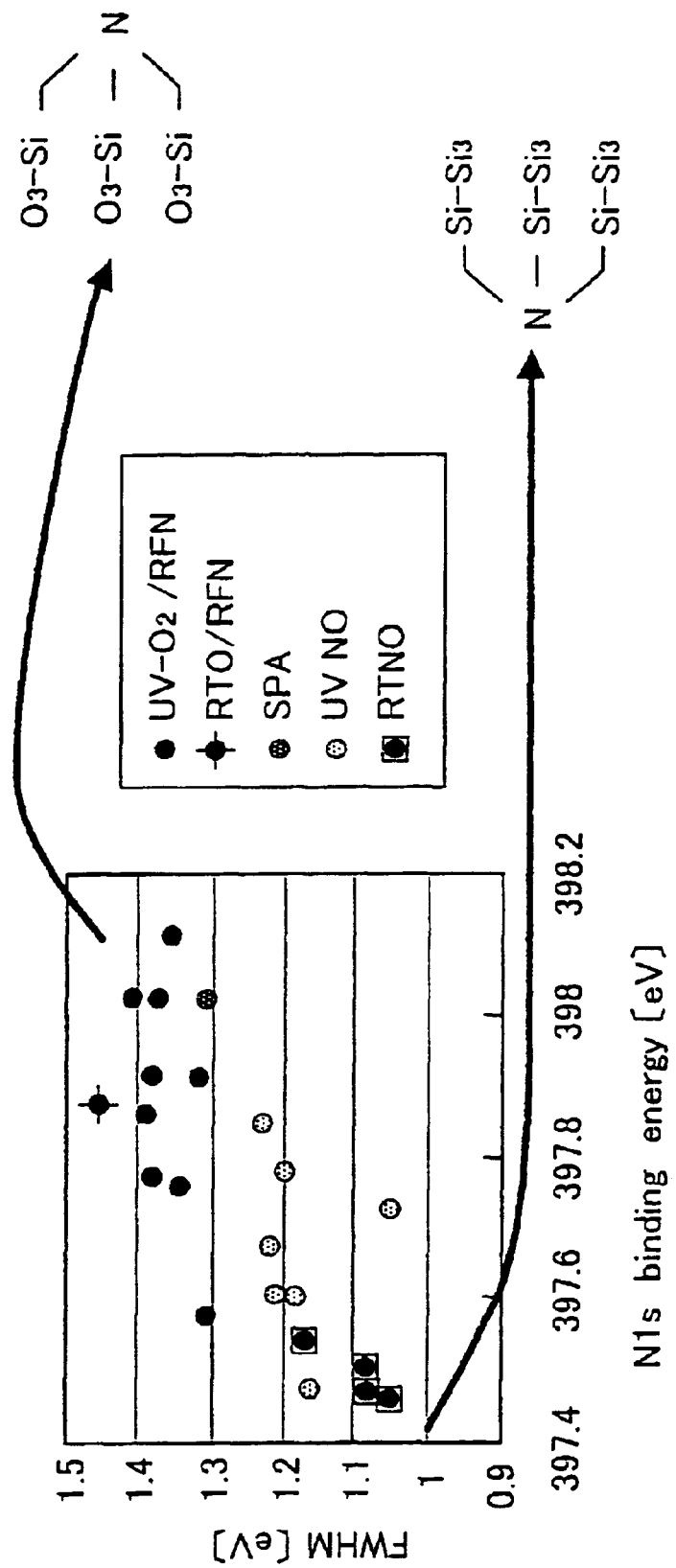
FIG. 36 is a diagram showing the distribution of nitrogen atoms in an oxynitride film obtained by the process of FIG. 35.

FIG. 36 shows the binding energy of a nitrogen atom of the 1s state contained in the oxynitride film, which is obtained according to the process of the previous embodiment in which the UV-$O_2$ processing and the RF-$_{N2}$ processing are conducted consecutively. Further, FIG. 36 shows similar binding energy for the oxynitride film formed by conducting the UV-NO processing explained before and also for an oxynitride film formed by a different process. In FIG. 36, it should be noted that the vertical axis represents the full-width half-maximum (FWHM) of the XPS spectrum while the horizontal axis represents the binding energy of the $N_{1s}$ atom.

Figure 37A:
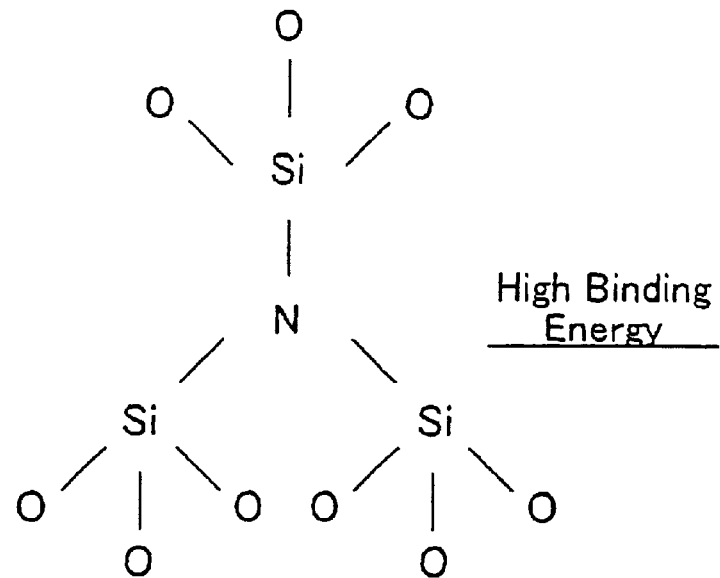
FIGS. 37A and 37B are diagrams showing an example of distribution state of nitrogen atoms in an oxynitride film.
Figure 37B:
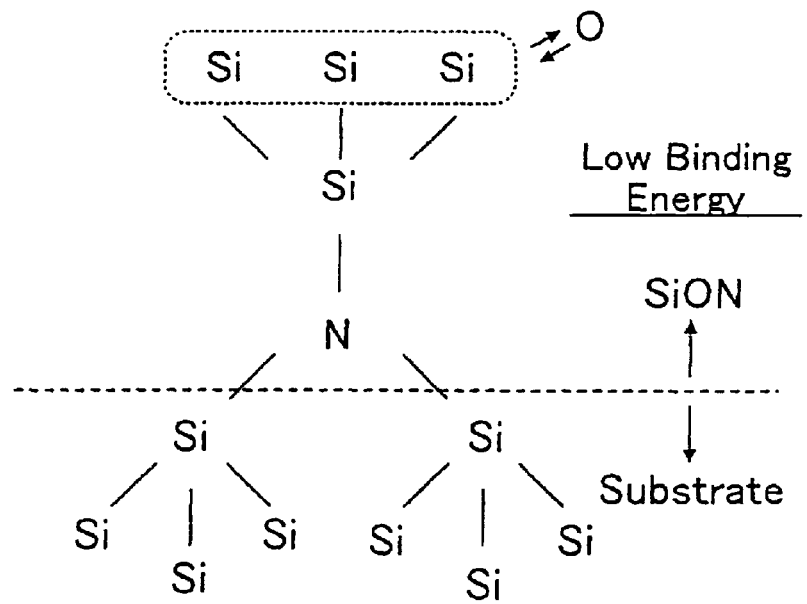

Referring to FIG. 36, the oxynitride film having particularly large binding energy corresponds to the case shown in FIG. 37A in which the nearest neighboring sites of a nitrogen atom are occupied by Si atoms and the second neighboring sites of the nitrogen atom are occupied by oxygen, while the oxynitride film having a large binding energy corresponds to the case shown in FIG. 37B in which the nearest neighboring sites of a nitrogen atom are occupied by Si atoms and the second nearest neighboring sites of the nitrogen atom are also occupied by Si atoms. There exists a difference of binding energy of about 0.6 eV between these two configurations, while it is noted that that this difference of binding energy agrees with the distribution of the data points on the horizontal axis in FIG. 36.

Referring to FIG. 37A, the nitrogen atoms are included in the oxide film in this state, and thus, the state of FIG. 37A corresponds to the state such as the one shown in FIG. 1, in which the nitrogen atoms exist in the interior of the oxide film or near the surface of the oxide film. In FIG. 37B, on the other hand, it should be noted that the state in which the Si atoms in one or more sites circled in the drawing by a dotted line are substituted with oxygen as represented by arrows corresponds to the case in which the nitrogen atoms are concentrated to the region of the oxynitride film near the interface between the silicon substrate and the oxynitride film.

Referring to FIG. 36, it can be seen that the value of the binding energy scatters over a wide range from the relatively low energy side of about 397.6 eV to the higher energy side of about 398.1 eV in the case of the oxynitride film formed by the RF-$N_2$ processing of the UV-$O_2$ oxide film. From this, and further in view of the fact that the half height width of the peak takes a large value in the case of such an oxynitride film, it is concluded that the state of FIG. 37A and the state of FIG. 37B are mixed in the film.

In the oxynitride film in which only the UV-NO processing is conducted, on the other hand, the value of the binding energy is distributed in the low energy side from about 397.5 eV to about 397.9 eV. From this, and further in view of the fact that the half-height width of the peak is reduced in such a film, it is estimated that, while there still exists a mixing of the state of FIG. 37A and the state of FIG. 37B in the film, the state of FIG. 37B is slightly superior. In such a case, it is believed that the distribution of the nitrogen atoms in the oxynitride film is slightly shifted in the direction close to the silicon substrate.

FIG. 36 also shows the result for the case of an oxynitride film (RTO/RFN) in which a thermal oxide film is subjected to the RF-$N_2$ processing, the case of an oxynitride film (SPA) in which a thermal oxide film is subjected to a microwave-plasma nitridation process, and for the case of an oxynitride film (RTNO) in which a silicon substrate is subjected to a thermal nitridation processing.

In the case of the oxynitride film designated as RTO/RFN and the oxynitride film designated as SPA, the binding energy observed for the $N_{1s}$ state is relatively large and is believed that the state of FIG. 37A is predominant. In the case of the oxynitride film RTNO, on the other hand, the observed binding energy of the $N_{1s}$ state is concentrated into the value of about 397.4 eV. It is believed that this indicates that there is a concentration of nitrogen atoms in the oxynitride film near the interface between the oxynitride film and the silicon substrate.

Thus, according to the formation process of the oxynitride film of the present invention that applies the RF-$N_2$ processing to the UV-O2 oxide film, it is possible to realize a generally uniform distribution of the nitrogen atoms in the oxynitride film, with slight concentration in the side of the film surface. In the case of conducting the RF-$N_2$ processing to an existing oxide film, the nitrogen atoms are distributed primarily at the side of the film surface in view of the result of $UVO_2$/RFN, RTO/RFN or SPA of FIG. 36. From this, it is expected that a generally uniform distribution of nitrogen atoms is achieved in the oxynitride film from the interface between the silicon substrate and the film to the film surface by applying the RF-$N_2$ processing to the oxynitride film formed by the UV-NO processing as represented in FIG. 36.

[Fifth Embodiment]

In the case of fabricating a semiconductor device having a high-K dielectric gate insulation film of FIG. 1, it is necessary to form the high-K dielectric film 3 on the base oxide film 2 thus formed by the substrate processing apparatus 20.

Typically, a CVD process is used to form such a high-K dielectric film 3. In the case of forming a $ZrO_2$ film, for example, $ZrCl_4$ or other gaseous source containing Zr is used and the $ZrO_2$ film is deposited by oxidizing such a gaseous source.

As it is preferable that the formation of such a high-K dielectric film 3 is conducted subsequent to the nitridation process of the radical oxide film shown in FIGS. 16A and 16B, without contacting the substrate to the external air. Thus, it is preferable that the substrate processing apparatus 20 of FIG. 3 is integrated into a cluster-type substrate processing system that includes a CVD chamber.

Figure 38:
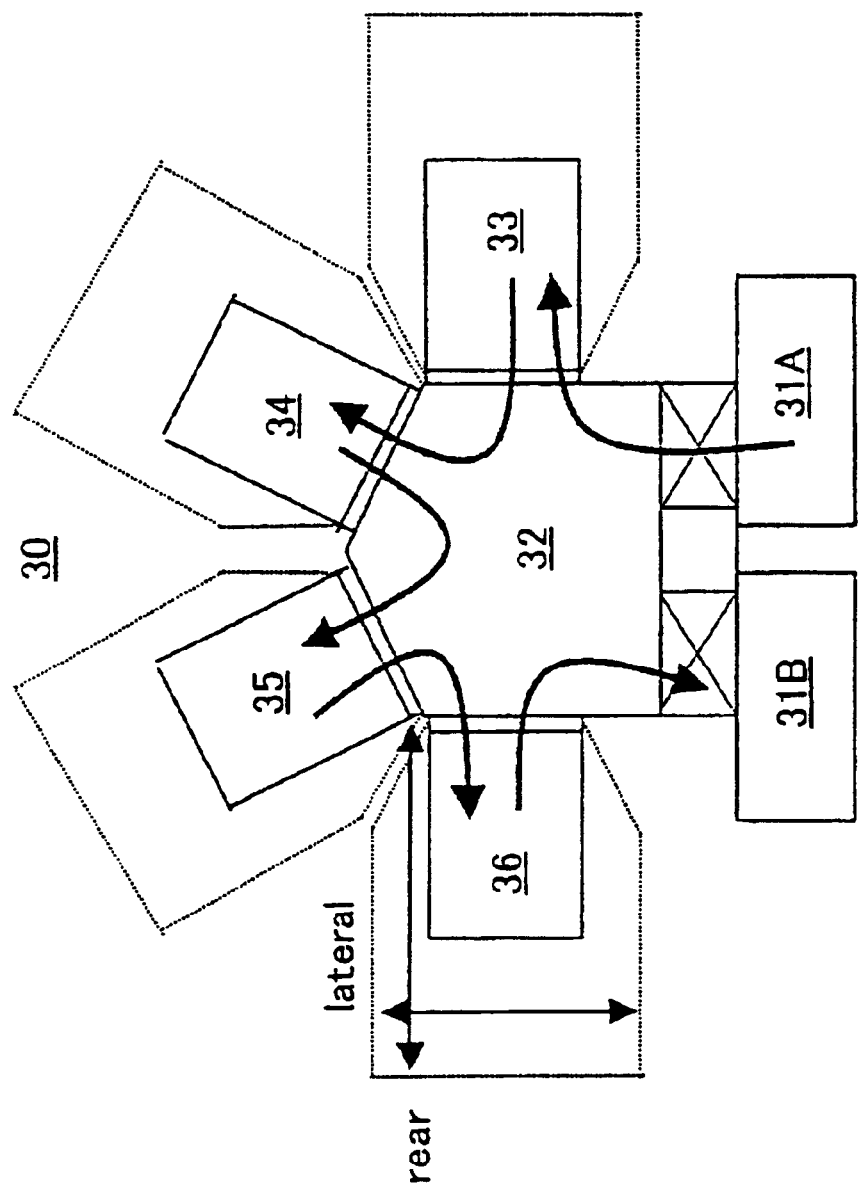
FIG. 38 is a diagram explaining the problem when a cluster-type substrate processing system is constructed by using the substrate processing apparatus of FIG. 3.

FIG. 38 shows the schematic construction of such a cluster-type substrate processing system 30 according to a fifth embodiment of the present invention.

Referring to FIG. 38, the cluster-type substrate processing system 30 includes cassette modules 31A and 31B for loading and unloading a substrate W and a substrate transfer chamber 32 connected to the cassette modules 31A and 31B via respective gate valves, wherein the substrate transfer chamber 32 is further connected to a substrate cleaning chamber 33, a base film formation chamber 34, a CVD chamber 35 and a thermal processing chamber 36.

Thus, the substrate W introduced into the substrate transfer chamber 32 from the cassette module 31A or 31B is forwarded to the substrate cleaning chamber 33 first for removing a native oxide film or organic contamination therefrom. Next, the substrate W is transported to the base oxide film formation chamber 34 via the substrate transfer chamber 32 and the base oxide film 12 and the nitride film 12A are formed.

Thereafter, the substrate W is forwarded to the CVD chamber 35 through the substrate transfer chamber 32 for formation of the high-K dielectric film 13. The substrate W is further forwarded t the thermal processing chamber 36 for crystallization and oxygen-defect compensation processing. After the processing in the thermal processing chamber 36, the substrate W is transported to the cassette module 31A or 31B through the substrate transfer chamber 32.

Meanwhile, each of the processing chambers 33–36 is provided with various cooperating devices, and because of this, the processing chambers requires an area represented in FIG. 38 by a broken line, in addition to the area of the chamber itself. Thereby, it should be noted that available space is substantially limited at the side of the processing chamber close to the substrate transfer chamber 32 because of the reduced separation to adjacent chambers.

Thus, when the substrate processing apparatus 20 of FIG. 3 is to be used in such a cluster-type substrate processing apparatus 30, the processing chamber 12 is connected to the substrate transfer chamber 32 in place of being connected to the substrate transfer unit 27, wherein there arises a problem in that the turbo molecular pump 23B, extending laterally to the processing chamber 21 at the side thereof close to the substrate transfer chamber 32, may cause an interference with the adjacent processing chamber.

In order to conduct fast depressurization of the processing vessel 21, it is necessary that the turbo molecular pump 23B is provided close to the evacuation port 21A, while there exists no space available for this purpose because of the fact that various devices including the transportation robot are provided underneath the substrate transfer chamber 32. Further, there is no available space underneath the processing vessel 21 for the turbo molecular pump 23B because of the fact that various devices including the substrate rotating mechanism 22C are provided underneath the processing vessel 21.

Figure 39A:
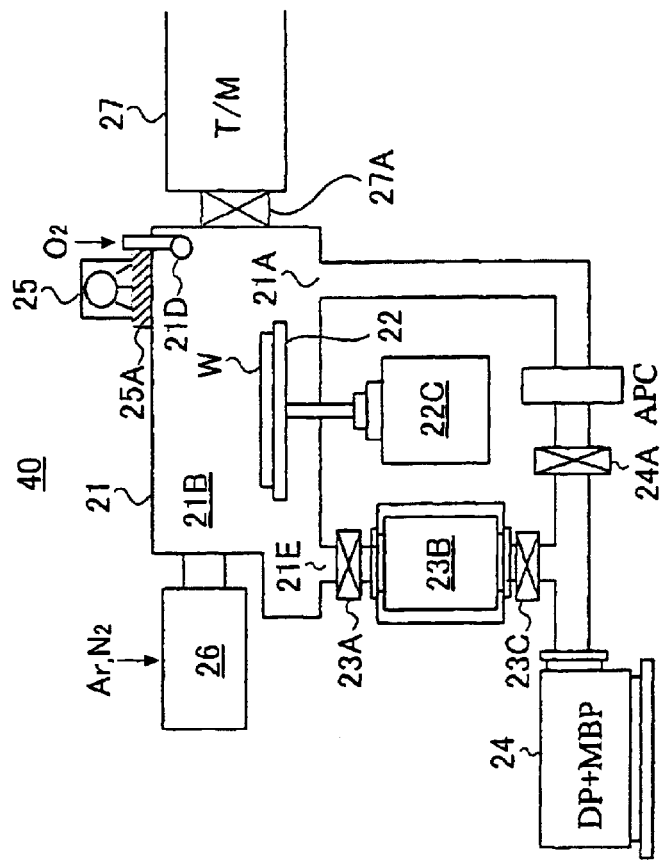
FIGS. 39A and 39B are diagrams showing the construction of a cluster-type substrate processing apparatus according to a fifth embodiment of the present invention.
Figure 39B:
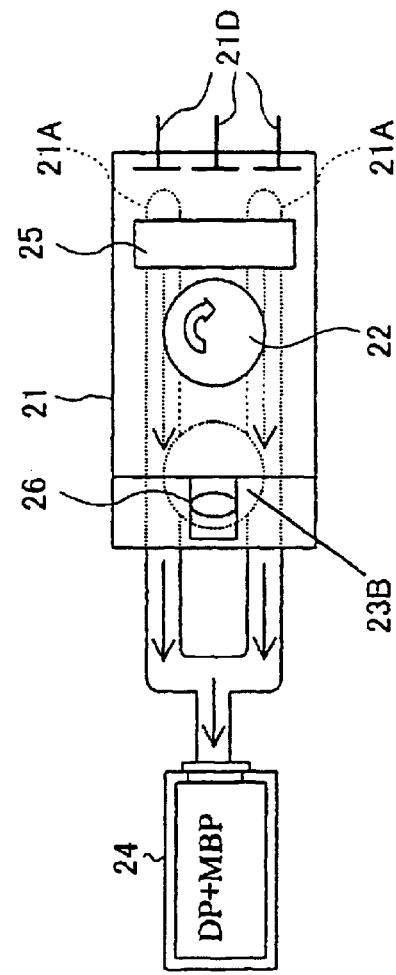

FIGS. 39A and 39B are diagrams showing the construction of a substrate processing apparatus 40 according to a fifth embodiment of the present invention respectively in a side view and a plan view, wherein those parts of FIGS. 39A and 39B explained before are designated by the same reference numerals and the description thereof will be omitted.

Referring to FIGS. 39A and 39B, the substrate processing apparatus 40 disposes the turbo molecular pump 23B at the outer side of the substrate processing vessel 21, in other word the side opposite to the substrate transfer unit 27 where there is an available space when the substrate processing apparatus 40 is used to construct the cluster type substrate processing system such as the one shown in FIG. 38. With this, there is formed an evacuation port 21E in the processing vessel 21 at the outer side thereof, in other words at the side opposite to the substrate transfer chamber. Further, the process gas nozzle 21D and the ultraviolet optical source 25 are provided to the side close to the substrate transfer chamber 27 with respect to the substrate W such that the oxygen radicals are caused to flow along the surface of the substrate W to the evacuation port 21E.

It should be noted that the turbo molecular pump 23B is connected to the bottom part of the processing vessel 21 via the valve 23A in a vertical state, in other words the state in which the inlet and the outlet are aligned vertically. Further, it should be noted that the outlet port of the turbo molecular pump 23B is connected to the evacuation line extending from the evacuation port 21A of the processing vessel 21 to the pump 24 via the valve 24A at the part behind the valve 24A.

In such a substrate processing apparatus 40, in which the turbo molecular pump 23B is located at the side opposite to the side of the substrate transfer unit 27, there is caused no problem of the turbo molecular pump 23B causing interference with the adjacent processing chamber even when the substrate processing apparatus 40 is used to construct the cluster type substrate processing system as in the case of FIG. 38.

Figures 40A, 40B:
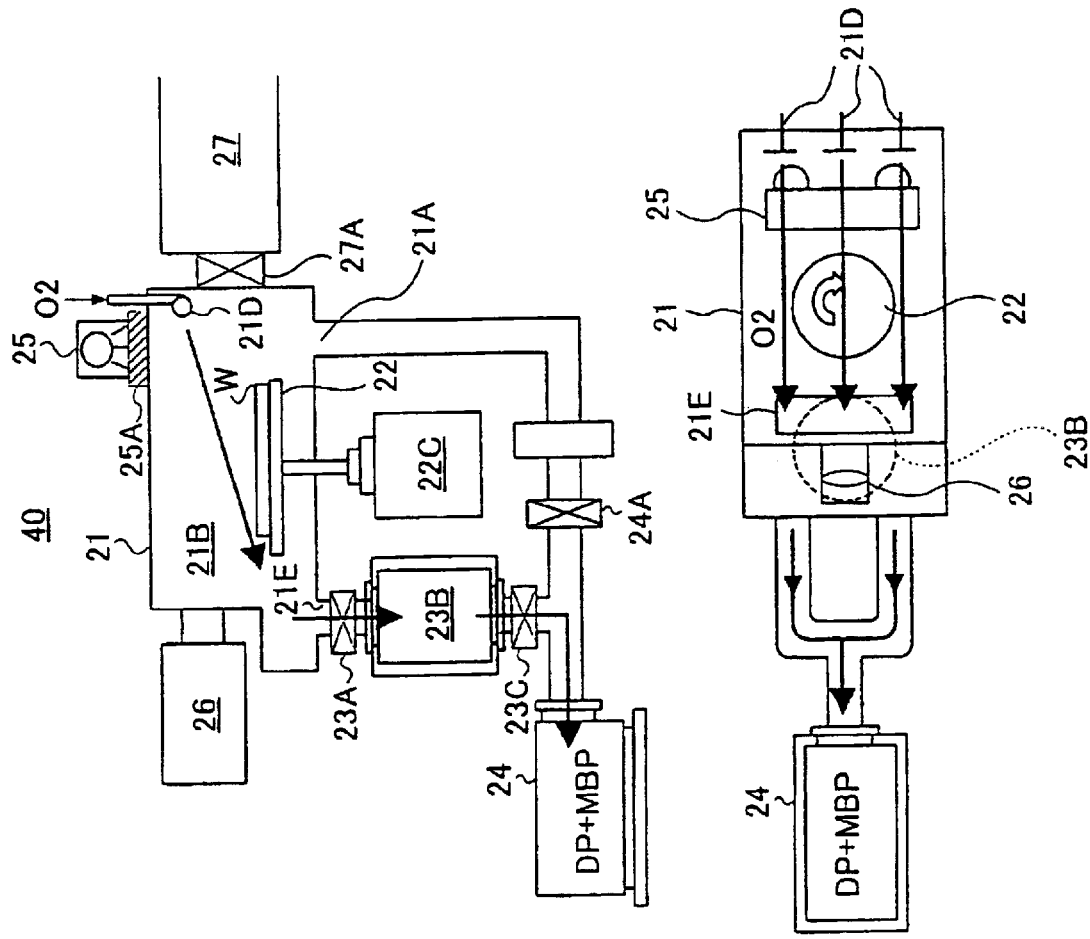
FIGS. 40A and 40B are diagrams showing oxidation processing of a substrate conducted by using the substrate processing system of FIG. 39.

FIGS. 40A and 40B are diagrams showing the process of forming the base oxide film 12 conducted by using the substrate processing apparatus 40.

Referring to FIGS. 40A and 40B, it can be seen that the valves 23A and 23B are opened and the valve 24A is closed in the base oxide film formation process. As a result, the process space 23B is evacuated to the high-degree vacuum state of $1.33 \times 10^{-1} - 1.33 \times 10^{-4}$ Pa ($10^{-3}$–$10^{-6}$ Torr) by the turbo molecular pump 23B ate the foregoing evacuation port 21E, and the oxygen gas is introduced into the process space 21B from the process gas nozzle 21D in this state. Further, by driving the ultraviolet source 25 with a suitable energy while rotating the substrate W by the substrate rotating mechanism 22C, there is caused a flow of oxygen radicals to the evacuation port 12E along the substrate surface, and the substrate surface is oxidized uniformly. With this, it becomes possible to form an extremely thin silicon oxide film having a thickness of 1 nm or less, particularly the thickness of about 0.4 nm corresponding to the film thickness of 2–3 atomic layers, on the silicon substrate surface uniformly and stably and with excellent reproducibility. Of course, it is possible to form a silicon oxide film having a thickness exceeding 1 nm.

FIGS. 41A and 41B show the process of forming the oxynitride film 2A by using the substrate processing apparatus 40 of the present embodiment after the step of FIGS. 40A and 40B by nitriding the surface of the base oxide film 2 thus formed.

Referring to FIGS. 41A and 41B, the valve 23A and 23C are closed and the valve 24A is opened in the nitridation process. With this, the turbo molecular pump 23B is disconnected from the evacuation system and the process space 21B is evacuated directly by the pump 24 to the pressure of 1.33 Pa–13.3 kPa (0.01–100 Torr).

In this state, an Ar gas and a nitrogen gas are supplied to the remove plasma source 26, and nitrogen radicals are formed by applying a high-frequency excitation to the nitrogen gas. The nitrogen radicals thus formed are caused to flow along the surface of the substrate W to the evacuation port 21A, and there is caused a uniform nitridation on the surface of the rotating substrate W. As a result of such a nitridation process the surface of the base oxide film 2 is converted to the oxynitride film 2A.

By using the substrate processing apparatus 40 of the present embodiment for the processing chamber 34 in the cluster type substrate processing system of FIG. 38, it becomes possible to form the high-K dielectric film 13 such as $ZrO_2$, $HfO_2$, $Ta_2O_5$, $ZrSiO_4$, $HfSiO_4$, $Al_2O_3$, and the like, on the base oxide film 2 that includes therein the oxynitride film 2A.

In the explanation above, the substrate processing apparatus 40 was explained with regard to the formation of very thin base oxide film. However, the present invention is not limited to such a specific embodiment and the present invention can be applied to the process of forming a high-quality oxide film, nitride film or oxynitride film on a silicon substrate or a silicon layer with a desired thickness.

[Sixth Embodiment]

In the embodiments above, the technology of forming the base oxide film 2 in the semiconductor device 100 of FIG. 1 to the thickness of about 0.4 nm and further forming the oxynitride film 2A on the surface thereof by using the substrate processing apparatus 20 of FIG. 3. On the other hand, it is also possible to use the substrate processing apparatus 20 to form a thicker oxynitride film, which can be used for a gate insulation film 3A as represented in a semiconductor device 200 of FIG. 42.

Figure 42:
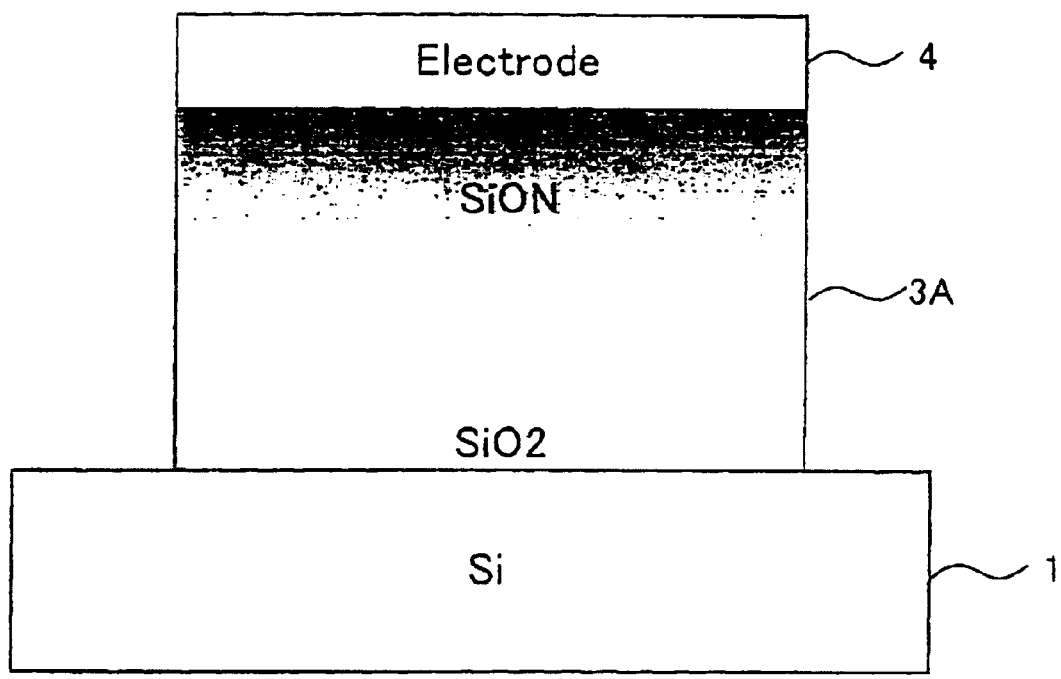
FIG. 42 is a diagram showing the construction of a semiconductor device according to a sixth embodiment of the present invention.

Referring to FIG. 42, the semiconductor device 200 does not use the high-K dielectric gate insulation film 3 and the gate electrode 4 is formed directly on the gate insulation film 3A. In FIG. 42, it should be noted that those parts corresponding to the parts described previously are designated by the same reference numerals and the description thereof will be omitted.

In the semiconductor device 200 of FIG. 42, it is not necessary to use the high-K dielectric film 3, and the gate insulation film can be formed by an oxynitride film which has been handled in the conventional semiconductor process technology. Thereby, the process of fabricating the semiconductor device is facilitated. On the other hand, it is necessary, in the semiconductor device 200 of FIG. 42, to form the gate insulation film 3A, formed of an oxynitride film, to have a thickness of about 1.0 nm or more by using the substrate processing apparatus 20 explained with reference to FIG. 3.

Figure 43:
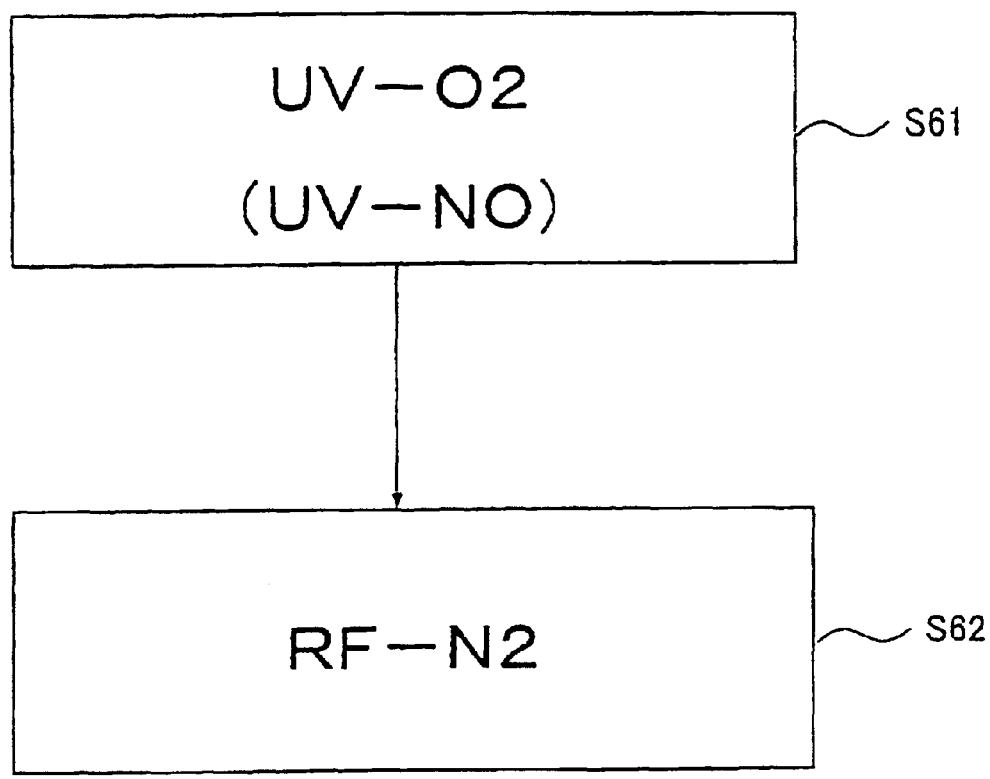
FIG. 43 is a flowchart showing the substrate processing method according to the sixth embodiment.

FIG. 43 shows the process of forming such a thick oxynitride film according to the present embodiment.

Referring to FIG. 43, an oxide film is formed by the UV-$O_2$ processing of the silicon substrate surface in the step 61 by the ultraviolet-excited oxygen radicals, and the oxide film thus formed is nitrided in the step 62 by the RF-$N_2$ processing. In the present invention, on the other hand, the desired film thickness is achieved by conducting the processes in the steps 61 and 62 at a relatively high temperature of about 750° C. In view of the result of the experiment of FIG. 32, the purging step between the step 61 and the step 62 is omitted.

Figure 44:
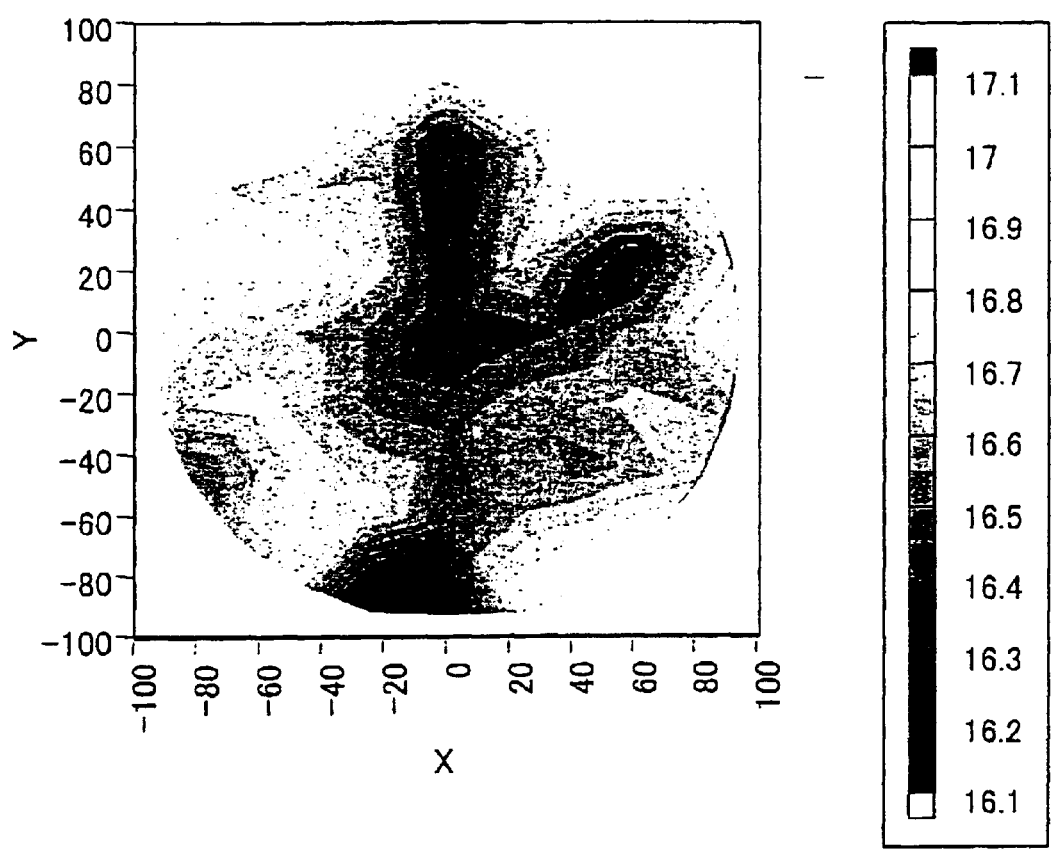
FIG. 44 is a diagram explaining the thickness distribution of an initial oxide film used in the sixth embodiment of the present invention.

FIG. 44 shows the thickness distribution over the silicon substrate surface for the oxide film obtained by the UV-$O_2$ processing in the step 61. It should be noted that the thickness of FIG. 44 is measured by using spectral ellipsometry.

Referring to FIG. 44, the silicon oxide film is formed under the pressure of 400 Pa (3 Torr) at the substrate temperature of 750° C. while rotating the substrate. It can be seen that a very uniform oxide film characterized by the variance σ of 0.72% for the film thickness variation, is obtained.

FIGS. 45A–45C are diagrams showing the process condition of the remote plasma nitridation processing of the oxide film of FIG. 44 conducted in the step 62 of FIG. 43 and the film thickness distribution of the obtained oxynitride film obtained according to the processing.

Referring to FIG. 45A, the plasma nitridation processing is conducted under the pressure of 26.6 kPa (200 mTorr) at the substrate temperature of 750° C. while changing the nitrogen gas flow rate and the Ar gas flow rate in the range illustrated. In FIG. 45A, the line A represents the upper limit of the nitrogen gas flow rate in which ignition of plasma can take place, while the lines B and C represent the pressure range capable of being controlled by using the substrate processing apparatus 20 of FIG. 3.

As represented at the center drawing of FIG. 45B, the distribution of the nitrogen concentration in the film, and hence the distribution of thickness of the oxynitride film, is uniform in the case the Ar gas flow rate and the nitrogen gas flow rate are chosen to be located on the line D. In this case, a very small variance value σ of 0.7% is achieved.

In the case the Ar gas flow rate and the nitrogen gas flow rate are chosen to be located at the position offset from the foregoing line D, on the other hand, there arises a distribution in which the nitrogen concentration increases at the marginal part of the substrate as represented in the left drawing of FIG. 45B or a distribution in which the nitrogen concentration increases at the central part of the substrate as represented in the right drawing of FIG. 45B. In these cases, it can be seen that there occurs increase of the variance σ for the film thickness distribution.

Thus, it can be seen that there appears a convex thickness distribution or a concave thickness distribution in the oxynitride film thickness, and hence a convex nitrogen concentration and a concave nitrogen concentration, in the case the process condition is at the right side of the line D and at the left side of the line D, respectively, while in the case the nitrogen gas flow rate and the Ar gas flow rate are chosen on the line D, a uniform thickness distribution is obtained for the oxynitride film.

Figure 73:
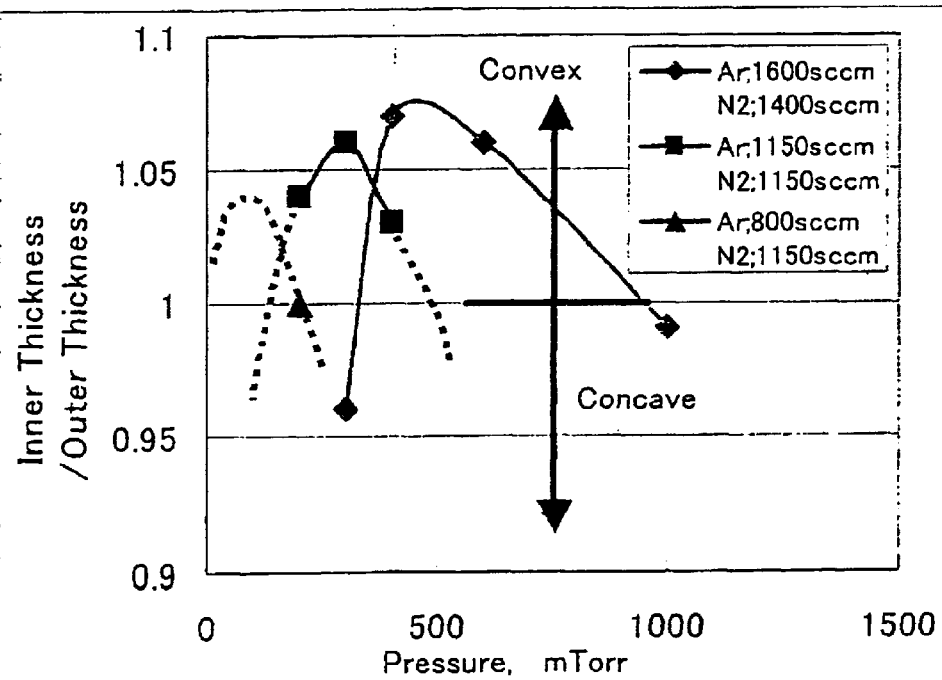
FIG. 73 is a diagram showing the relationship between the process condition and film thickness distribution in the sixth embodiment of the present invention.

FIG. 73 shows the relationship between the uniformity of the RF-$N_2$ processing and the process pressure at the substrate temperature of 750° C., wherein the horizontal axis of FIG. 73 shows the process pressure at the time of the RF-$N_2$ processing, while the vertical axis represents the ratio in which the thickness of the oxynitride film thus subjected to the nitridation processing at the central part is divided by the thickness at the marginal part. Thus, in FIG. 73, an ideal in-plane uniformity is achieved in the case the vertical axis of FIG. 73 is 1. When the vertical axis has increased from 1, this means that the obtained oxynitride film has a convex film thickness distribution. In the case the vertical axis is smaller than 1, this means that the oxynitride film has a concave film thickness distribution.

In FIG. 73, ▲ represents the case the Ar gas flow rate is set to 800 SCCM and the nitrogen gas flow rate is set to 115 SCCM, while ■ represents the case the nitrogen gas flow rate is set to 1150 SCCM. Further, ♦ represents the case in which the Ar gas flow rate is set to 1600 SCCM and the nitrogen gas flow rate is set to 1400 SCCM. Thus, it will be noted that the total flow rate of the process gas, defined as the sum of the Ar gas flow rate and the nitrogen gas flow rate, increases in the order of ▲, ■ and ♦.

Referring to FIG. 73, it can be seen that the film thickness distribution changes from the concave distribution to the convex distribution and again to the concave distribution at the low pressure side when the pressure is changed under the condition that the total flow rate is fixed. Further, it will be noted that there exists two process pressures in each setting of the total flow rate in which an oxynitride film of uniform thickness is obtained. Further, it will be noted that the curves of FIG. 73 shifts in the higher pressure side when the total flow rate is increased. Thus, it will be noted that adjustment of the process pressure can also realize the uniform processing in the RF-$N_2$ processing of the present invention, in addition to the approach of controlling the total flow rate of the Ar gas and the nitrogen gas.

It should be noted that the line D of FIG. 45A explained before corresponds to the point ▲ of FIG. 73. The relationship of FIG. 73 also suggests the existence of another optimum point. This point, however, does not exist in practice because of the too low pressure needed. When this optimum point is to be used, therefore, it is necessary to use a pump of large power capable of handling a large evacuation load.

FIG. 45C shows the relationship between the Ar gas flow rate and the thickness of the obtained oxynitride film for the case the Ar gas flow rate and the nitrogen gas flow rate are controlled on the line D of FIG. 45A. In FIG. 45C, too, the thickness is measured by spectral ellipsometry.

Referring to FIG. 45C, there can be seen an increase of thickness of the oxynitride film with increasing Ar gas flow rate, and hence with increasing nitrogen gas flow rate. This indicates that the thickness of the oxynitride film shown in FIG. 45A or 45B indeed reflects the nitrogen concentration in the film.

Figure 46A:
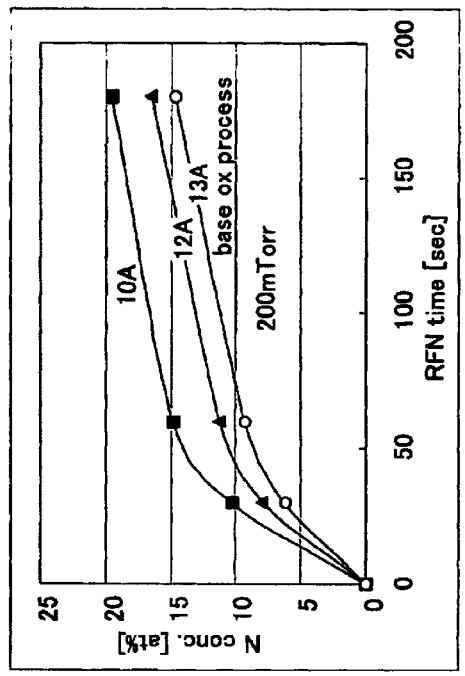
FIGS. 46A–46D are diagrams explaining the kinetics of the oxynitride film formation process according to the sixth embodiment of the present invention.
Figure 46B:
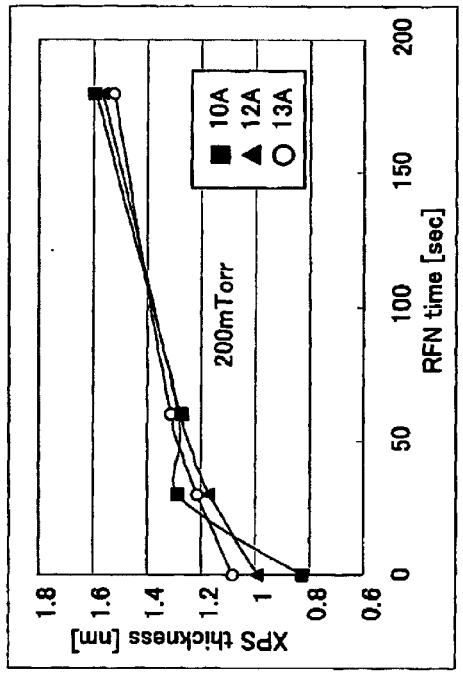
Figure 46C:
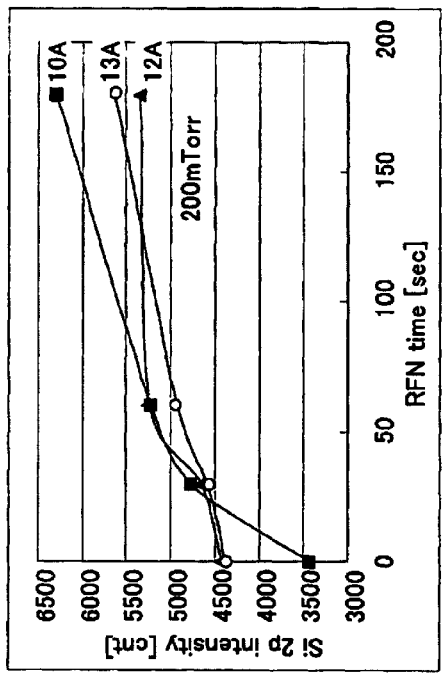
Figure 46D:
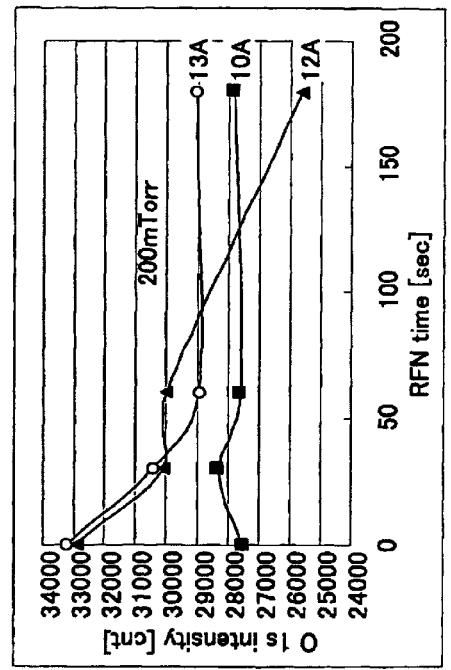

FIGS. 46A–46D show the kinetics of the nitridation process conducted by the RF-$N_2$ processing of the oxide film of FIG. 44 at the temperature of 750° C. under the pressure of 200 mTorr, wherein it should be noted that FIG. 46A represents the relationship between the thickness of the oxynitride film obtained by the XPS analysis and the time of the nitridation processing, FIG. 46B represents the relationship between the concentration of the nitrogen atoms incorporated into the oxynitride film and the time of the nitridation processing, FIG. 46C represents the relationship between the area of the $O_{1s}$ signal peak of the oxynitride film obtained by the XPS analysis and the time of the nitridation processing, and FIG. 46D represents the relationship between the peak area of the Si2p signal and the time of the nitridation processing, for the case the initial thickness of the oxide film is set to 1.0 nm, 1.2 nm and 1.3 nm in terms of the thickness value as measured by a monochrome ellipsometer. In the XPS analysis, the thickness values of about 0.8 nm, 1.0 nm and 1.3 nm are obtained respectively in correspondence to the foregoing thickness values.

Referring to FIGS. 46A–46D, it can be seen that there occurs an increase of thickness and nitrogen concentration in the oxynitride film with the time of the nitridation processing irrespective of the initial thickness, while it can be seen also that there exists a change between the behavior of the $O_{1s}$ signal and the behavior of the $Si_{2p}$ signal with respect to the time of the nitridation processing, depending on the initial thickness of the oxide film.

More specifically, it can be seen that the O1s signal decreases with the nitridation time in the case of the RF-$N_2$ processing of an oxide film having the initial thickness of 1.3 nm, indicating that there is caused dissociation of oxygen during the nitridation processing. In the case of the RF-$N_2$ processing of the oxide film having the initial thickness of 1.0 nm, on the other hand, no substantial change is observed for the $O_{1s}$ signal. This indicates that the oxygen atoms dissociated as a result of introduction of the nitrogen atoms cause diffusion through the thin oxide film having the initial thickness of 1.0 nm and has caused precipitation at the interface to the silicon substrate. Thereby, there is caused a regrowth of an oxide film at such an interface.

In the case of the RF-$N_2$ processing of the oxide film having the initial thickness of 1.3 nm, on the other hand, it is believed that the dissociated oxygen atoms cannot reach the interface between the silicon substrate and the oxide film because of the large initial thickness of the oxide film and are escaping to the outside of the oxynitride film.

With regard to the $Si_{2p}$ signal of FIG. 46D, it can be seen that the $Si_{2p}$ signal does not change much in the case of the oxide film having the initial thickness of 1.3 nm until the duration of 30 seconds has elapsed after the start of the nitridation processing. It is believed that this reflects the situation that the nitrogen atoms introduced into the oxide film cause substitution of the oxygen atoms in the film and the nitrogen atoms to not reach the interface between the oxide film and the silicon substrate. On the other hand, in the case of the oxide film having the initial thickness of 1.0 nm, there is caused an increase of the $Si_{2p}$ signal with the start of the nitridation processing, indicating that there has been caused precipitation of oxygen at the interface between the silicon substrate and the oxide film and associated regrowth of the oxide film.

FIGS. 47A–47D show the case in which the RF-$N_2$ processing of oxide film is conducted according to the process of FIG. 43 under the condition that nitridation reaction is facilitated while sacrificing the uniformity. More specifically, the process pressure is set to 400 mTorr in the experiments of FIGS. 47A–47D. In order to achieve the promotion of the nitridation reaction and uniformity at the same time, on the other hand, it is necessary to use a large capacity pump capable of handling a larger evacuation load is used for the pump 24. Further, a more powerful radical source should be used for the remote radical source 26. This is essentially the same thing explained previous with regard to the case of controlling the process pressure.

Figure 47A:
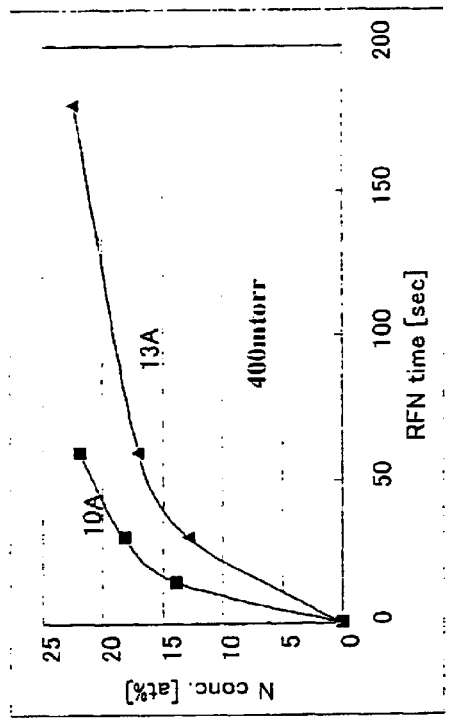
FIGS. 47A–47D are further diagrams explaining the kinetics of the oxynitride film formation process according to the sixth embodiment of the present invention.
Figure 47B:
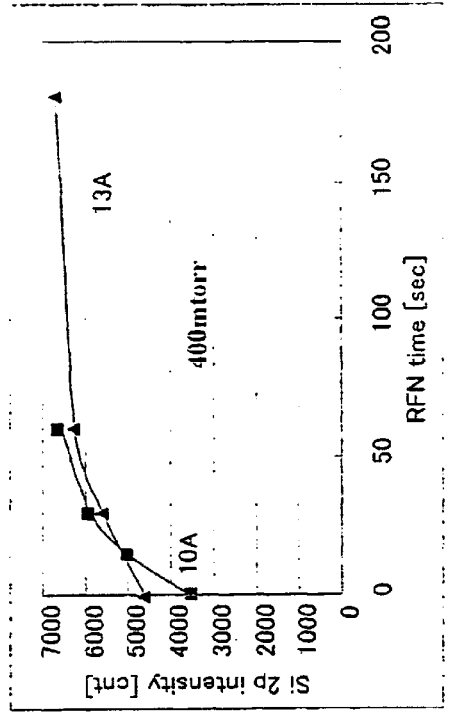
Figure 47C:
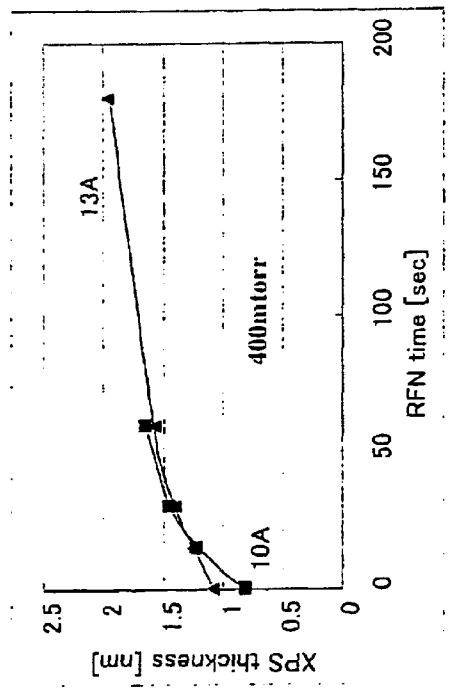
Figure 47D:
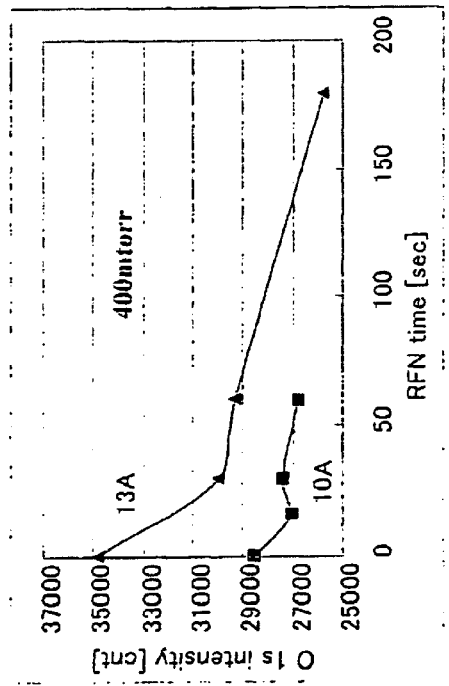

Referring to FIGS. 47A–47D, it can be seen that the O1s signal strength decreases with the start of the RF-$N_2$ processing even in the case of the thin oxide film having the initial thickness of 1.0 nm under the condition in which the process pressure is increased for facilitating the nitridation reaction. Further, as shown in FIG. 47D, it can be seen that the signal strength of the $Si_{2p}$ signal increases monotonously from the beginning of the nitridation process in the case of the oxide film having the initial thickness of 1.3 nm. This indicates that, in the experiments of FIGS. 47A–47D, nitrogen is introduced with an amount corresponding to the nitrogen concentration in the case of the experiments of FIGS. 44A–44D with short time period because of the promoted nitridation reaction and that the nitrogen atoms have reached the interface between the oxide film and the silicon substrate. Thus, when the nitridation processing is conducted under the condition in which the nitridation processing is facilitated, there is a possibility that, while it is certainly possible to reduce the time needed for the nitridation processing, the introduced nitrogen atoms may reach the foregoing interface unless the nitridation time is controlled optimum.

Figure 48A:
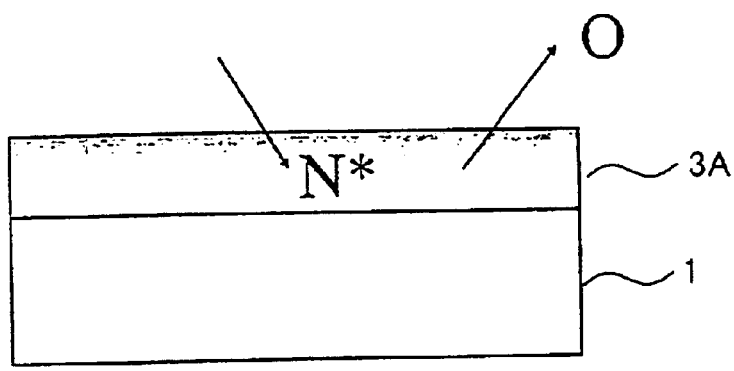
FIGS. 48A and 48B are diagrams showing the nitrogen doping mechanism of an oxide film in the oxynitride film formation process according to the sixth embodiment of the present invention.
Figure 48B:
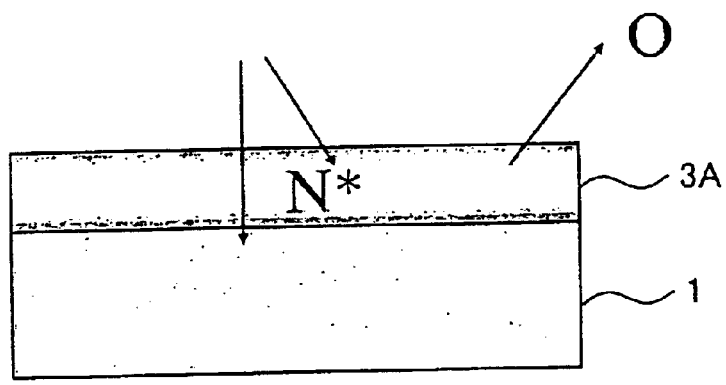

FIG. 48A shows the mechanism of the nitridation processing achieved by the RF-N2 processing of an oxide film estimated from the results of FIGS. 46A–46D and 47A–47D. In FIG. 48A, it should be noted that those parts corresponding to the parts described previously are designated by the same reference numerals and the description thereof will be omitted.

Referring to FIG. 48A, it can be seen that the introduced nitrogen atoms are concentrated to the surface part of the oxide film by controlling the condition of the RF-$N_2$ processing is appropriately, and that the problem of formation of surface states by the nitrogen atoms penetrating to the interface part of the silicon substrate 1 and the oxynitride film 3 is suppressed. See Watanabe, K., et al., J. Appl. Phys. 90, pp.4701, 2001.

In the case the condition of such an RF-$N_2$ processing is inappropriate, on the other hand, there is a possibility that the nitridation reaction proceeds excessively. In such a case, the nitrogen atoms may reach the interface between the silicon substrate 1 and the oxynitride film 3A and interface states may be caused. Because of this, it is preferable that the process of the step 62 of FIG. 43 is finished within 30 seconds.

Thus, in the present embodiment, the number of rotation of the substrate W per minute is set to 20 in the substrate processing apparatus 20 of FIG. 3, and thus, the substrate W is rotated about 10 times during the RF-$N_2$ processing continued for 30 seconds.

Figure 49B:
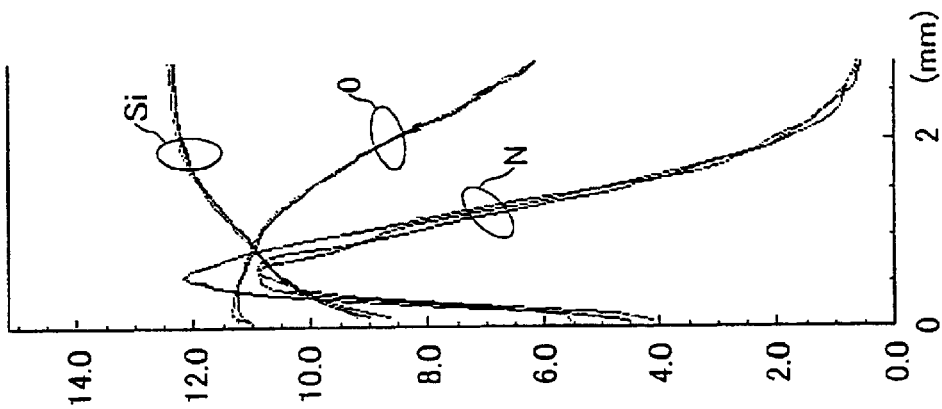
FIGS. 49A and 49B are diagrams showing the distribution of nitrogen atoms in an oxynitride film formed according to the sixth embodiment of the present invention together with the distribution of oxygen atoms and Si atoms.
Figure 49A:
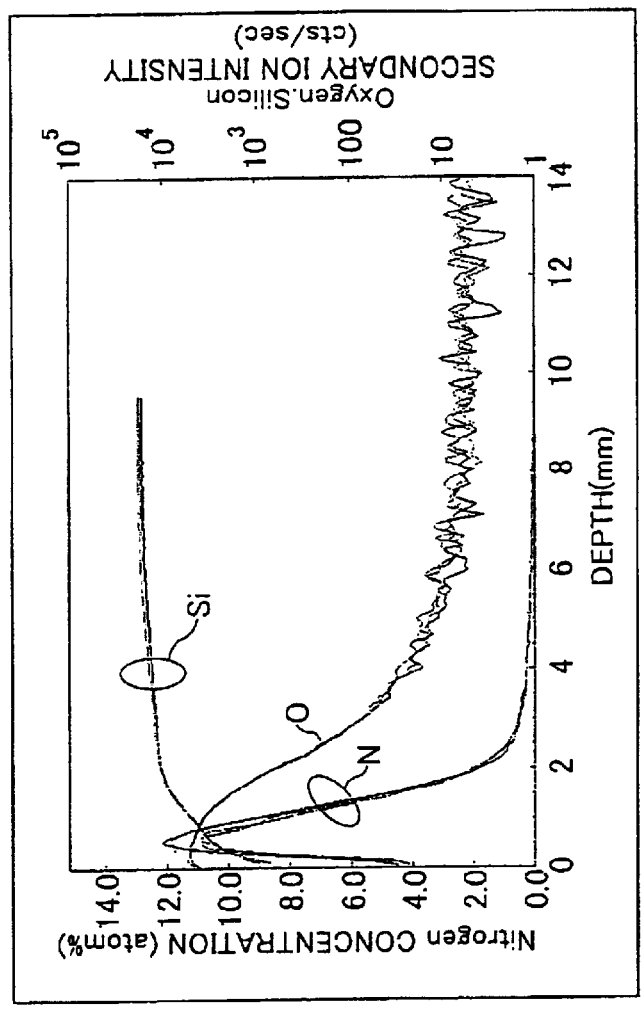

FIGS. 49A and 49B show the depth profile of Si, N and O atoms respectively at the central part (C), intermediate part (M) and marginal part (E) obtained by a SIMS analysis for the case a UV-$O_2$ oxide film having the initial thickness of 1 nm is nitrided for 30 minutes while rotating the substrate, wherein it should be noted that FIG. 49B shows the surface part of the oxynitride film of FIG. 49A in an enlarged scale.

Referring to FIGS. 49A and 49B, it can be seen that the peak of the nitrogen concentration is located at the depth of about 0.5 nm from the surface of the oxynitride film 13A and that excellent in-plane uniformity is achieved. Concentration of nitrogen atoms at the interface between the silicon substrate 1 and the oxynitride film 3A is not recognized.

Figure 50A:
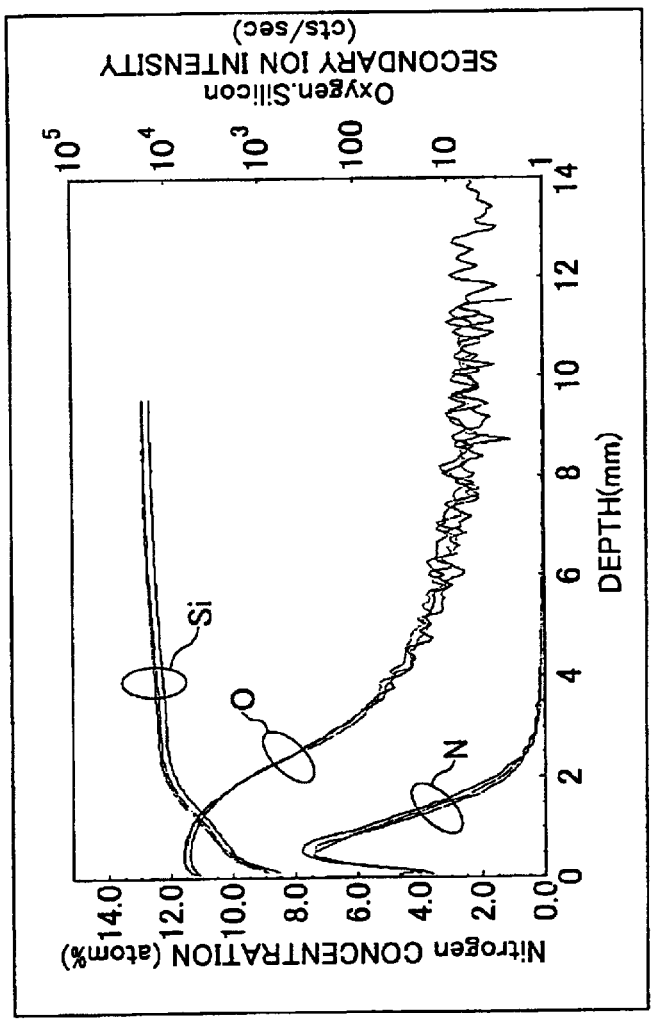
FIGS. 50A and 50B are further diagrams showing the distribution of nitrogen atoms in an oxynitride film formed according to the sixth embodiment of the present invention together with the distribution of oxygen atoms and Si atoms.
Figure 50B:
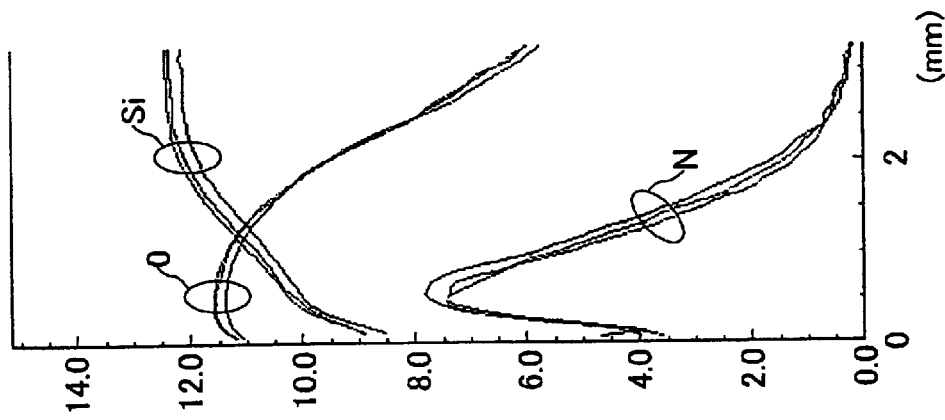

FIGS. 50A and 50B show the depth profile of Si, N and O atoms in the case a UV-$O_2$ film having the initial thickness of 1.3 nm is subjected to the nitridation processing conducted by the RF-$N_2$ processing.

In this case, too, a result similar to the case of FIGS. 49A and 49B is obtained.

[Seventh Embodiment]

Figure 51:
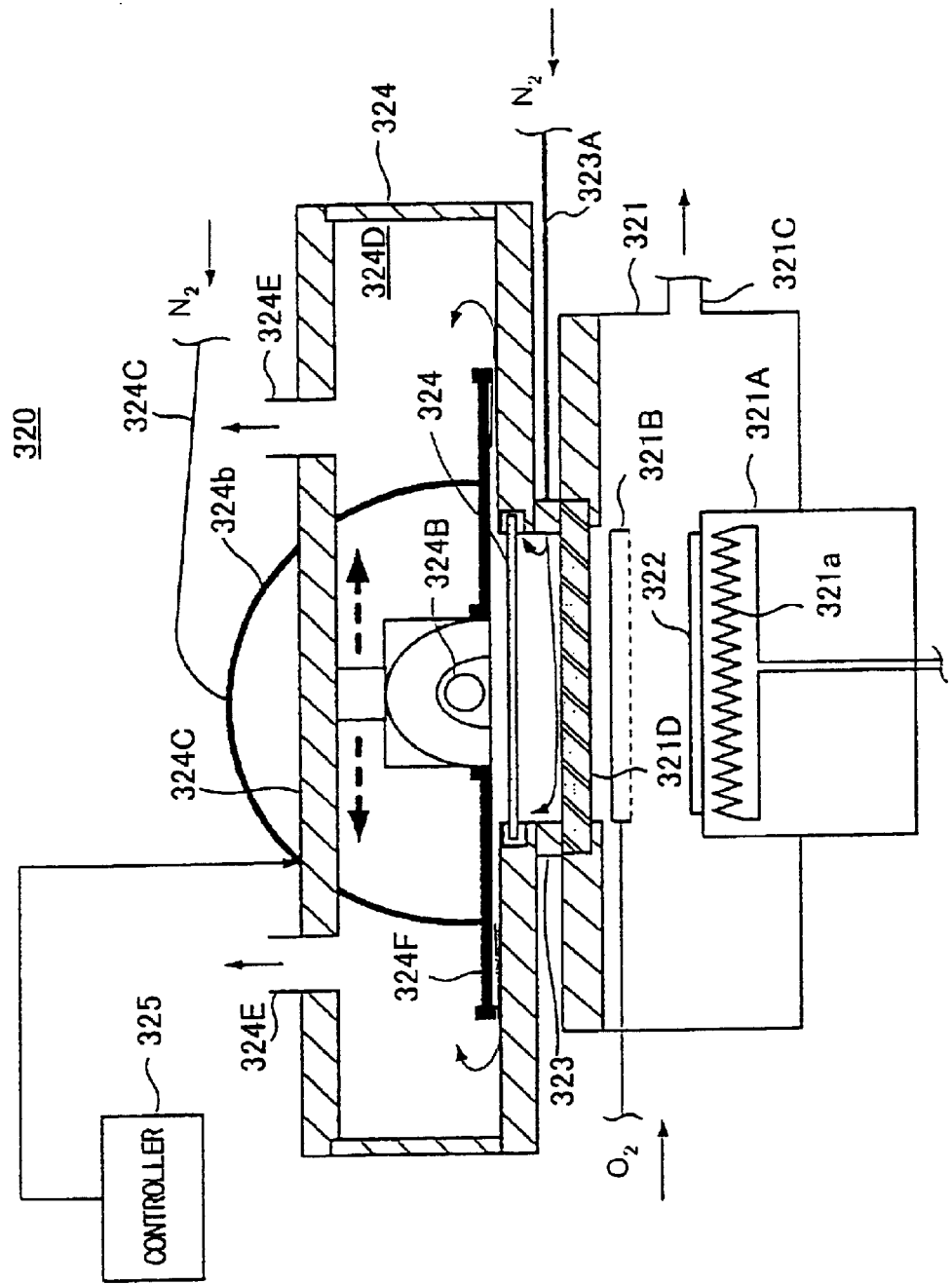
FIG. 51 is a diagram showing the construction of a substrate processing apparatus according to a seventh embodiment of the present invention.

FIG. 51 shows the construction of a substrate processing apparatus 320 according to a seventh embodiment of the present invention.

Referring to FIG. 51, the substrate processing apparatus 320 includes a processing vessel 321 accommodating therein a stage 321A for holding a substrate 322 to be processed, wherein the processing vessel 321 is provided with a showerhead 321B formed of a material transparent to ultraviolet radiation such as quartz such that the showerhead 321B faces the substrate 322 held on the stage 321A. The processing vessel 321 is evacuated from the evacuation port 321C and an oxidizing gas such as oxygen is supplied to the showerhead 321B form an external gas source.

It should be noted that the processing vessel 321 is further provided with an optical window 321D of a material transparent to the ultraviolet radiation such as quartz above the showerhead 321B such that the showerhead 321B and the substrate 322 underneath the showerhead 321B are exposed by the optical window 321D. In the stage 321A, there is provided a heater 321a heating the substrate 322.

On the processing vessel 321, there is provided a ultraviolet exposure apparatus 324 via a coupling part 323 provided in correspondence to the optical window 321D.

It should be noted that the ultraviolet exposure apparatus 324 includes a quartz optical window 324A corresponding to the optical window 321D and a ultraviolet source 324B that radiates the substrate 322 with the ultraviolet radiation via the quartz optical window 324A and the optical window 321D, wherein the ultraviolet source 324B is held by a robot 324C so as to be movable in the direction parallel to the optical window 324A as represented by an arrow in FIG. 51. In the illustrated example, the ultraviolet source 324B is formed of a linear optical source extending perpendicularly to the moving direction. For example, an excimer lamp having the wavelength of 172 nm may be used for the linear optical source.

In the construction of FIG. 51, the connection part 323 is supplied with an inert gas such as $N_2$ from an external gas source (not shown) via a line 323A so as to avoid absorption of the ultraviolet radiation produced by the ultraviolet radiation source 324B by oxygen in the air before the ultraviolet radiation being introduced into the processing vessel 321 through the optical window 321D. The inert gas thus introduced flows into a space 324D inside the ultraviolet exposure apparatus 324 through a gap formed in the mounting part of the optical window 324A of the ultraviolet exposure apparatus 324.

In order to suppress the mixing of oxygen in the air to the region right underneath the ultraviolet source 324B with the driving of the ultraviolet source, there are provided blocking plates 324F at both lateral sides of the ultraviolet source 324B, and the inert gas such as nitrogen is introduced into a narrow gap region having a gap width of about 1 mm or less formed between the optical window 324A facing the ultraviolet source 324B via a pair of lines 324b. In this region, the inert gas from the line 323A is also supplied, and as a result, oxygen that causes absorption of the ultraviolet radiation is effectively purged from this gap region.

The inert gas passed through the blocking plates 324F are flooded into the space 324D and are evacuated to the outside via an evacuation port 324E formed in the ultraviolet exposure apparatus 324.

In the substrate processing apparatus of FIG. 51, it is possible to control the movement or scanning of the ultraviolet source 324B in the ultraviolet exposure apparatus 324 by the robot 324C, and as a result, it becomes possible to control the distribution of film thickness by controlling the ultraviolet radiation dose at the time of forming an oxide film on the surface of the substrate 322 by a UV-$O_2$ process. It should be noted that a controller 325 such as a computer is used to control the robot 324C. Further, the controller 325 also controls the driving of the ultraviolet source 324B.

Figure 52A:
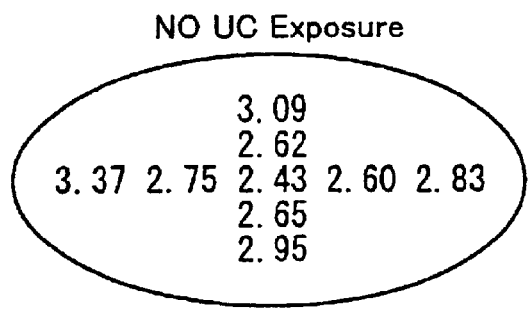
FIGS. 52A–52C are diagrams showing the thickness distribution of an oxide film formed by using the substrate processing apparatus of FIG. 51.
Figure 52B:
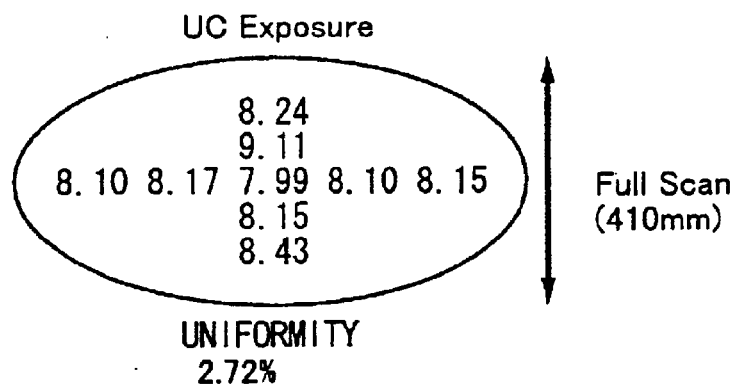
Figure 52C:
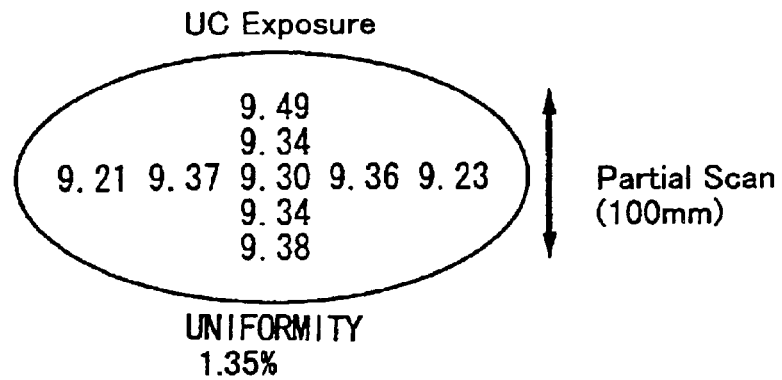

FIGS. 52A–52C are diagrams showing the thickness of an oxide film formed on a silicon substrate by the substrate processing apparatus 320 of FIG. 51 under various conditions, wherein FIGS. 52A–52C show the thickness obtained by ellipsometry in terms of Å. In the experiments of FIGS. 52A–52C, a silicon substrate having an eight-inch diameter is used for the substrate 322 in the state that a native oxide film on the substrate surface is removed by a surface preparation process to be explained later. In each of the experiments of FIGS. 52A–52C, the internal pressure inside the processing vessel 321 is set to about 0.7 kPa (5 Torr) and the substrate temperature is set to 300° C.

It should be noted that the illustrated result is for the case in which an oxygen gas is supplied to the processing vessel 321 for 5 minutes with the flow rate of 1 SLM, and FIG. 51A shows the case in which no ultraviolet radiation is made, while FIGS. 51B and 51C show the cases in which the ultraviolet radiation is made by the ultraviolet source 324B such that the luminance flux density becomes 30 mW/cm$^2$ right underneath the optical source. FIG. 52B shows the case in which the foregoing ultraviolet source 324B is caused to scan uniformly within the range of 410 mm such that the entire surface of the substrate 322 uniformly.

Referring to FIG. 52A, the oxide film formed on the silicon substrate has a thickness of about 0.2–0.3 nm in the case no ultraviolet radiation is made, and thus, there is caused no substantial film formation. In the case of FIG. 52B, on the other hand, it can be seen that there is formed an oxide film with the thickness of about 0.8 nm on the surface of the silicon substrate. In the case of FIG. 52B, it is also noted that there is caused a decrease of oxide film thickness at the central part of the 8-inch silicon substrate 322 in spite of the fact that the scanning of the ultraviolet source 400 is conducted uniformly over the range of 400 mm. As a result, the thickness variation of the oxide film thus formed on the silicon substrate has a relatively large value of 2.72% in terms of variance. It is believed that this reflects the specific peculiarity of the substrate processing apparatus that has been used for the experiments.

FIG. 52C shows, on the other hand, the thickness distribution of the oxide film for the case the ultraviolet source 324B is caused to scan over the central part of the silicon substrate 322 with a limited stroke range of 100 mm.

Referring to FIG. 52C, it can be seen that the thickness of the oxide film thus formed falls in the range of 0.92–0.93 nm and that the film thickness variation is reduced to 1.35% in terms of variance.

Figure 53:
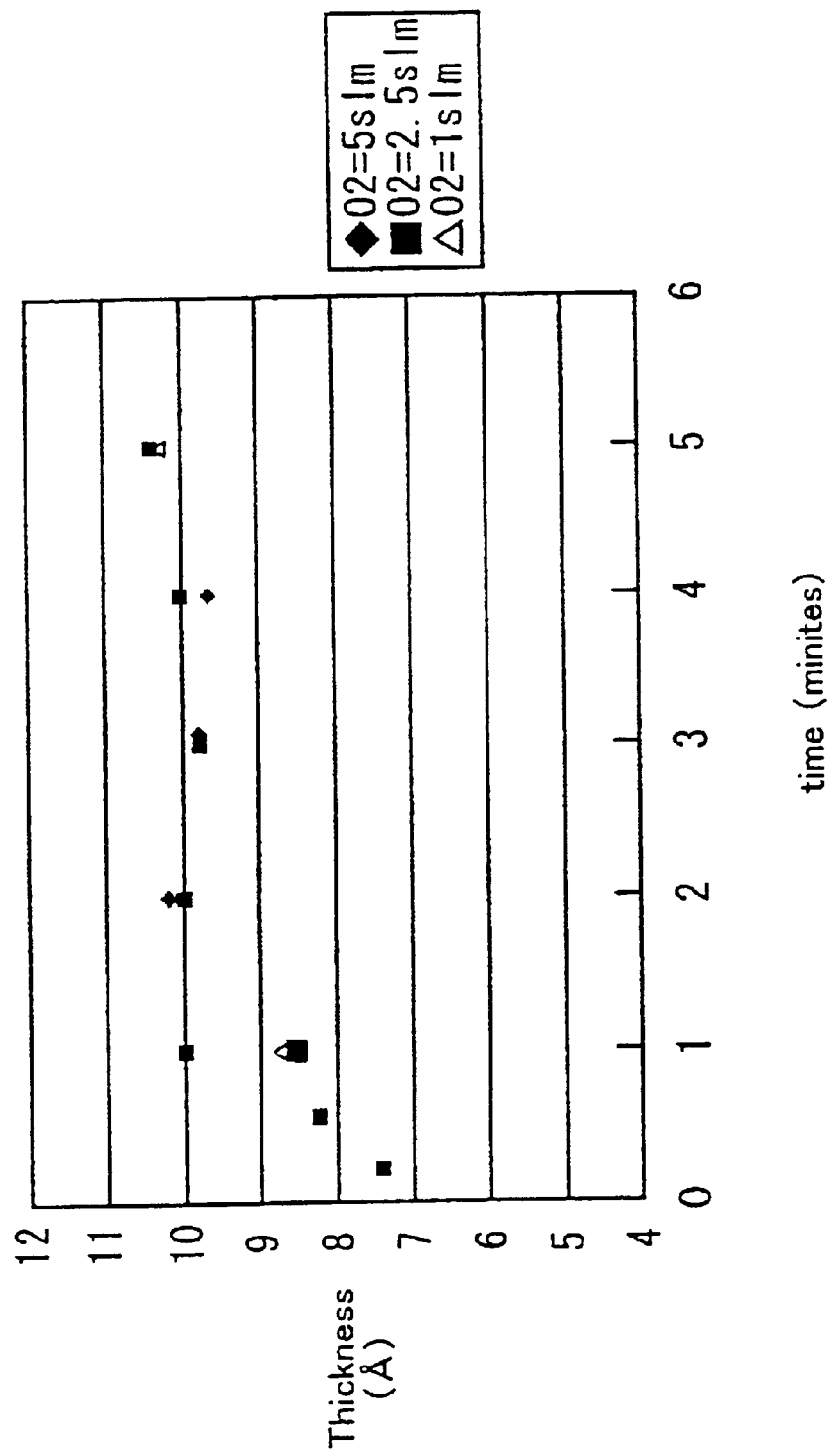
FIG. 53 is a diagram showing the relationship between the processing time and film thickness for an oxide film formed by the substrate processing apparatus of FIG. 51.

FIG. 53 shows the relationship between the ultraviolet exposure time and the thickness of the oxide film formed as a result in the experiments of FIGS. 52A–52C for the case the flow rate of the oxygen gas introduced into the processing vessel 321 is changed variously.

As can be seen from FIG. 53, the thickness of the oxide film formed as a result of the processing does not depend on the oxygen flow rate substantially and that there appears saturation at the value of about 1 nm when a time of 1 minute has elapsed. When the exposure time is shorter than 1 minute, the film thickness increases with the exposure time. The result of FIG. 53 shows that a very short time processing is sufficient for forming a thin oxide film to be used as the base oxide film on the silicon substrate surface by using the substrate processing apparatus 320 of FIG. 51.

FIGS. 54A–54E are diagrams showing the film thickness distribution of an oxide film obtained for the case the inner pressure of the processing vessel is set to about 0.7 kPa (5 Torr) and the substrate temperature is set to 450° C. in the substrate processing apparatus 320 of FIG. 51 while supplying an oxygen gas with a flow rate of 1 SLM and causing a scanning of the ultraviolet source 24B within the range of 100 mm. In the drawings, the thickness of the oxide film is represented in terms of angstroms. Further, the silicon substrate is represented by a rectangle for the sake of simplicity.

FIG. 54A shows the case in which the scanning is made within the range of ±50 mm with respect to the center of the substrate, wherein it can be seen that there is a tendency of the oxide film thickness increasing from the center of the substrate toward upward direction along the y axis and toward the rightward direction along the x axis. In this case, the variation of the oxide film thickness is 3.73% in terms of variance.

FIG. 54B, on the other hand, shows the thickness distribution of the same oxide film represented in terms of angstroms for the case the origin of the scanning is displaced in the downward direction from the center of the substrate along the y axis with the distance of 12.5 mm. As can be seen from FIG. 54B, the film thickness variation has been reduced to 3.07% in terms of variance.

FIG. 54C, on the other hand, shows the distribution of the oxide film thickness represented in terms of angstroms for the case the origin of the scanning is displaced from the center of the substrate in the downward direction along the y axis by the distance of 25.0 mm. As can be seen from FIG. 54C, the variation of thickness of the oxide film is 3.07% in terms of variance similarly to the case of FIG. 54B.

Further, FIG. 54D shows the distribution of the oxide film thickness represented in terms of angstroms for the case the origin of the scanning is displaced in the downward direction along the y axis from the center of the substrate by the distance of 37.5 mm. In this case, the film thickness variation of the oxide film is reduced to 2.70% in terms of variance.

In the case the origin of scanning is displaced from the center of the substrate in the downward direction along the y-axis by the distance of 50.0 mm as shown in FIG. 54E, the variation of the oxide film thickness is increased to 5.08% in terms of variance.

From this, it is concluded that the film thickness variation of the oxide film formed on the substrate 3222 can be minimized also by optimizing the origin of scanning of the ultraviolet source 324B with respect to the substrate in the substrate processing apparatus 320 of FIG. 51.

FIGS. 55A–55E show the distribution of the film thickness of an oxide film formed in the substrate processing apparatus 320 of FIG. 51 for the case of setting the scanning distance of the ultraviolet source 324B to 100 mm and setting the origin of the scanning at the location offset from the center of the substrate 322 in the downward direction along the y axis with the distance of 37.5 mm and by changing the luminance flux density to 3 mW/cm$^2$, 6 mW/cm$^2$, 12 mW/cm$^2$, 18 mW/cm$^2$ and 24 mW/cm$^2$, respectively.

Referring to FIGS. 55A–55E, it can be seen that the variation of the film thickness is minimum in the case the luminance flux density is set to 3 W/cm$^2$ and that the variation of the oxide film thickness increases with increasing amount of the luminance flux density.

The result of FIGS. 55A–55E shows that the thickness variation of the oxide film can be minimized also by optimizing the luminance flux density of the ultraviolet source 324B.

FIGS. 56A and 56B show comparative examples in which FIG. 56A shows the case of forming an oxide film under the condition identical with those of FIGS. 55A–55E except that no ultraviolet irradiation is made, while FIG. 56B shows the case of forming an oxide film by a conventional rapid thermal oxidation (RTO) process. In any of these cases, a film thickness variation exceeding 4% is observed.

Figure 57:
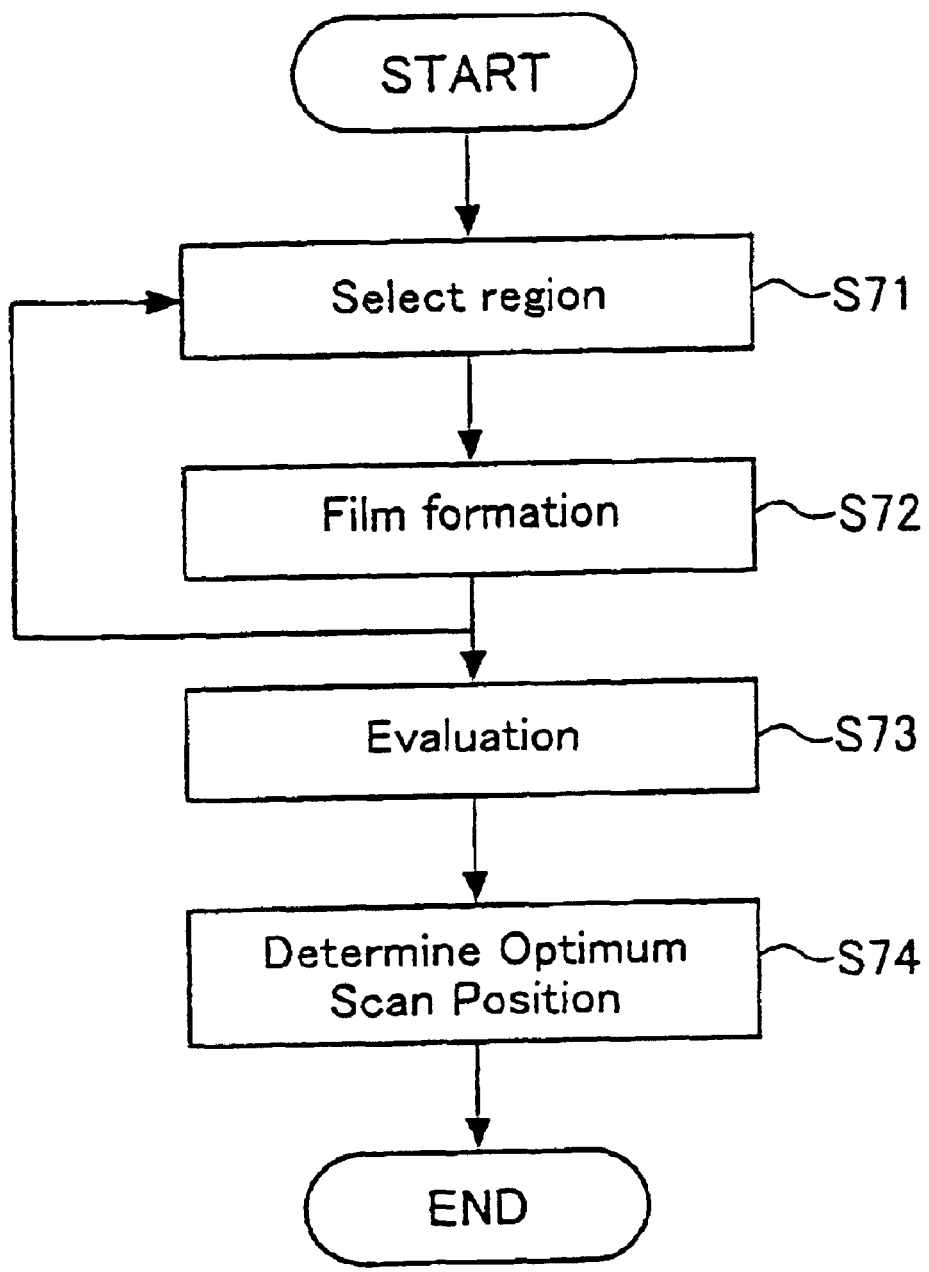
FIG. 57 is a flowchart showing the procedure of determining the optimum scanning region in the substrate processing apparatus of FIG. 51.
Figure 58:
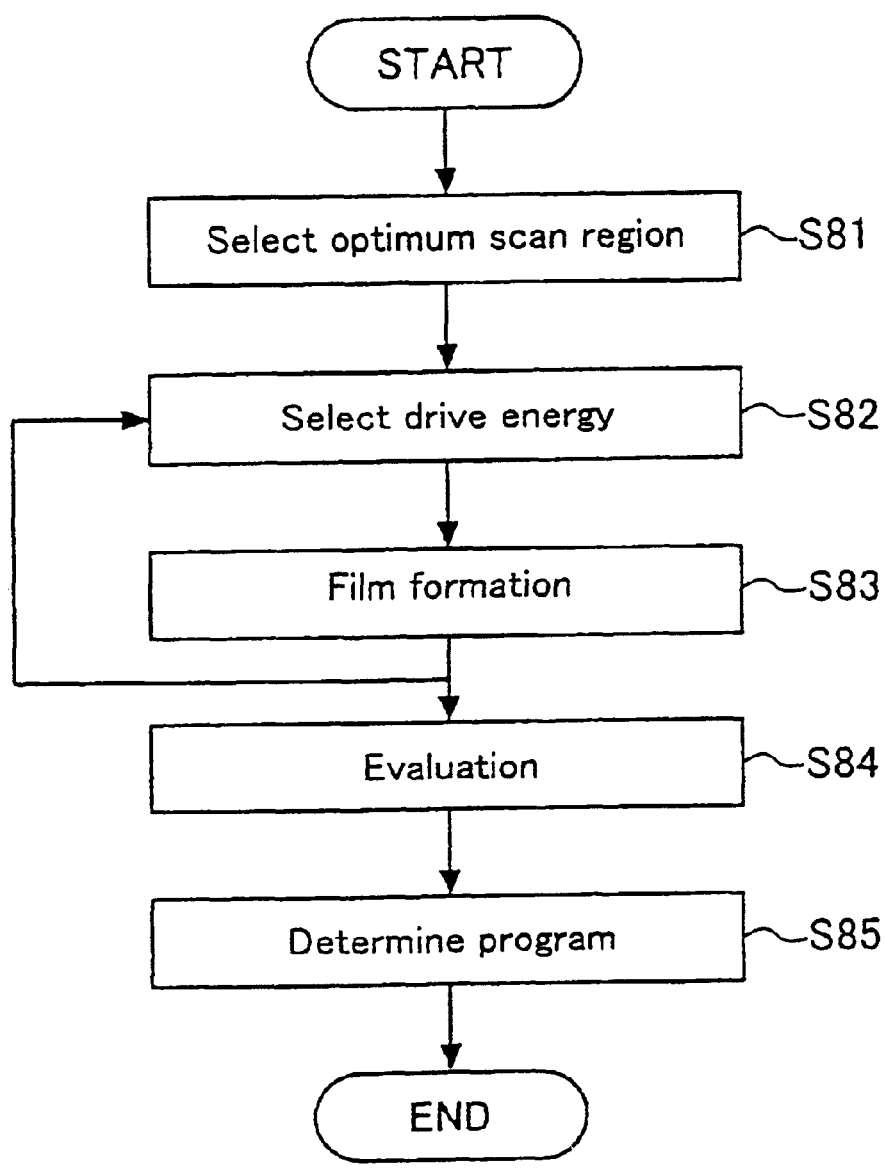
FIG. 58 is a flowchart showing the procedure of determining the optimum drive energy of optical source in the substrate processing apparatus of FIG. 51.

FIGS. 57 and 58 show a flowchart of seeking the optimum condition of substrate processing conducted in the substrate processing apparatus 320 of FIG. 51 in view of the foregoing results, wherein FIG. 57 represents the flowchart for seeking the optimum scanning region while FIG. 58 represents the flow chart for seeking the optimum luminance flux density.

Referring to FIG. 57, an arbitrary region on the substrate is specified in the step 71 and the substrate 322 is introduced into the substrate processing apparatus 320 in the step 72 and the ultraviolet radiation source 324B is caused to scan the specified region of the substrate 322. Thereby, an oxide film is formed. Further, by repeating the steps 71 and 72, an oxide film is formed on a new substrate 322 in each cycle in the state that the foregoing region is displaced.

Next, in the step 73, the thickness distribution is obtained for the oxide films obtained in the experiments and the region that minimizes the thickness distribution becomes minimum is determined in the step 74.

After the search of the optimum scanning condition of FIG. 57, the search of the optimum illumination condition shown in FIG. 58 is conducted.

Referring to FIG. 58, the optimum scanning region determined by the procedure of FIG. 57 is specified in the step 81 and the driving energy of the ultraviolet source 224B is specified in the step 82. Next, in the step 83, the substrate 322 is introduced into the substrate processing apparatus 320 and the ultraviolet source 324B is caused to scan over the specified optimum region of the substrate 322 while being driven with the driving energy specified in the step 312. Further, by repeating the steps 312 and 313, an oxide film is formed on a new substrate 322 in each cycle in the state that the foregoing driving energy is changed.

Further, in the step 314, the thickness distribution of the oxide film obtained in each experiment is evaluated and the optimum driving energy of the ultraviolet source 324B that minimizes the film thickness variation is determined. Further, in the step 315, the program for controlling the ultraviolet source 324B of the substrate processing apparatus 320 is determined such that the film formation is conducted at such an optimized energy.

Thus, the controller 325 controls the robot 324C and the ultraviolet source 324B, and as a result, the ultraviolet source 324B scans the optimum region of the substrate with optimum energy, and it becomes possible to form an extremely thin and uniform radical oxide film on the substrate 324 with the thickness of 0.3–1.5 nm, preferably 1 nm or less, more preferably 0.8 nm or less, and most preferably with the thickness of 0.4 nm.

Similarly to the case explained before, there appears a slowdown of oxide film growth at the thickness of 0.4 nm or 2–3 atomic layers in the case an oxide film is formed on a silicon substrate according to such a UV-$O_2$ processing by using the substrate processing apparatus 320 of FIG. 51. Thus, the oxide film of this thickness can be formed stably and with excellent reproducibility. By combining the oxide film thus formed with a high-K dielectric film, it becomes possible to realize an extremely fine high-speed MOS transistor having a reduced effective thickness for the gate insulation film.

In the present embodiment, explanation has been made for the case the oxide film is the one formed by the UV-$O_2$ processing. However, the oxide film is not limited to such a film but may be any oxide film as long as it is formed with precision oxidation process conducted under a low radical density.

[Eighth Embodiment]

Figure 59:
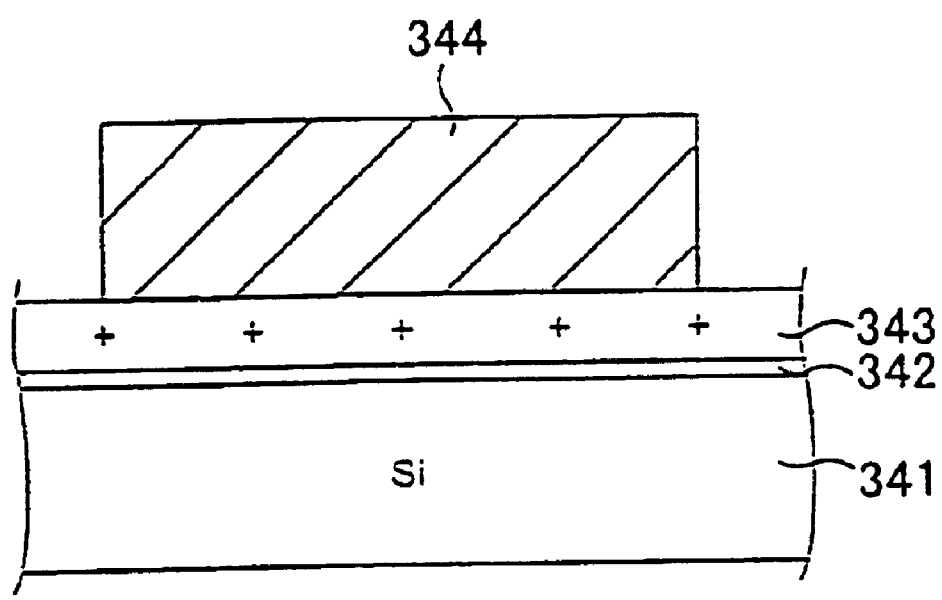
FIG. 59 is a diagram showing the construction of a semiconductor device according to an eighth embodiment of the present invention.

FIG. 59 shows the construction of a MOS transistor 340 according to an eighth embodiment of the present invention.

Referring to FIG. 59, a base oxide film 342 of a silicon oxide film having a thickness of 2–3 atomic layers is formed on a silicon substrate 341, and a so-called high-K dielectric film 343 such as $ZrO_2$, $HfO_2$, $Ta_2O_5$, $Al_2O_3$, $ZrSiO_4$ or $HfSiO_4$ is formed on the base oxide film 342. Further, a gate electrode 344 of polysilicon or a metal is formed on the high-K dielectric film 343. Further, while the illustration is omitted, diffusion regions are formed in the silicon substrate 341 at both lateral sides of the gate electrode 344.

Figure 60:
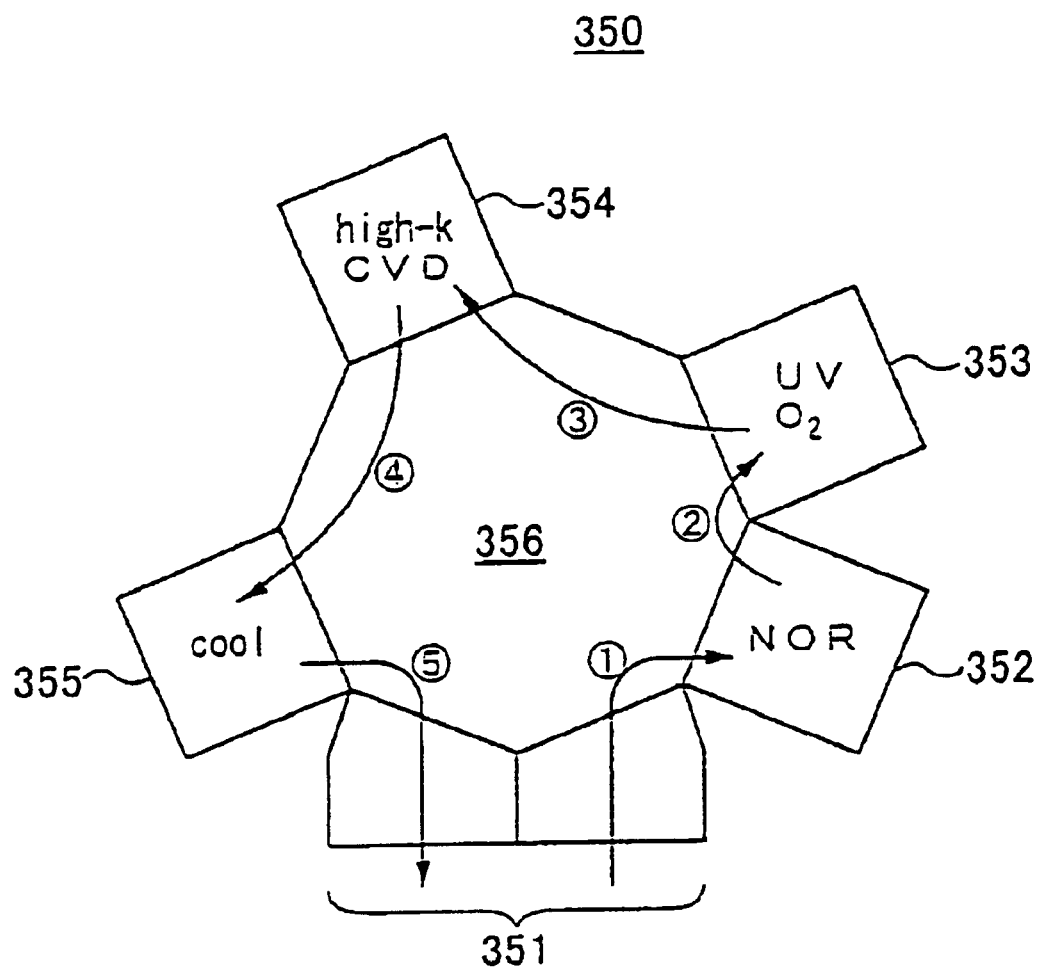
FIG. 60 is a diagram showing the construction of a cluster-type substrate processing system used in the eight embodiment.

FIG. 60 shows the construction of a cluster-type substrate processing system 350 used for fabricating the MOS transistor of FIG. 59.

Referring to FIG. 60, the substrate processing system 350 is an apparatus configured to form a cluster system and includes a load lock chamber 351 for loading and unloading a substrate, a preprocessing chamber 352 used for removing native oxide film and carbon contamination from the substrate surface, a UV-$O_2$ processing chamber 353 formed of the substrate processing apparatus 320 of FIG. 51, a CVD processing chamber 354 for depositing a high-K dielectric film such as $Ta_2O_5$, $Al_2O_3$, $ZrO_2$, $ZrSiO_4$, $HfSiO_4$, and the like on a substrate, and a cooling chamber 355 cooling the substrate in the state that the chambers 351–355 are connected to a vacuum transfer chamber 356, wherein the vacuum transfer chamber 356 is provided with a transfer arm (not shown).

In operation, the substrate introduced into the load/lock chamber 351 is transported to the preprocessing chamber 352 along a path (1) and native oxide film or carbon contamination is removed therefrom. Next, the substrate thus processed in the preprocessing chamber 352 is transported to the UV-O2 processing chamber 353 along a path (2) and the base oxide film 342 of FIG. 59 is formed by the substrate processing apparatus 320 of FIG. 51 with a uniform thickness of 2–3 atomic layers.

The substrate thus formed with the base oxide film in the UV-$O_2$ processing chamber 353 is then introduced into the CVD processing chamber 354 along a path (3) and the high-K dielectric gate insulation film 344 shown in FIG. 59 is formed on the base oxide film.

The substrate is then transported from the CVD chamber 344 to the cooling chamber 355 along a path (4) for cooling, and is then returned to the load lock chamber 351 for transportation to the outside.

In the substrate processing system 350 of FIG. 60, it is also possible to provide a preprocessing chamber for conducting a planarization processing in an Ar atmosphere by way of high temperature annealing process.

Figure 61:
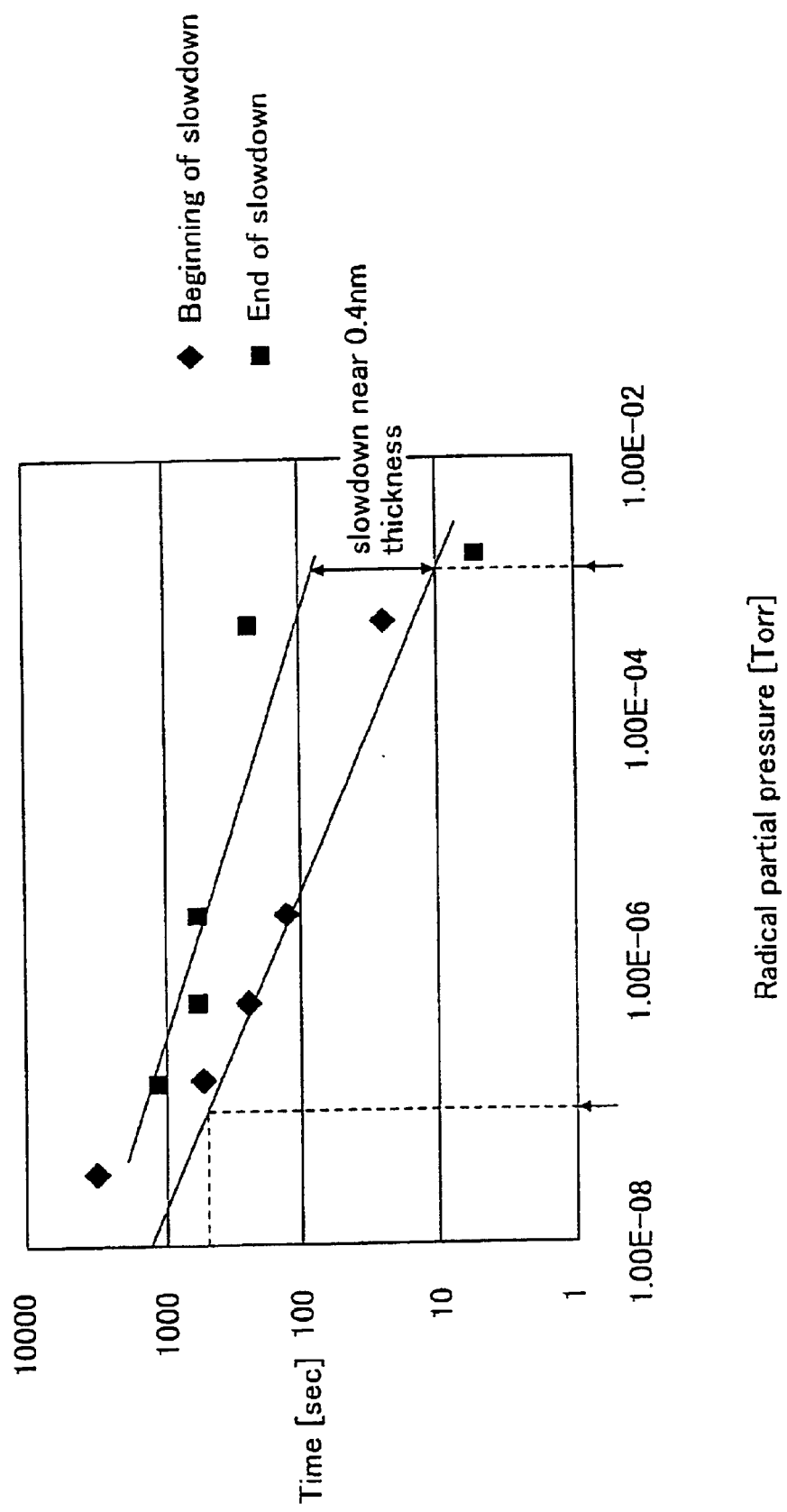
FIG. 61 is a diagram for determining the process conduction used in the eight embodiment.

FIG. 61 is a diagram explaining the radical oxidation processing conducted in the UV-$O_2$ processing chamber 53.

FIG. 61 shows the condition of the radical oxidation processing conducted in the UV-$O_2$ processing chamber 53.

Referring to FIG. 61, the horizontal axis shows a logarithmic representation of the partial pressure of the oxygen radicals excited in the processing vessel 321 of FIG. 51 by the ultraviolet source 324B in terms of Torr. Further, the vertical axis represents the process time until the slowdown phenomenon shown in FIG. 8 appears after the start of the processing and also the process time until such a slowdown phenomenon vanishes, in terms of logarithmic scale. It should be noted that the oxygen partial pressure on the horizontal axis corresponds to the oxygen radical density and is determined by the driving power or ultraviolet radiation power of the ultraviolet source 324B and the ultraviolet wavelength.

Hereinafter, the relationship between the ultraviolet radiation power and the radical density will be explained for the case of using the wavelength of 172 nm.

In the substrate processing apparatus 320 of FIG. 51, and thus in the processing chamber 353 of the substrate processing system 350 of FIG. 60, the ultraviolet source 324B produces a photon flux of $4.34 \times 10^{16}/cm^2 \cdot sec$ in the case a ultraviolet source producing the ultraviolet radiation power of 50 mW/$cm^2$ at the location right underneath the window in the state of 100% driving state is used for the ultraviolet source 343B and an oxygen gas is supplied to the processing vessel 321 with a flow rate of 150 SCCM under the process pressure of 0.02 Torr (2.26 Pa). Assuming the case of using a tubular lamp having a width of 2 cm for the optical source 323 and irradiating a silicon wafer of 20 cm diameter with such a lamp, the average photon flux on the silicon wafer surface becomes $4.34 \times 10^{15}$ $cm^{-2}$, which is about 1/10 the photon flux value noted before.

On the other hand, it is known that an oxygen molecule has an absorption cross-sectional area of $6 \times 10^{-19}$ $cm^2$ with regard to the ultraviolet radiation of the 172 nm wavelength. Thus, the transmittance of the ultraviolet radiation in the process ambient, which is given by the equation $I/I_0 = \exp(-\sigma n x)$, is obtained as 0.9916. Here, it is assumed that the process pressure is 0.02 Torr (2.66 Pa) and the gas molecule density n in the process ambient is assumed to be $7.05 \times 10^{14}$ $cm^{-3}$. Further, it is assumed that the ultraviolet radiation propagates the distance of 20 cm in the processing vessel 321.

Thus, the amount of the radicals corresponding to the absorption of the ultraviolet radiation propagating in the processing vessel 321 for the distance of 20 cm is evaluated to be $3.65 \times 10^{13}$ $cm^{-2} \cdot sec$ by multiplying the factor of 0.0084 to the foregoing value of the photon flux of $4.34 \times 10^{15}$ $cm^{-2}$, and oxygen radicals are formed in the processing vessel 321 with this rate.

On the other hand, the flux of the oxygen gas in the processing vessel 321 becomes $7.98 \times 10^{-3}$ $cc/cm^2 \cdot sec$ in terms of volume in the standard state, assuming that the shower head 21B has the area of 314 $cm^2$. In terms of the number of molecules, this value is converted to the value of $2.138 \times 10^{17}$ $cm^{-2} \cdot sec$. Thus, from the ratio of the flux values of $3.65 \times 10^{13}/2.138 \times 10^{17} = 1.71 \times 10^{-4}$, the partial pressure of the oxygen radicals formed under the process pressure of 0.02 Torr (2.66 Pa) is obtained as $3.42 \times 10^{-6}$ Torr (=$1.71 \times 10^{-4} \times 0.02$).

Thus, it is evaluated that the concentration of the oxygen radicals formed in the processing vessel 321 becomes about $3.42 \times 10-6$ Torr ($4.54 \times 10-4$ Pa) in the case of the optical power of 100% and the process pressure (=internal pressure of the processing vessel) of 0.02 Torr (2.66 Pa). By conducting similar procedures, the radical density is calculated also for other various conditions.

FIG. 61 represents the relationship between the radical density, and hence the radical partial pressure, and the duration of the slowdown phenomenon of FIG. 5 explained before after the start of the substrate processing is represented.

Referring to FIG. 61, it can be seen that the slowdown effect appears immediately after the start of the process similarly to the case of FIG. 5 in the event the radical density in the processing vessel 321 is large. In the case the radical density is small, on the other hand, the slowdown phenomenon appears after a long time has elapsed after start of the process. This corresponds to the situation that the growth rate of the oxide film is large in the case of large radical density and the stationary thickness of 0.4 nm is reached in short time, while in the case the radical density is small, it takes a long time until the foregoing stationary thickness of 0.4 nm is achieved because of the small oxide film growth rate.

Similarly, the slowdown duration defined as the duration after the appearance of the slowdown phenomenon up to the vanishing of the slowdown phenomenon changes also with the radical density such that the slowdown duration is decreased when the radical density is large and is increased when the radical density is small.

From the viewpoint of the actual process of semiconductor device production, there occurs a problem of decrease of fabrication throughput when the process time until the occurrence of the foregoing slowdown effect is too long. Thus, there should be a lower limit for the radical density. On the other hand, when the duration of the slowdown phenomenon is too short, it becomes difficult to form the oxide film of desired thickness of 2–3 atomic layers or 2–4 atomic layers. Thus, there is an upper limit for the radical density.

From FIG. 61, which shows the example of conducting the oxidation of the substrate at 450° C. by the radical oxidation process while using the ultraviolet radiation of the 172 nm wavelength, it can be seen that the lower limit of the radical partial pressure is determined to be $1\times10^{-4}$ mTorr ($133\times10^{-7}$ Pa) assuming that the tolerable process time is 5 minutes (300 seconds) or less. Further, the upper limit of the radical partial pressure is determined to be 1 mTorr ($1.33\times10^{-3}$ Pa) assuming that the necessary slowdown interval is 100 seconds or more. The ultraviolet radiation power corresponding to this is determined to be 5–50 mW·cm$^{-2}$ in the region right underneath the optical source 23.

In FIG. 61, it may seem that the interval between the two lines respectively defining the appearance and vanishing of the slowdown phenomenon is decreased with the radical partial pressure. This, however, is merely an apparent effect caused by the fact that the vertical axis and the horizontal axis of FIG. 61 are represented with logarithmic scale. The duration of the stationary interval is in fact decreased with the radical partial pressure.

Thus, in the foregoing UV-O2 processing, it is preferable to set the oxygen partial pressure to fall in the range of $6.65\times10^{-3}$ Pa–133 Pa (0.05–1000 mTorr), more preferably the range of 1.33–13.3 Pa (10–100 mTorr).

It is also possible to conduct the radical oxidation process conducted by using the substrate processing apparatus 320 of FIG. 51 also by using ultraviolet radiation of other wavelengths. In this case, it is necessary to change the drive energy of the ultraviolet source 324B or the ambient gas composition in order to realize the foregoing radical density of $1\times10^{-4}$ mTorr ($1.33\times10^{-2}$ mPa) or more but not exceeding 1 mTorr (133 mPa).

For example, in the case of using the ultraviolet radiation source of 146 nm wavelength for the ultraviolet source 324B, it is necessary to set the oxygen partial pressure to the range of 0.05–50 mTorr (6.7 mPa–6.7 Pa) in view of the large optical absorption larger by 25 times as compared with the case of the wavelength of 172 nm.

It is also possible to nitride the oxide film having the thickness of 2–3 atomic layers thus formed to form an oxynitride film. Because of the larger specific dielectric constant, the use of such an oxynitride film enables further decrease of the thermal oxide film equivalent thickness of the gate insulation film of a MOS transistor.

[Ninth Embodiment]

Hereinafter, a ninth embodiment of the present invention will be explained.

In the present embodiment, the substrate processing apparatus 320 of FIG. 51 is used, and an oxynitride film is formed directly on a silicon substrate surface according to a UV-NO radical processing similar to the one explained before.

FIG. 62A shows the thickness distribution of a film obtained for the case an oxide film, formed on the silicon substrate by using the substrate processing apparatus 320 of FIG. 51 with the thickness of 0.4 nm, is subsequently subjected to an oxynitridation processing by supplying an NO gas to the showerhead 321B, wherein FIG. 62A shows the thickness obtained by ellipsometry. Further, Table 5 below shows the actual thickness of the substrate of FIG. 62A for the central part and the marginal part thereof obtained by the XPS analysis explained before, wherein the measurement of FIG. 62A is conducted by setting the detection angle to 90 degrees and reducing the resolution. Thereby, the thickness was obtained conveniently from the ratio of the peaks corresponding to SiO$^+$ and Si$^{4+}$. The oxynitridation processing was conducted by supplying an NO gas to the shower head 321B with the flow rate of 200 SCCM and driving the ultraviolet source 24B for 3 minutes within the foregoing reference power while maintaining the internal pressure of the processing vessel 321 at 3.9 Pa (0.03 Torr). The substrate temperature was set to 450° C.

TABLE 5

|  | 90 degrees center | 90 degrees periphery |
|---|---|---|
| SiO+ | 89.45 | 88.13 |
| Si4+ | 10.55 | 11.87 |
| Si4+/SiO+ | 0.117943 | 0.134687 |
| Thickness (nm) | 0.43 | 0.49 |

Referring to FIG. 62A and Table 5, it can be seen that the thickness after the oxynitridation processing is 0.43–0.49 nm in any of the central part and the marginal part of the substrate, and that there is no substantial difference in the film thickness from the initial thickness of about 0.4 nm. Further, XPS analysis conducted on the oxide film thus processed for detection of nitrogen atoms revealed that no signal from nitrogen atoms has been detected. This means that there has been caused no nitridation reaction at all in the oxide film in the foregoing oxynitridation processing.

FIG. 62B shows the thickness distribution of a film obtained for the case an oxide film, formed on the silicon substrate similarly with the thickness of 0.7 nm, is subsequently subjected to an oxynitridation processing. Further Table 6 below shows the actual thickness obtained by ellipsometry for the central part and the marginal part by the XPS analysis while setting the detection angle to 90 degrees.

TABLE 6

|  | 90 degrees center | 90 degrees periphery |
| --- | --- | --- |
| SiO+ | 83.49 | 83.88 |
| Si4+ | 15.51 | 16.12 |
| Si4+/SiO+ | 0.197748 | 0.192179 |
| Thickness (nm) | 0.69 | 0.68 |

Referring to FIG. 62B and Table 6, it can be seen that the thickness after the oxynitridation processing is 0.69–0.68 nm in any of the central part and the marginal part of the substrate, and that there is no substantial difference in the film thickness from the initial thickness of about 0.7 nm. Further, XPS analysis conducted on the oxide film thus processed for detection of nitrogen atoms revealed that no signal from nitrogen atoms has been detected. This means that there has been caused no nitridation reaction at all in the oxide film in the foregoing oxynitridation processing.

From the result of Table 6 and also from the result of Table 5 before, it is concluded that incorporation of nitrogen into the film is not possible by the oxynitridation processing conducted by the UV-NO processing on the oxide film already formed on a silicon substrate surface however small the thickness of the oxide film may be.

On the other hand, FIG. 63A shows the thickness distribution of the film formed on a silicon substrate for the case the silicon substrate is directly subjected to the UV-NO processing in the substrate processing apparatus 320 of FIG. 51 after the native oxide film is removed, wherein the film thickness of FIG. 63A is obtained by ellipsometry. Further, Table 3 shows the thickness of the film thus obtained at the central part and marginal part of the substrate by the XPS analysis while setting the detection angle to 90 degrees. In the experiment of FIG. 63A, it should be noted that the experiments of FIG. 63A is conducted in the substrate processing apparatus 320 of FIG. 51 by supplying an NO gas to the showerhead 321B with the flow rate of 200 SCCM and driving the ultraviolet source 324B at the foregoing reference power for 3 minutes while maintaining the internal pressure of the processing vessel 321 at 3.99 Pa (0.03 Torr) similarly to the previous case. Thereby, the substrate temperature is set to 450° C.

Referring to FIG. 63A, it can be seen that there is formed a film on the silicon substrate surface with a generally uniform thickness. From Table 7, it can be seen that the film thickness is about 0.5 nm at any of the central part and the marginal part of the substrate.

TABLE 7

|  | 90 degrees center | 90 degrees periphery |
| --- | --- | --- |
| SiO+ | 86.81 | 86.92 |
| Si4+ | 13.2 | 13.07 |
| Si4+/SiO+ | 0.152056 | 0.150368 |
| Thickness (nm) | 0.55 | 0.54 |

Further, FIG. 63B shows the film thickness distribution obtained by ellipsometry for the case the oxynitridation processing is conducted under the pressure of 665 Pa (5 Torr) by setting the NO gas flow rate to 1 SLM and driving the ultraviolet source 24B at the foregoing reference power for 1 minute. Further, Table 8 below shows the result of film thickness measurement conducted on the film thus obtained by the XPS analysis while setting the detection angle to 90 degrees.

TABLE 8

|  | 90 degrees center | 90 degrees periphery |
| --- | --- | --- |
| SiO+ | 87.78 | 37.57 |
| Si4+ | 12.22 | 12.42 |
| Si4+/SiO+ | 0.1339212 | 0.141829 |
| Thickness (nm) | 0.50 | 0.51 |

Referring to FIG. 63B, it can be seen that the film thickness distribution is generally uniform for the film formed on the substrate surface and that it can be seen from Table 8 that the film thickness is about 0.5 nm at any of the central part and the marginal part of the substrate.

Table 9 below shows the result of element analysis conducted on the film obtained by the experiment of FIG. 63A by the XPS analysis.

TABLE 9

| | atomic % | | | |
| --- | --- | --- | --- | --- |
| | center | | periphery | |
| | 90 degree | 30 degree | 90 degree | 30 degree |
| $O_{1s}$ | 67.23 | 63 | 66.38 | 66.13 |
| $N_{1s}$ | 11.18 | 10.19 | 9.13 | 9.63 |
| $Si_{2p}$ | 21.59 | 26.81 | 23.99 | 24.23 |

Referring to Table 9, it can be seen that the signals corresponding to the $O_{1s}$ orbital, $N_{1s}$ orbital and $Si_{2p}$ orbital are observed in the film thus formed and that the film shows the oxygen atomic concentration of 67.23%, the nitrogen atomic concentration of 11.18% and the silicon atomic concentration of 21.59% at the central part of the substrate in the measurement conducted by setting the detection angle to 90 degrees. Further, it was confirmed that the film has the oxygen atomic concentration of 66.88%, the nitrogen atomic concentration of 9.13% and the silicon atomic concentration of 24.23% at the marginal part thereof. Thus, it was concluded that the film thus formed is an oxynitride film containing nitrogen.

Similarly, Table 10 below shows the result of element analysis conducted on the film obtained by the experiment of FIG. 63B by the XPS analysis.

TABLE 10

| | atomic % | | | |
| --- | --- | --- | --- | --- |
| | center | | periphery | |
| | 90 degree | 30 degree | 90 degree | 30 degree |
| $O_{1s}$ | 67.3 | 63.84 | 67.2 | 64.2 |
| $N_{1s}$ | 11.66 | 10.36 | 11.44 | 10.43 |
| $Si_{2p}$ | 21.04 | 25.8 | 21.37 | 25.36 |

Referring to Table 10, it is also noted that the signals corresponding to the $O_{1s}$ orbital, $N_{1s}$ orbital and $Si_{2p}$ orbital are observed in the film thus formed and that the film shows the oxygen atomic concentration of 67.3%, the nitrogen atomic concentration of 11.66% and the silicon atomic concentration of 21.2% at the central part of the substrate in the measurement conducted by setting the detection angle to 90 degrees. Further, it was confirmed that the film has the oxygen atomic concentration of 67.2%, the nitrogen atomic concentration of 11.44% and the silicon atomic concentration of 21.37% at the marginal part thereof. Thus, it was confirmed that the compositional uniformity of the film is improved further and that an oxynitride film having a uniform composition is formed on the silicon substrate surface.

In the measurement of Table 10 in which the XPS spectrum is detected with the detection angle of 30 degrees, it is noted that the nitrogen concentration is decreased slightly as compared with the case of using the detection angle of 90 degrees both in the central part and in the marginal part. In such a measurement conducted by using a shallow detection angle, the signals caused by the photoelectrons emitted at the bottom part of the oxynitride film undergo attenuation as they are transmitted through the film obliquely. As a result, the composition of the upper part of the film is mainly detected by such a measurement. Thus, the result of Table 10 also indicates that the nitrogen atoms are mainly concentrated in the oxynitride film thus formed at the part near the interface to the silicon substrate. A similar tendency is observed also in the result of analysis of Table 9 for the central part of the substrate.

Next, the kinetics of the oxynitride film formation on such a silicon substrate surface by the UV-NO processing will be explained.

Figure 64A:
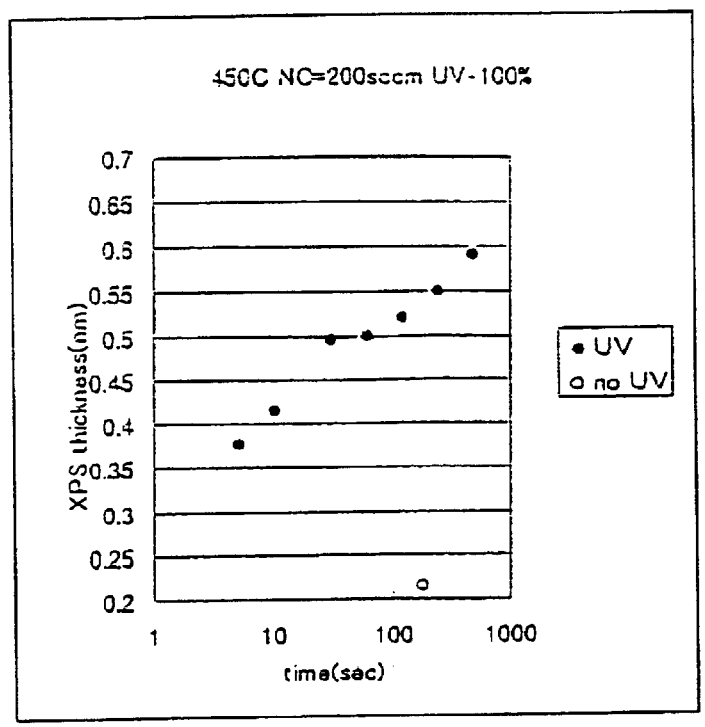
FIGS. 64A and 64B are diagrams showing the kinetics of oxynitride film formation on a silicon substrate surface by the UV-NO processing according to the ninth embodiment of the present invention.
Figure 64B:
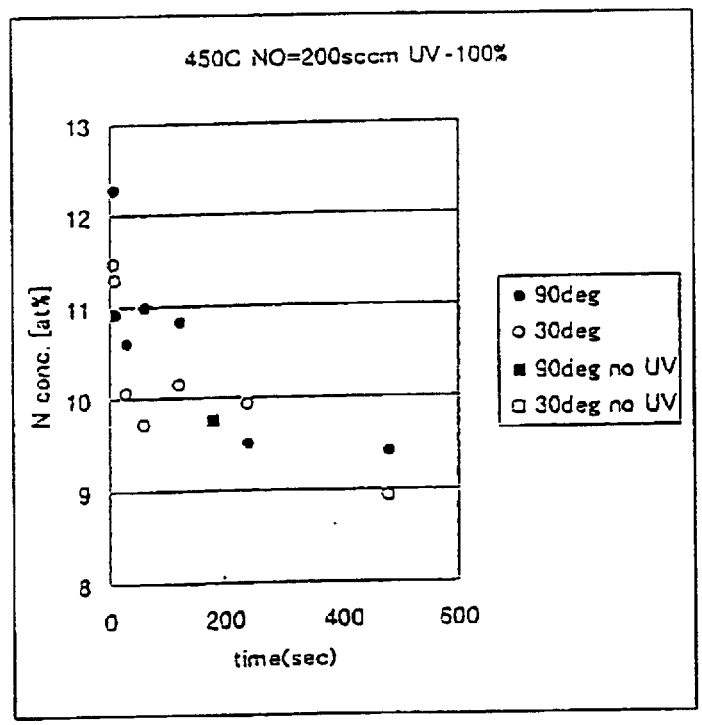

FIGS. 64A and 64B show the thickness of an oxynitride film and a nitrogen concentration in the film for the case an NO gas is supplied to the showerhead 321B of the substrate processing apparatus 320 of FIG. 3 with the flow rate of 200 SCCM and the ultraviolet source 324B is driven with the reference power for various durations while maintaining the process pressure at 3.99 Pa (20 mTorr) and the substrate temperature at 450° C.

Referring to FIG. 64A, it can be seen that the thickness of the oxynitride film increases with time while it is also noted that there occurs a slowdown phenomenon of film growth similar to the one explained before with reference to FIGS. 5 and 8 at the moment the film thickness has reaches the value of about 0.5 nm. Further, FIG. 64A also shows the case in which driving of the ultraviolet source 324B was not made during such a nitridation processing by ○. In this case, it will be noted that there is caused no growth of the oxynitride film at all as can be seen from FIG. 64A.

On the other hand, FIG. 64B also indicates that the nitrogen concentration detected by setting the detection angle of the XPS analysis to 30 degrees appears smaller than the case the detection angle is set to 90 degrees in the period immediately after the is start of the oxynitridation processing. This indicates that the nitrogen atoms are mainly concentrated to the interface region of the oxynitride film and the silicon substrate. Further, FIG. 64B also indicates that such a non-uniform distribution of nitrogen in the thickness direction is gradually resolved by continuing the oxynitridation processing.

The result of FIG. 64B indicates that an oxynitride film of high nitrogen concentration is formed immediately after the start of the nitridation processing and that the nitrogen concentration in the film decreases gradually with time, while this indicates that oxidizing reaction becomes dominant in due course with time in the film growth mechanism. After 200 seconds from the start of processing, the observed non-uniformity of nitrogen concentration in the film thickness direction is resolved.

Figure 65A:
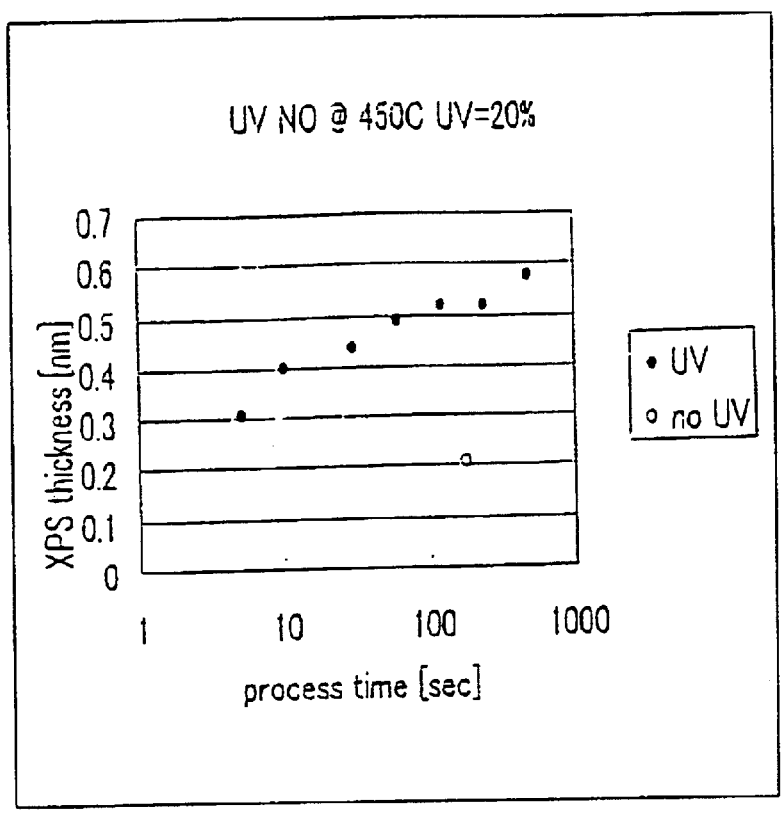
FIGS. 65A and 65B are further diagrams showing the kinetics of oxynitride film formation on a silicon substrate surface by the UV-NO nitriding processing according to the ninth embodiment of the present invention.
Figure 65B:
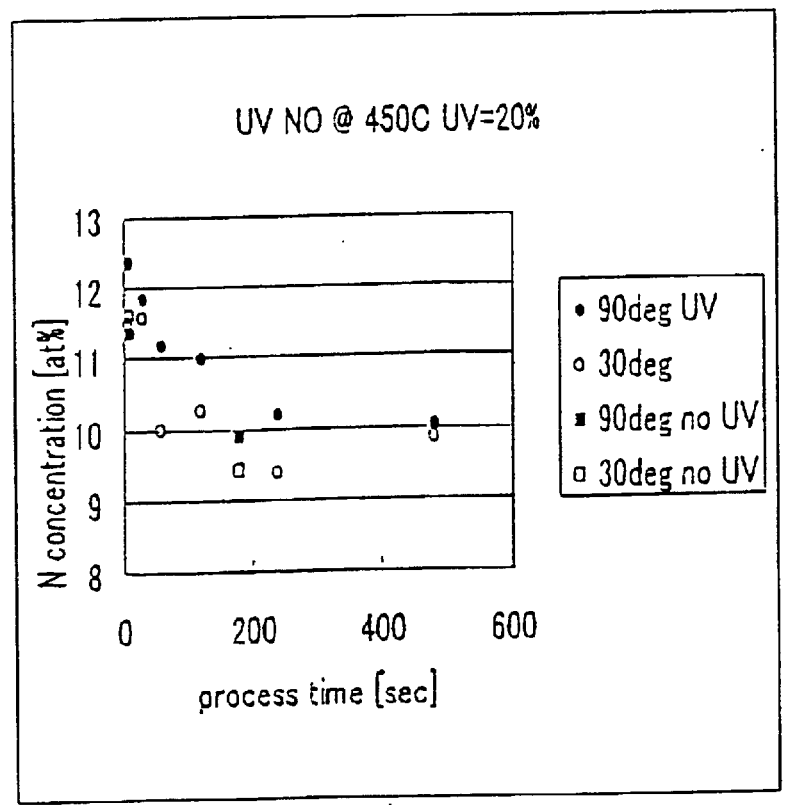

FIGS. 65A and 65B are diagrams corresponding to FIGS. 64A and 64B respectively showing the case in which the oxynitridation processing is conducted by setting the driving power of the ultraviolet source 324B to 20% of the reference power. It can be seen that a result similar to the case of FIGS. 64A and 64B is obtained. Thus, there is caused a slowdown of film growth when the oxynitride film has reached the thickness of about 0.5 nm and that an oxynitride film of high nitrogen concentration is formed at the beginning of the film growth, with the concentration of the nitrogen atoms in the vicinity of the interface between the oxynitride film and the silicon substrate.

Figure 66A:
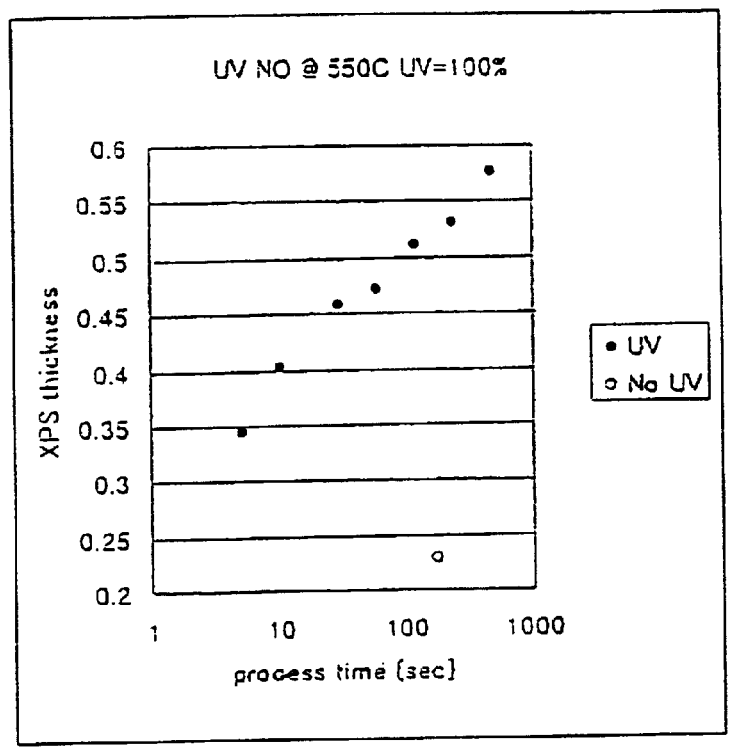
FIGS. 66A and 66B are further diagrams showing the kinetics of oxynitride film formation on a silicon substrate surface by the UV-NO nitriding processing according to the ninth embodiment of the present invention.
Figure 66B:
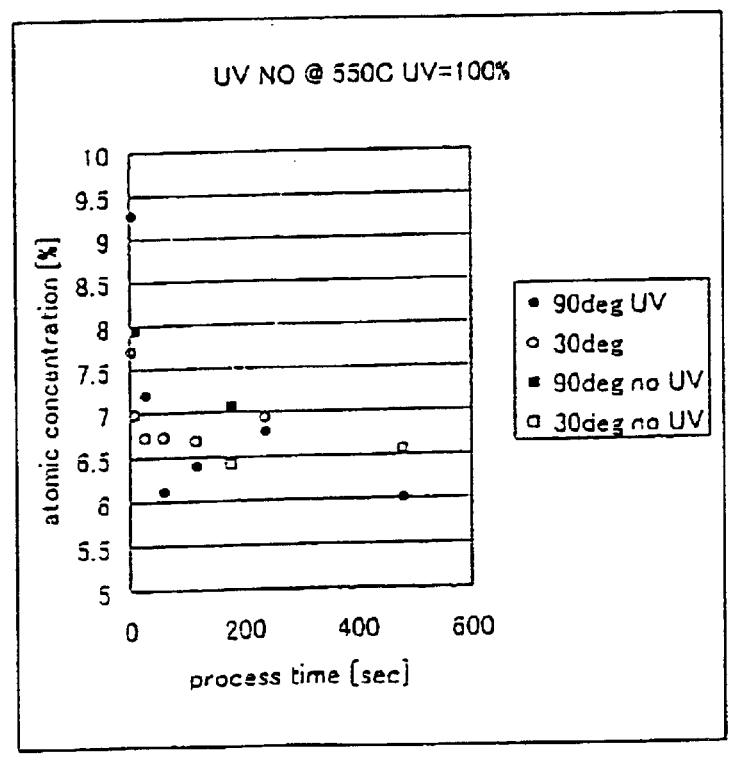

FIGS. 66A and 66B respectively show the relationship between the film thickness and process time and the relationship between the nitrogen concentration in the film and the process time for the case the oxynitridation processing of a silicon substrate surface is conducted at the substrate temperature of 550° C.

Referring to FIG. 66B first, it can be seen that the concentration of the nitrogen atoms incorporated into the film is substantially smaller than the case of FIG. 64B or FIG. 65B in any of the cases in which the detection angle of the XPS analysis is set to 90 degrees or 30 degrees, indicating that the oxynitride film thus formed has a composition closer to that of an oxide film. It is believed that this result has been caused by the promotion of oxidizing reaction at the substrate temperature of 550° C. by residual oxygen remaining in the processing vessel 321.

In FIG. 66A, it is noted that the slowdown of film growth takes place at the thickness of 0.46 nm, which is closer to the thickness of 0.4 nm in which the slowdown of film growth takes place for an oxide film as explained with reference to FIG. 5 or 8, wherein it is believed that this result is caused as a result of the oxynitride film thus formed having the composition closer to that of an oxide film.

It should be noted that the thickness of the oxynitride film is obtained by Eq. (1) explained before and associated parameters that are derived for an oxide film. Thus, there is a possibility that the film thickness is calculated to be slightly larger for those oxynitride films because of the effect of escaping depth of photoelectrons. In any case, it is believed that the oxynitride film formed by the present invention has a thickness controlled to about two atomic layers.

Meanwhile, in the case of applying the substrate processing apparatus 320 of FIG. 51 to the oxynitridation processing of a silicon substrate, it is preferable to use an optical source capable of producing ultraviolet radiation in the wavelength range of 192–142 nm from the consideration similar to the one explained already with reference to FIG. 34.

In view of applying the substrate processing apparatus 320 of FIG. 51 to a single-wafer semiconductor production process, it is preferable that such an optical source 324B is the one capable of being turned on and turned off as desired. Currently, excimer lamps having the wavelengths of 308 nm, 222 nm, 172 nm, 146 nm and 126 nm are commercially available as a ultraviolet source capable of being turned on and turned off as desired. These excimer lamps have an advantageous feature of having a very sharp spectrum simultaneously. On the other hand, only the excimer lamp having the wavelength of 172 nm and the excimer lamp having the wavelength of 146 nm are the sole candidates for the lamp that satisfies the foregoing requirement. Thereby, it should be noted that the lamp having the wavelength of 146 nm has a half-height width of about 13 nm, and thus, a part of the spectrum becomes shorter than 145 nm. In such a case, therefore, there is a possibility that the oxygen radical excitation may not be caused, depending on the state of the lamp or the peculiarity of the individual lamps. From these considerations, it is concluded that the use of an excimer lamp of the 172 nm wavelength is most preferable for the ultraviolet source 324B of the substrate processing apparatus 320 of FIG. 51 in the case of choosing the excimer lamp form the commercially available excimer lamps.

FIG. 67 shows the schematic construction of an excimer lamp (dielectric barrier discharge tube) 341 producing the ultraviolet radiation of 172 nm (reference should be made to the Japanese Laid-Open Patent Publication 7-196303 or 8-85861).

Referring to FIG. 67, the excimer lamp 341 has a double cylindrical vessel including an inner quartz tube 342 and an outer quartz tube 343 and a Xe gas is confined into a space between the inner quartz tube 342 and the outer quartz tube 343 with a pressure of Xe gas of 33.25 kPa (250 Torr). Further, an aluminum thin film electrode 345 is formed on the inner surface of the inner quartz tube 342 and a mesh-state electrode 344 is formed on the outer side of the outer quartz tube 345. Further, a getter chamber 348 is formed at an axial end of the space 347 and a getter 346 is provided inside the space 347. The excimer lamp 341 is turned on and turned off as desired by applying an a.c. voltage from a power supply 350 across the electrodes 344 and 345.

For such an excimer lamp, it is possible to use the model UER20-172 marketed by the USHIO or the model HES1703S marketed by Hoya Schott.

Of course, the ultraviolet source is not limited to those mentioned above and other optical sources such as a low-pressure mercury lamp. Further, if the situation allows, it is also possible to use an excimer laser.

[Tenth Embodiment]

Next, formation of a uniform oxynitride film on a wafer surface by the UV-NO processing according to a tenth embodiment of the present invention will be explained.

Referring to Table 7 again, it is noted that the oxynitride film formed under the process pressure of 3.99 Pa (0.03 Torr) and the 100% UV radiation power shows a generally uniform thickness at the central part and marginal part of the substrate, while it is also noted that the result of Table 9 shows that there exists a difference of about 2% in the nitrogen concentration and the distribution of the nitrogen concentration is not uniform. Thus, Table 9 indicates that it is an important issue in the oxynitride film formed by the UV-NO processing to achieve the uniformity of film thickness and nitrogen concentration at the same time.

FIG. 68A shows the thickness distribution of an oxynitride film formed under the same conduction as noted above except that the duration of the oxynitridation is set to 1 minute and 30 seconds. On the other hand, FIG. 68B shows the thickness distribution of an oxynitride film for the case of forming the oxynitride film under the same condition except that the ultraviolet lamp is moved back and forth. In FIGS. 68A and 68B, the number of measurement points is increased to seventeen. In the experiment of FIG. 68B, the back and forth movement of the ultraviolet lamp is conducted such that the ultraviolet lamp is moved from a first wafer edge to a second, opposing wafer edge separated from the first wafer edge by the distance of 200 mm with a speed of 60 mm/sec and is moved back after stopping at the switchback point for 0.1 seconds. The ultraviolet lamp is also stepped for 1 second at the center of the wafer.

Comparing FIGS. 68A and 68B, it can be seen that a more uniform film thickness distribution is achieved in the experiment of FIG. 68B as compared with the experiment of FIG. 68A by adopting the back and forth movement sequence of the ultraviolet lamp.

In order to ensure accuracy of the conclusion, Tables 11 and 12 are presented below showing the result of film thickness measurement conducted by the XPS analysis for the samples of FIG. 68A and FIG. 68B. In the results of Tables 11 and 12, the measurement at the marginal part includes two measuring points. Further, Table 13 below shows the result of measurement for the nitrogen concentration in the case of the sample of FIG. 68A, while Table 14 below shows the result of measurement for the nitrogen concentration in the case of the sample of FIG. 68B.

TABLE 11

|  | 90 degrees center | 90 degrees periphery 1 | 90 degrees periphery 2 |
|---|---|---|---|
| SiO+ | 87.76 | 87.2 | 86.11 |
| Si4+ | 12.23 | 12.81 | 13.89 |
| Si4+/SiO+ | 0.139357 | 0.146904 | 0.161305 |
| Thickness (nm) | 0.50 | 0.53 | 0.58 |

TABLE 12

|  | 90 degrees center | 90 degrees periphery 1 | 90 degrees periphery 2 |
|---|---|---|---|
| SiO+ | 87.26 | 87.13 | 87.31 |
| Si4+ | 12.74 | 12.88 | 12.69 |
| Si4+/SiO+ | 0.146 | 0.147825 | 0.145344 |
| Thickness (nm) | 0.53 | 0.53 | 0.52 |

TABLE 13

| atomic % | | | | | | |
|---|---|---|---|---|---|---|
| | center | | periphery 1 | | periphery 2 | |
| | 90 degree | 30 degree | 90 degree | 30 degree | 90 degree | 30 degree |
| $O_{1s}$ | 69.89 | 66.76 | 70.98 | 67.52 | 69.98 | 66.42 |
| $N_{1s}$ | 9.82 | 9.38 | 3.88 | 8.75 | 9.95 | 9.36 |
| $Si_{2p}$ | 20.29 | 23.86 | 20.14 | 23.73 | 20.06 | 24.23 |

TABLE 14

| atomic % | | | | | | |
|---|---|---|---|---|---|---|
| | center | | periphery 1 | | periphery 2 | |
| | 90 degree | 30 degree | 90 degree | 30 degree | 90 degree | 30 degree |
| $O_{1s}$ | 69.61 | 66.97 | 68.19 | 67.12 | 69.1 | 66.99 |
| $N_{1s}$ | 9.86 | 9.21 | 9.43 | 8.73 | 9.79 | 8.93 |
| $Si_{2p}$ | 20.53 | 23.83 | 22.38 | 24.14 | 21.11 | 24.08 |

Comparing these results, it can be seen that a uniform firm thickness distribution has become possible between the central part and marginal part of the wafer by causing a back and forth movement in the ultraviolet lamp. By doing so, it is also possible to achieve the uniform distribution for the nitrogen concentration. The foregoing results indicates that a uniform ultraviolet radiation is realized over the wafer surface by causing such a back and forth movement of the ultraviolet lamp.

[Eleventh Embodiment]

Figure 69A:
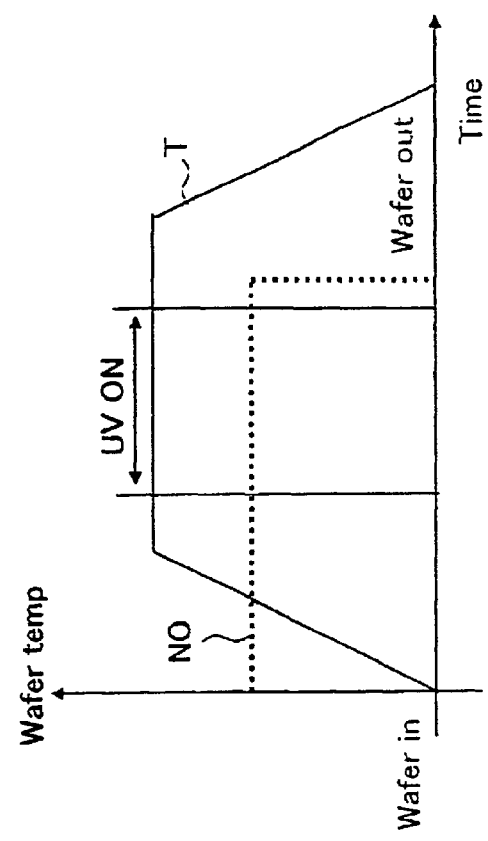
FIGS. 69A and 69B are diagrams showing an NO gas supply sequence according to an eleventh embodiment of the present invention.

FIG. 69A shows a NO gas sequence that has been used in the ninth and tenth embodiments of the present invention together with a temperature profile T.

Referring to FIG. 69A, the heating of the substrate 322 is started immediately after incorporation of the substrate 322 into the processing vessel 321, wherein it will be noted that a nitrogen gas is introduced into the processing vessel 321 at the initial state of the heating process. This nitrogen gas is switched to the NO gas when the temperature has reached a predetermined holding temperature. Further, the ultraviolet source 324B is driven for a predetermined period when the concentration of the NO gas has reached a predetermined level in the processing vessel 321. With this, the UV-NO processing explained before is conducted.

Thereafter, the ultraviolet source 324B is turned off, and the supply of the NO gas is interrupted. The substrate 322 is then taken out from the processing vessel 321 when the substrate temperature T has been lowered to the room temperature.

Figure 69B:
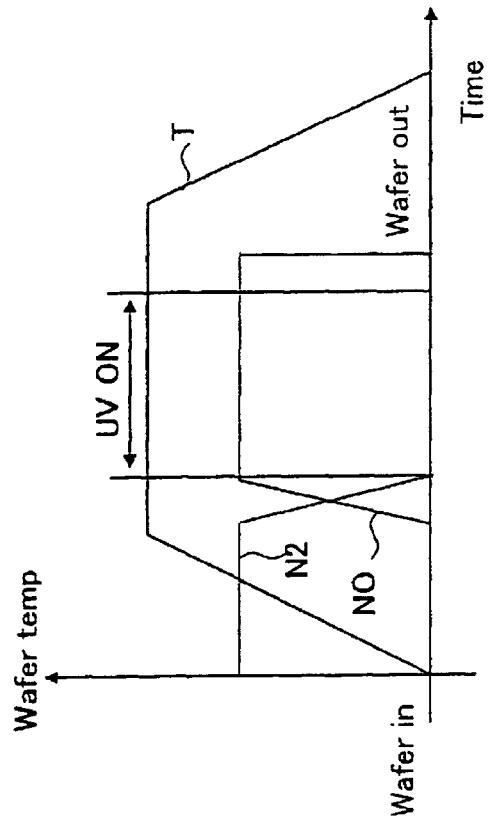

FIG. 69B, on the other hand, shows a NO gas sequence according to an eleventh embodiment of the present invention used in place of the sequence of FIG. 69A in the substrate processing apparatus 320 of FIG. 51.

Referring to FIG. 69B, the heating of the substrate 322 is started immediately after the incorporation of the substrate 322 into the processing vessel 321, wherein it should be noted that introduction of the NO gas is started at the same time the substrate 322 has been incorporated in the case of the present invention. Thus, when the substrate temperature T has reached a predetermined temperature, the ultraviolet source 324B is driven for a predetermined time and the desired UV-NO processing is conducted.

Thereafter, the ultraviolet source 324B is turned off, the supply of the NO gas is turned off further. The substrate 322 is then taken out of the processing vessel 321 when the substrate temperature T has been lowered to the room temperature.

Figure 70A:
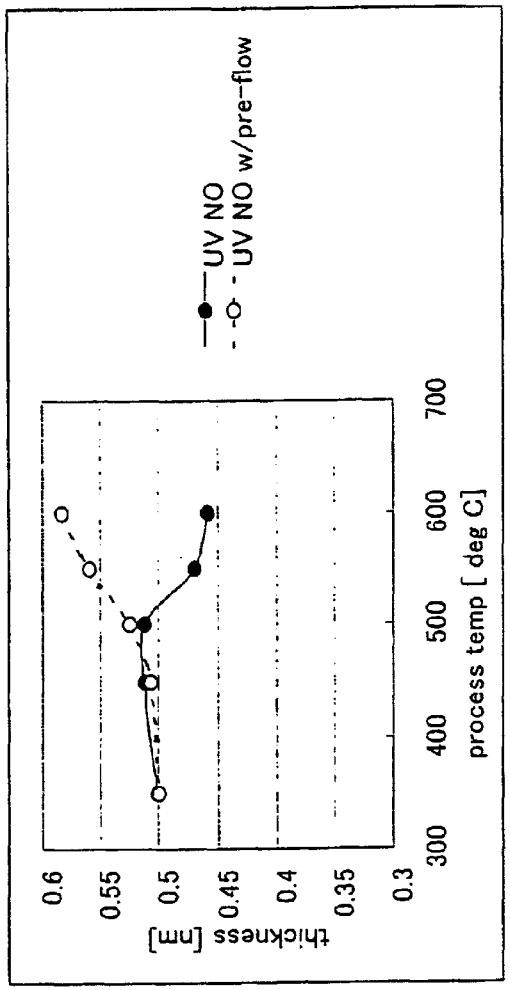
FIGS. 70A and 70B are diagrams showing the thickness of an oxynitride film formed by using the NO gas supplying sequence of FIGS. 69A and 69B and a nitrogen concentration therein.
Figure 70B:
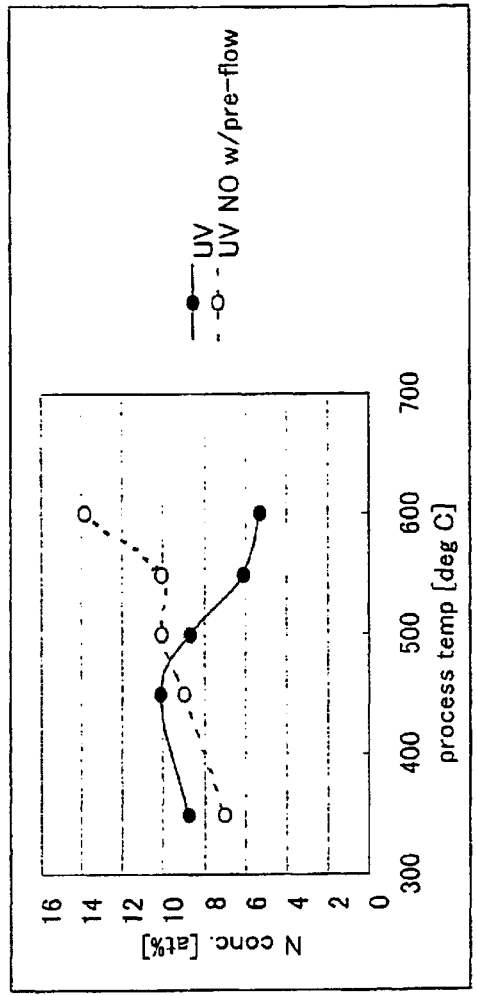

FIGS. 70A and 70B show the relationship between the process temperature and the thickness of the oxynitride film thus obtained and the relationship between the processing temperature and the nitrogen concentration in the oxynitride film. In FIGS. 70A and 70B, it should be noted that ● represents the case of using the NO sequence of FIG. 69A while ○ represents the case of using the NO sequence of FIG. 69B, respectively.

Referring to FIG. 70A, it can be seen that there exists no material difference between the case of using the NO sequence of FIG. 69A and the case of using the NO sequence of FIG. 69B as long as the substrate temperature is set to 500° C. or less. In the case the substrate temperature has exceeded 500° C., on the other hand, it can be seen that there is caused an increase in the film thickness of the obtained oxynitride film when the sequence of FIG. 69B is used.

Comparing this result with the nitrogen concentration in the film shown in FIG. 70B, it can be seen that the atomic concentration of nitrogen in the film is increased substantially by using the NO sequence of FIG. 69B. This result shows that the observed increase of thickness of the oxynitride film in FIG. 70A is attributed primarily to the nitrogen atoms that are incorporated into the oxynitride film.

Thus, by introducing an NO gas into the processing vessel prior to the processing, it becomes possible to incorporate a large amount of nitrogen atoms into the oxynitride film at the time of the UV-NO processing.

It should be noted that the NO gas sequence of FIGS. 69A and 69B can be used also in the substrate processing apparatus 20 of FIG. 3 for achieving a similar effect.

[Twelfth Embodiment]

FIGS. 71A–71E show the fabrication process of a semiconductor device according to a twelfth embodiment of the present invention.

Figure 71A:
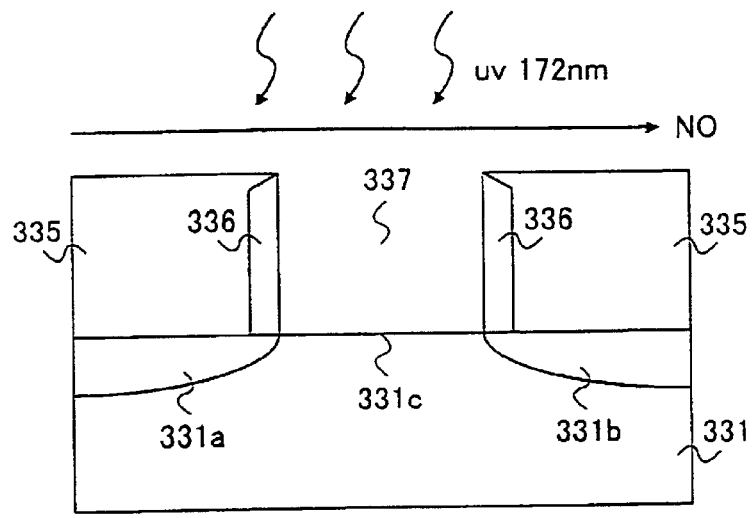
FIGS. 71A–71E are diagrams showing the fabrication process of a semiconductor device according to a twelfth embodiment of the present invention.
Figure 71B:
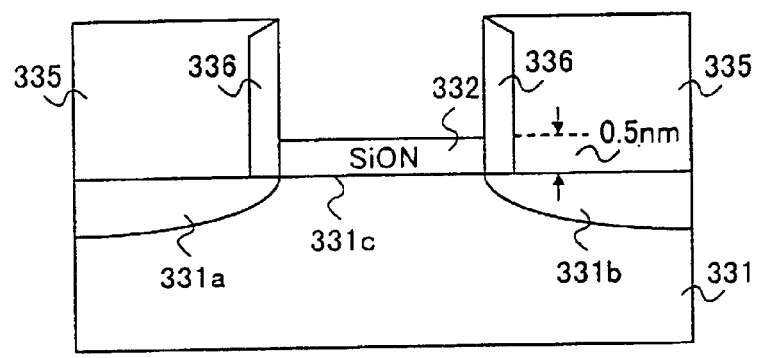

Referring to FIG. 71A, diffusion regions 331a and 331b are formed in a silicon substrate 331 by an ion implantation process of an impurity element, and a surface region 331c of the silicon substrate 331 is exposed at an opening 337 formed in an insulation film 335 and an insulation film 336.

The exposed surface region 331c is then subjected to a process of removing a native oxide film, and the UV-NO processing is conducted thereafter in the substrate processing apparatus 320 of FIG. 51 under the condition explained before by using the ultraviolet radiation of 172 nm wavelength. As a result, there is caused slowdown of film growth on the surface of the silicon substrate 331, and an SiON film 332 having a thickness of about 0.5 nm is formed uniformly.

Figure 71C:
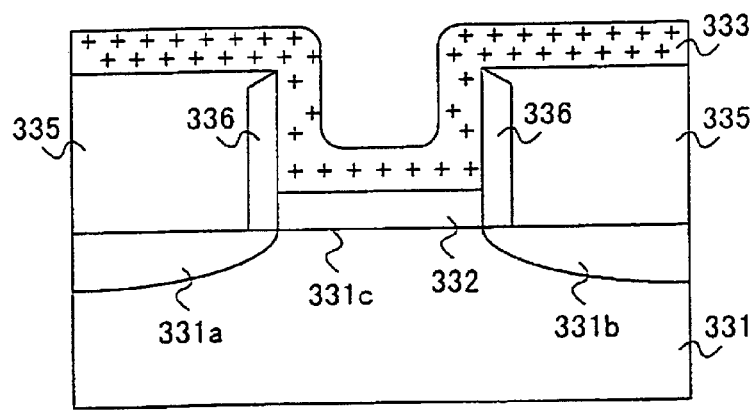

Next, in the step of FIG. 71C, a high-K dielectric film 333 such as $ZrSiO_x$, $HfSiO_x$, $ZrO_2$, $HfO_2$, $Ta_2O_5$, $Al_2O_3$, and the like, is formed on the SiON film 332 by a CVD process.

Figure 71D:
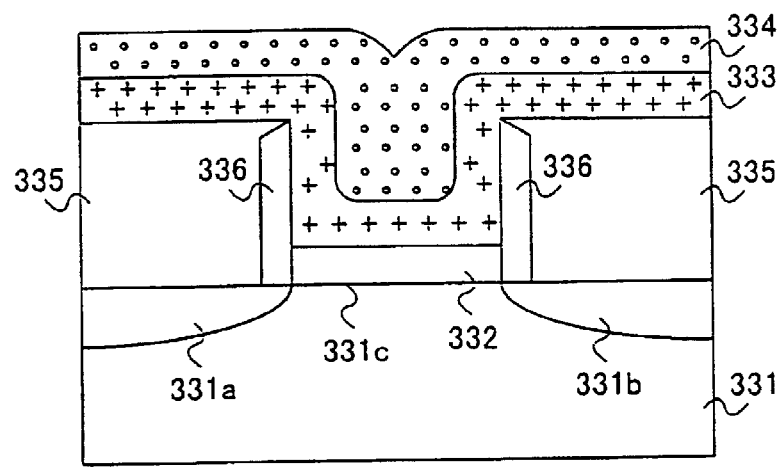
Figure 71E:
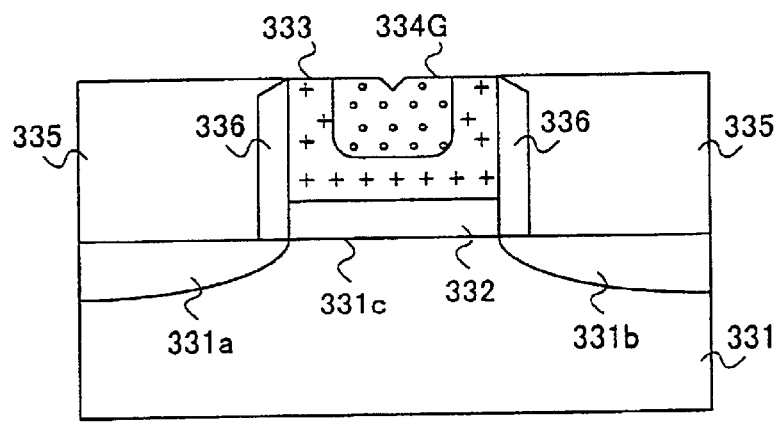

Further, a metal electrode layer 334 is deposited on the high-K dielectric film 333 thus formed in the step of FIG. 71D, and a metal gate electrode 334G is formed by conducting an etch-back process in the step of FIG. 72E.

In the present embodiment, it is preferable that the UV-NO processing is conducted at a temperature not exceeding 550° C. under the process pressure in the range of $1.33–1.33 \times 10^{-3}$ Pa.

[Thirteenth Embodiment]

In the case of measuring the thickness of a very thin film formed on a wafer by way of ellipsometry, there is a case that a thickness value larger than the actual value is obtained because of the adsorption of organic molecules and the like on the film surface during the measurement process. In the case of measuring the film thickness at a number of points, in particular, there is a tendency that the measured value changes during the measurement and it is difficult to evaluate the exact uniformity of the film.

In view of the situation noted above, the inventor of the present invention has made an improvement of film-thickness measurement process so as to ensure exactness on the uniformity of the film thickness.

In the improvement of the inventor, the entire path of the substrate from the load/unload gate of the deposition apparatus up to the wafer stage of an ellipsometer is placed under the down flow stream of a chemical filter that is used for removing organic molecules. According to such a construction, it is possible to suppress the apparent increase of the film thickness within 0.02 nm (0.2 Å) even in the case the wafer is placed in the measurement ambient for 3 hours.

When such an ellipsometry is used, about ten minutes are needed for conducting the film thickness measurement at 49 points on the wafer surface, while it is evaluated that the increase of the apparent film thickness during this interval is about 0.001 nm (0.01 Å). Further, it is confirmed that the measurement apparatus thus improved has the reproducibility of 0.006 nm (0.06 Å) in terms of the variance value σ from the repeated measurement conducted at a fixed point.

Figure 75:
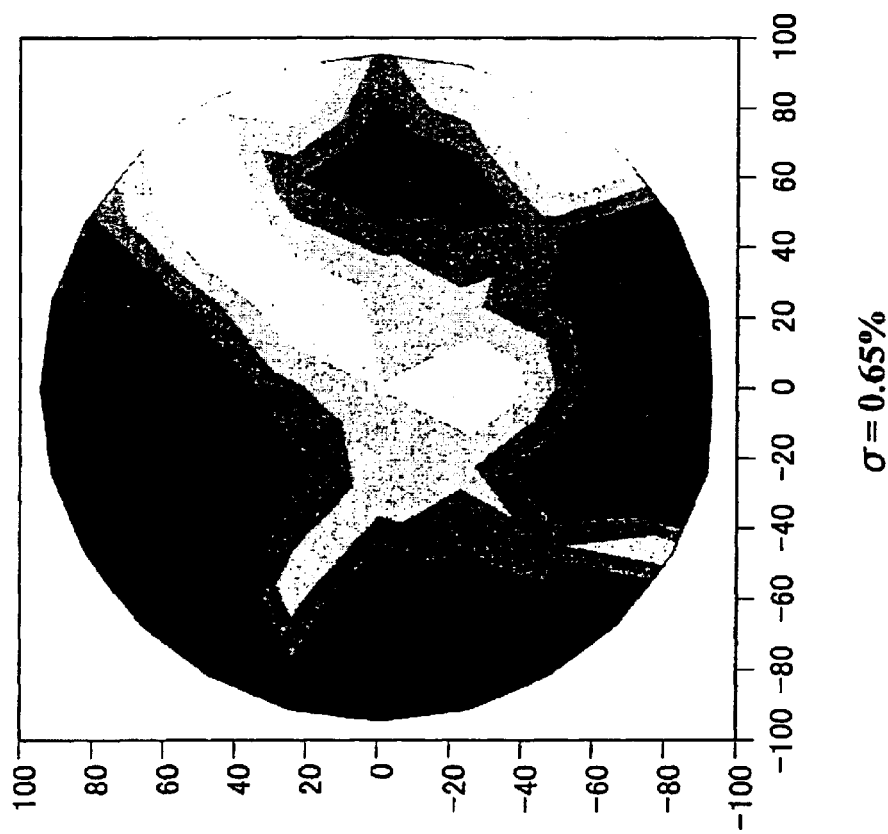
FIG. 75 is a diagram showing the result of measurement of film thickness variation conducted by an improved ellipsometry on an oxynitride film formed on a wafer of 200 mm diameter by the UV-NO processing.

Now, FIG. 75 shows the result of measurement of an oxynitride film formed on a wafer having a diameter of 200 nm with the thickness of 0.5 nm by using the UV-NO process under the condition explained before. The measurement was conducted by the measuring fixture explained above. In FIG. 76, the film thickness was measured at 49 points on the wafer surface.

Referring to FIG. 75, it can be seen that the in-plane variance σ of the film thickness is 0.65%. In terms of the thickness, this means that the film thickness variation is in the order of 0.0065 nm (0.065 Å). In other words, the variation of the film thickness has been reduced to near the detection limit. Thus, it should be noted that a completely uniform oxynitride film is obtained over the wafer of the 200 mm diameter.

In the similar measurement of the oxide film formed by the UV-O$_2$ processing, on the other hand, it was also confirmed that a film of excellent uniformity characterized by the film thickness variance σ of only about 0.7% is obtained for the oxide film having the thickness of 0.4 nm.

Further, the present invention is not limited to the embodiments explained heretofore, but various variations and modifications may be made without departing from the scope of the invention.

What is claimed is:

1. A method of nitriding an insulation film, comprising the steps of:
   forming nitrogen radicals in a high-frequency plasma using a plasma excitation frequency of 13.56 MHz or less; and
   causing nitridation in a surface of an insulation film containing therein oxygen by supplying said nitrogen radicals to said surface of said insulation film.

2. The method as claimed in claim 1, wherein said insulation film is an oxide film.

3. The method as claimed in claim 2, wherein said oxide film has a thickness of 0.4 nm or less.

4. The method as claimed in claim 1, wherein said insulation film is an oxynitride film.

5. The method as claimed in claim 1, wherein said nitrogen radicals are supplied in the form of being carried by a gas flow formed along said surface of said insulation film.

6. The method as claimed in claim 5, wherein said gas flow is caused to flow from a first side of a substrate formed with said insulation film to a second, diametrically opposite side to said first side.

7. The method as claimed in claim 6, wherein said gas flow is evacuated at said second side of said substrate.

8. The method as claimed in claim 1, wherein said step of forming said nitrogen radicals in a high-frequency plasma comprises the steps of: exciting a nitrogen gas with a plasma excitation frequency of 13.56 MHz or less; and removing nitrogen ions formed with excitation of said nitrogen gas with any of a diffusion plate or an ion filter.

9. The method as claimed in claim 1, wherein said high-frequency plasma is formed by exciting said nitrogen gas with a frequency of about 400 kHz.

10. The method as claimed in claim 1, wherein said step of nitriding said surface of said insulation film is conducted under a pressure in the range of 0.67 Pa–1.33 kPa.

11. The method as claimed in claim 1, further comprising, prior to said step of supplying said nitrogen radicals to said surface of said insulation film, the step of purging a process space in which said insulation film is held to a pressure lower than a pressure used in said nitridation step.

12. The method as claimed in claim 11, wherein said purging step is conducted so as to evacuate said process space to a pressure of $1.33 \times 10^{-1} - 1.33 \times 10^{-4}$ Pa.

13. The method as claimed in claim 1, wherein said insulation film has a thickness of about 0.4 nm.

14. The method as claimed in claim 1, wherein said insulation film is an oxide film formed by processing a surface of a silicon substrate with oxygen radicals excited by ultraviolet radiation.

15. A method of fabricating a semiconductor device, comprising the steps of:
   forming an insulation film on a silicon substrate surface;
   forming nitrogen radicals in a high frequency plasma using a plasma excitation frequency of 13.56 MHz or less;
   nitriding a surface of said insulation film by supplying said nitrogen radicals to said surface of said insulation film; and
   forming a high-K dielectric film on said insulation film having said surface subjected to nitridation.

16. The method as claimed in claim 15, wherein said insulation film is an oxide film.

17. The method as claimed in claim 16, wherein said oxide film has a thickness of 0.4 nm or less.

18. The method as claimed in claim 15, wherein said insulation film is an oxynitride film.

19. The method as claimed in claim 15, wherein said nitrogen radicals are supplied in the form of being carried by a gas flow formed along said surface of said insulation film.

20. The method as claimed in claim 19, wherein said gas flow is caused to flow from a first side of said silicon substrate, on which said insulation film is formed, to a second, diametrically opposite side to said first side.

21. The method as claimed in claim 20, wherein said gas flow is evacuated at said second side of said substrate.

22. The method as claimed in claim 15, wherein said step of forming said nitrogen radicals in a high-frequency plasma comprises the steps of: exciting a nitrogen gas using a plasma excitation frequency of 13.56 MHz or less; and removing nitrogen ions formed with excitation of said nitrogen gas by an ion filter.

23. The method as claimed in claim 15, wherein said high-frequency plasma is excited at a frequency of about 400 kHz.

24. The method as claimed in claim 15, wherein said nitridation step of said surface of said insulation film is conducted under a pressure in the range of 0.67 Pa–1.33 kPa.

25. The method as claimed in claim 15, further comprising, prior to said step of supplying said nitrogen radicals to said surface of said insulation film, the step of purging a process space in which said insulation film is held to a pressure lower than a pressure used in said nitridation step.

26. The method as claimed in claim 25, wherein said purging step is conducted so as to evacuate said process space to a pressure of $1.33 \times 10^{-1} - 1.33 \times 10^{-4}$ Pa.

27. The method as claimed in claim 15, wherein said insulation film has a thickness of about 0.4 nm.

28. The method as claimed in claim 15, wherein said step of forming said insulation film comprises the step of processing said surface of said silicon substrate with oxygen radicals excited by ultraviolet radiation.

29. The method as claimed in claim 15, wherein said step of forming said insulation film and said nitridation step of said insulation film are conducted consecutively in the same processing apparatus, without exposing said silicon substrate to the air.

30. The method as claimed in claim 15, wherein said step of forming said insulation film and said step of nitriding said insulation film are conducted consecutively in the same processing apparatus without exposing said silicon substrate to the air, and wherein there is provided a purging step purging a process space in which said insulation film is held between said step of forming said insulation film and said nitridation step of said insulation film, such that said purging step is conducted 0–4 times.

31. A method of processing a substrate, comprising the step of forming an oxide film on a silicon substrate surface by an oxidation processing using oxygen radicals with a partial pressure in the range of $133–133 \times 10^{-4}$ mPa.

32. The method as claimed in claim 31, wherein said oxidation processing is continued over the duration of about 5 minutes or less.

33. The method as claimed in claim 31, wherein said oxidation processing is conducted under existence of oxygen radicals excited by ultraviolet radiation having a wavelength of 172 nm, by setting a power of said ultraviolet radiation to the range of 5–50 mW/cm² right underneath a ultraviolet source and further by setting an oxygen partial pressure to the range of 133 mPa–133 Pa.

34. A method of fabricating a semiconductor device, comprising the steps of:

forming a base oxide film on a silicon substrate surface;

forming a high-K dielectric film on said base oxide film; and forming a gate electrode layer on said high-K dielectric film, wherein said step of forming said base oxide film includes a step of forming an oxide film on said silicon substrate surface by an oxidation processing while using oxygen radicals with a partial pressure of 133–133×10⁻⁴ mPa.

35. The method as claimed in claim 34, wherein said oxidizing processing is continued over the duration of about 5 minutes or less.

36. The method as claimed in claim 34, wherein said oxidation processing is conducted under existence of oxygen radicals excited by ultraviolet radiation having the wavelength of 172 nm by setting the power of the ultraviolet radiation to the range of 5–50 MW/cm² right underneath the ultraviolet source and setting the oxygen partial pressure to the range of 133 mPa–133 Pa.

37. A method of processing a substrate, comprising the steps of:

supplying an NO gas to a bare silicon substrate surface; and forming an oxynitride film on said silicon substrate surface by exciting said NO gas with ultraviolet radiation.

38. The method as claimed in claim 37, wherein said ultraviolet radiation has a wavelength of about 172 nm.

39. The method as claimed in claim 37, wherein said ultraviolet radiation is formed by a dielectric barrier discharge tube confined with xenon.

40. The method as claimed in claim 37, wherein said oxynitride film is formed with a thickness of about 0.5 nm.

41. The method as claimed in claim 37, wherein said step of forming said oxynitride film is conducted at a substrate temperature of about 45° C.

42. The method as claimed in claim 37, wherein said step of forming said oxynitride film is continued over the duration of 200 seconds or less.

43. The method as claimed in claim 37, wherein said step of forming said oxynitride film is conducted under a process pressure in the range of 1.33–13.3×10³ Pa.

44. The method as claimed in claim 37, wherein said step of forming said NO gas is started before increasing a temperature of said silicon substrate.

45. The method as claimed in claim 37, further comprising, before the step of forming said oxynitride film, the step of removing a native oxide film from said silicon substrate surface.

46. A method of fabricating a semiconductor device, comprising the steps of:

forming an oxynitride film on a bare silicon substrate surface by supplying an NO gas to said silicon substrate surface and exciting said NO gas with ultraviolet radiation;

forming a high-K dielectric film on said oxynitride film; and forming a gate electrode on said high-K dielectric film.

47. The method as claimed in claim 46, wherein said ultraviolet radiation has a wavelength of 172 nm.

* * * * *